(12) United States Patent
Rawlins et al.

(10) Patent No.: US 7,746,764 B2
(45) Date of Patent: Jun. 29, 2010

(54) ORTHOGONAL SIGNAL GENERATION USING VECTOR SPREADING AND COMBINING

(75) Inventors: Gregory S. Rawlins, Heathrow, FL (US); David Sorrells, Middleburg, FL (US); Greg Milne, Lake Mary, FL (US); Mike Rawlins, Lake Mary, FL (US)

(73) Assignee: ParkerVision, Inc., Jacksonville, FL (US)

( * ) Notice: Subject to any disclaimer, the term of this patent is extended or adjusted under 35 U.S.C. 154(b) by 1028 days.

(21) Appl. No.: 11/255,082

(22) Filed: Oct. 21, 2005

(65) Prior Publication Data
US 2006/0159005 A1 Jul. 20, 2006

Related U.S. Application Data

(60) Provisional application No. 60/620,925, filed on Oct. 22, 2004.

(51) Int. Cl.
*H04J 11/00* (2006.01)
(52) U.S. Cl. ...................................... 370/208; 375/243
(58) Field of Classification Search ......... 370/203–209; 375/242, 243
See application file for complete search history.

(56) References Cited

U.S. PATENT DOCUMENTS

| | | | |
|---|---|---|---|
| 5,940,365 A * | 8/1999 | Takegahara et al. | 370/208 |
| 7,058,380 B2 * | 6/2006 | Sato | 455/260 |
| 2002/0181632 A1 | 12/2002 | Kang et al. | |
| 2004/0100925 A1 * | 5/2004 | Niwano | 370/328 |
| 2005/0201268 A1 | 9/2005 | Aoki et al. | |

OTHER PUBLICATIONS

International Search Report for PCT Appl. No. PCT/US05/38334, 1 page, date of completion: Nov. 11, 2006.
International Preliminary Report on Patentability for PCT Appl. No. PCT/US05/38334, 3 pages, date of completion: May 7, 2007.

* cited by examiner

*Primary Examiner*—Ricky Ngo
*Assistant Examiner*—Gary Mui
(74) *Attorney, Agent, or Firm*—Sterne, Kessler, Goldstein & Fox PLLC

(57) ABSTRACT

The present invention provides an approach for quadrature signal generation, which does not require orthogonal reference signals or nearly orthogonal reference signals as an input or given condition. The techniques provided herein can utilize a reference phase shift less than 90° but greater than 0°, along with an inversion to create orthogonal signals. The techniques provided here reduce the number of critical manipulations required from a hardware perspective.

39 Claims, 39 Drawing Sheets

$\phi_{E1}, \phi_{E2},$ AND $\phi_{E3}$ ARE PHASE ERRORS ASSOCIATED WITH THE 0/180, DIFFERENCE/90, AND SUMMER BLOCKS, RESPECTIVELY. $G_x$ ARE THE GAINS OF EACH BLOCK.

EQUIVALENT CIRCUIT
WITHOUT SUBTRACTION

CURRENT MODE SUMMER, 2.5 GHz

MONTE CARLO, NOM 27C - QUADRATURE PHASE AND AMPLITUDE MISMATCH

DIFFERENTIAL/QUADRATURE SYMMETRY - 4 PHASE GENERATION

UN-OPTIMIZED CURRENT DRAW, NOM 27C: ~2.1 mA

ORTHOGONAL SIGNAL GENERATION USING VECTOR SPREADING AND COMBINING

CROSS REFERENCE TO RELATED APPLICATION

This application claims the benefit of U.S. Provisional Patent Application No. 60/620,925, titled "Methods and Systems for Orthogonal Signal Generation Using Vector Spreading and Combining," which was filed on Oct. 22, 2004, and is incorporated herein by reference in its entirety.

FIELD OF THE INVENTION

The present invention is related to generation of orthogonal signals.

BACKGROUND OF THE INVENTION

Often in signal processing applications, particularly modulation and demodulation, orthogonal signals are required to transport and recover latent information relating to some complex passband waveform. Typically, analog techniques are used in RF modulators and demodulators to synthesize a 90° phase shift in a carrier or signal waveform to enable this processing. Passive and active components are used to generate delays at passband corresponding to phase shift at a frequency of interest. These techniques possess certain inaccuracies and implementation tradeoffs. For instance, polyphase filter network approaches require multiple refinement stages to obtain reasonable accuracy while R-C splitters depend on minimizing parasitic elements of the interface amplifiers. Quasi-digital approaches are also used for some applications but trade-off frequency plan, frequency response and power vs. performance.

What are needed are improved methods and systems for generating orthogonal signals for quadrature signal generation.

BRIEF SUMMARY OF THE INVENTION

The following summary of the invention provides an understanding of at least some aspects of the invention. The summary is not an extensive overview of the invention. It is not intended to identify key or critical elements of the invention nor is it intended to delineate the scope of the invention. Its sole purpose is to present some concepts of the invention in a simplified form as a prelude to the more detailed description that is presented later.

The present invention provides an approach for quadrature signal generation, which does not require orthogonal reference signals or nearly orthogonal reference signals as an input or given condition. The techniques provided herein can utilize a reference phase shift less than 90° but greater than 0°, along with an inversion to create orthogonal signals. The techniques provided here reduce the number of critical manipulations required from a hardware perspective.

Further embodiments, features, and advantages of the present inventions, as well as the structure and operation of the various embodiments of the present invention, are described in detail below with reference to the accompanying drawings. These aspects are indicative of but a few of the various ways in which the principles of the invention may be employed, and the present invention is intended to include all such aspects and their equivalents. Further features and advantages will be apparent to a person skilled in the art based on the description set forth herein and/or may be learned by practice of the invention.

It is to be understood that both the foregoing summary and the following detailed description are exemplary and explanatory and are intended to provide further explanation of embodiments of the invention as claimed.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the pertinent art to make and use the invention. In the drawings, like reference numbers indicate identical or functionally similar elements. Additionally, the leftmost digit(s) of a reference number identifies the drawing in which the reference number first appears.

Figure 21:
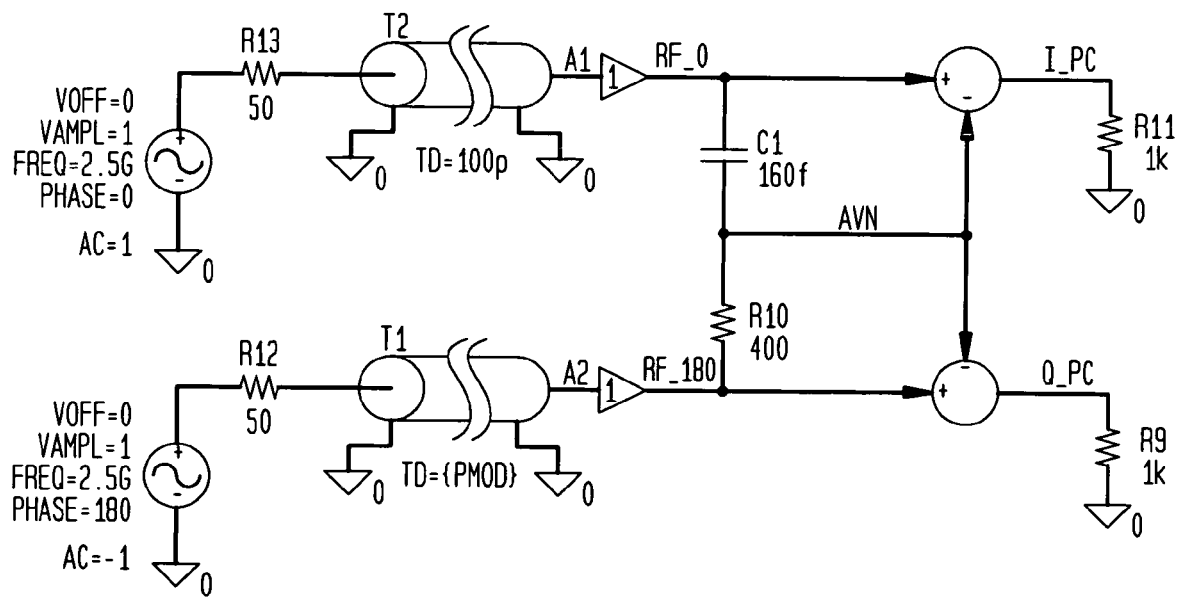

FIG. 21 further illustrates vector quad generator circuit operation.

Figure 22:
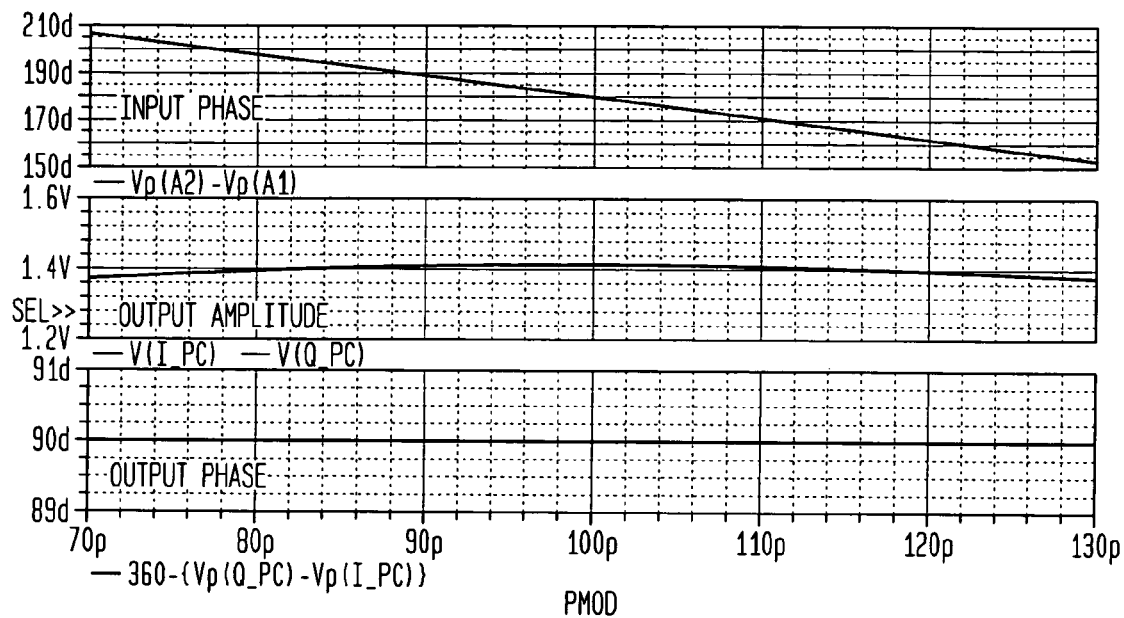

FIG. 22 is a graph of simulated input phase, output amplitude, and output phase of a vector quad generator.

Figure 23:
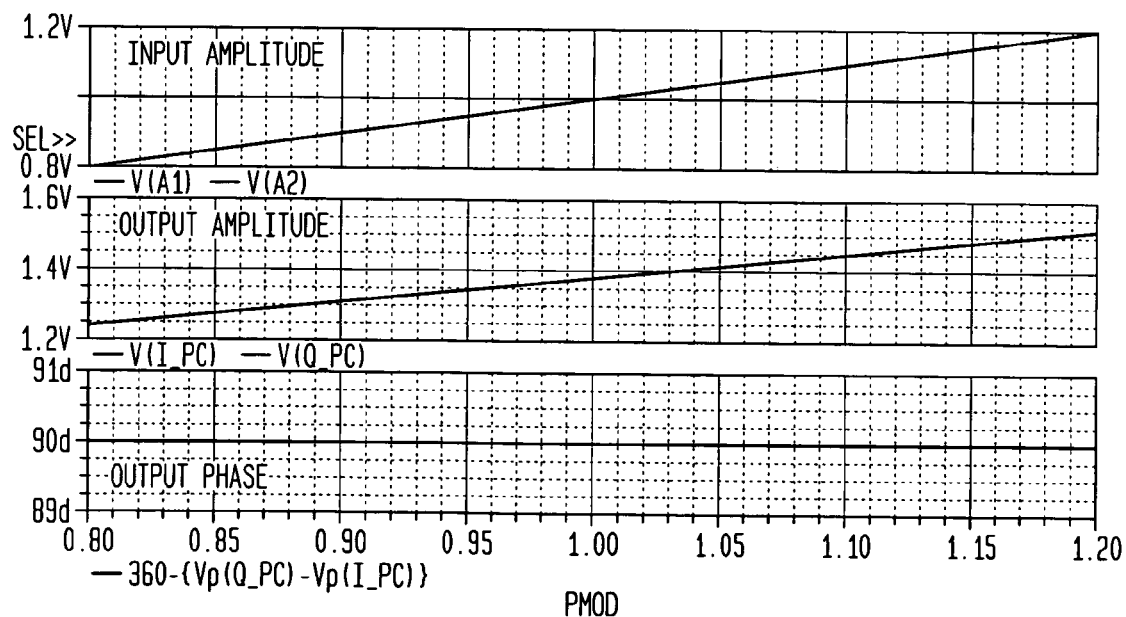

FIG. 23 is another graph of simulated input phase, output amplitude, and output phase of a vector quad generator.

Figure 24:
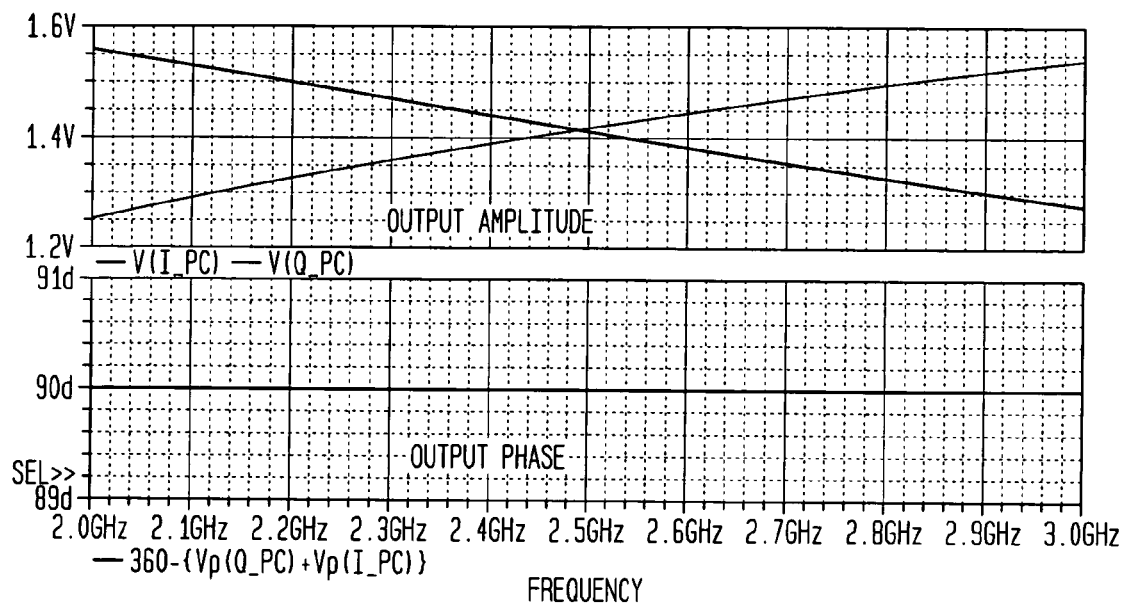

FIG. 24 is a graph of simulated output amplitude and output phase of a vector quad generator.

Figure 25:
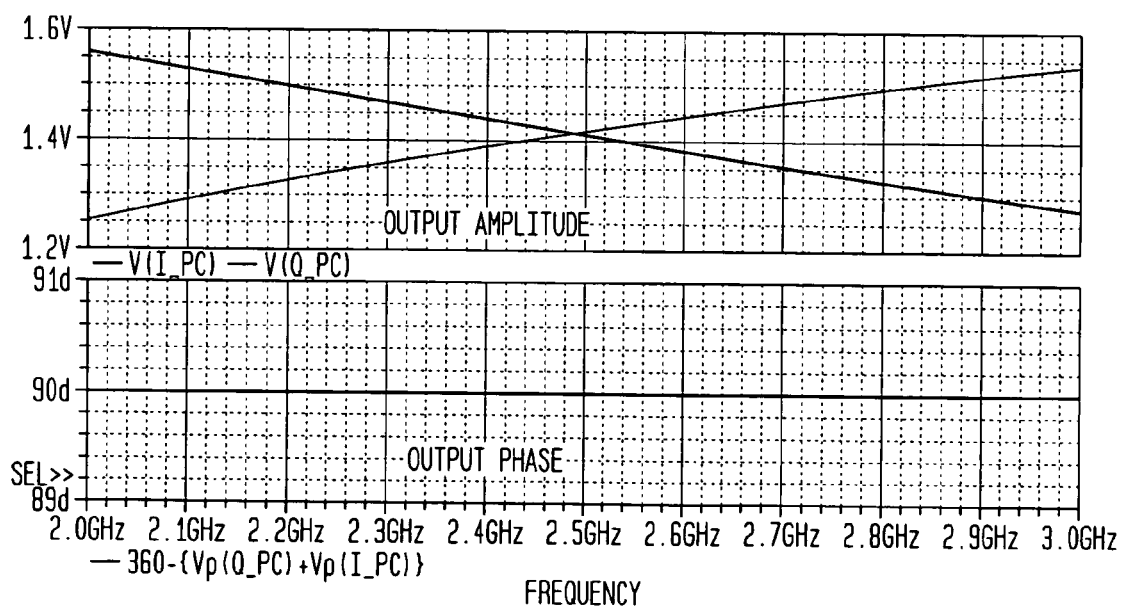

FIG. 25 is another graph of simulated output amplitude and output phase of a vector quad generator.

Figure 26:
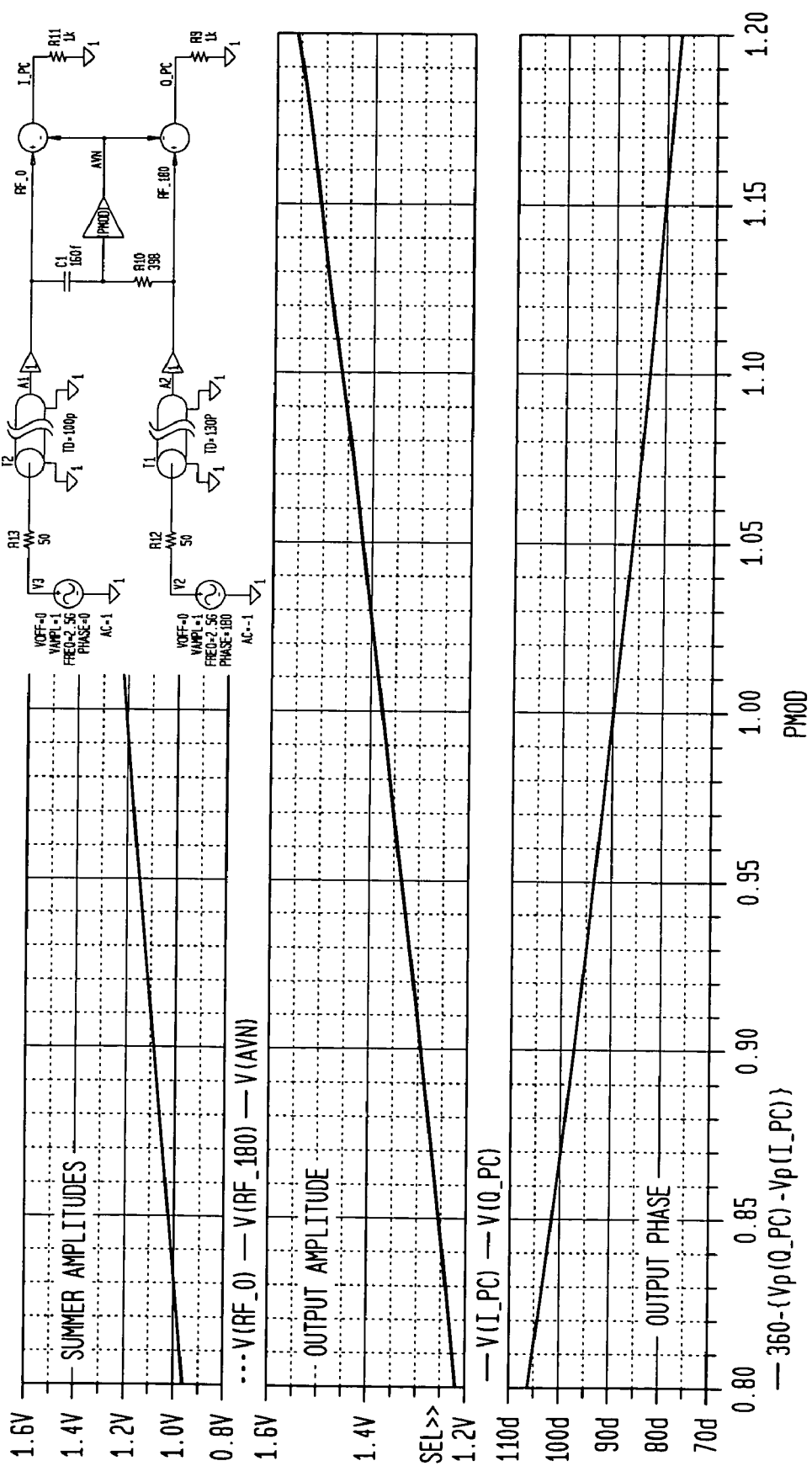

FIG. 26 is a circuit diagram of a vector quad generator and associated graph of simulated summer amplitudes, output amplitude, and output phase.

Figure 27:
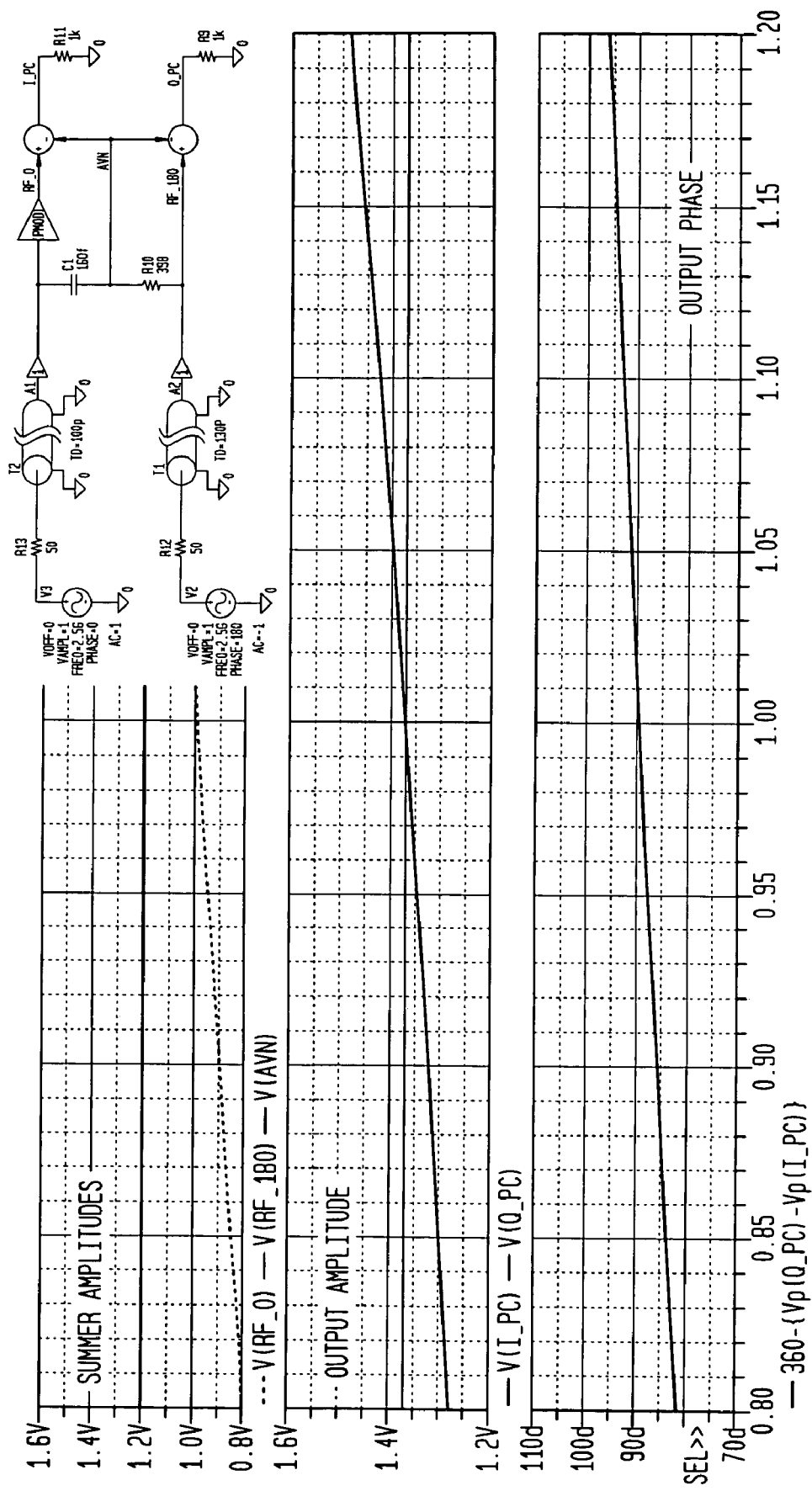

FIG. 27 is another circuit diagram of a vector quad generator and associated graph of simulated summer amplitudes, output amplitude, and output phase.

Figure 28:
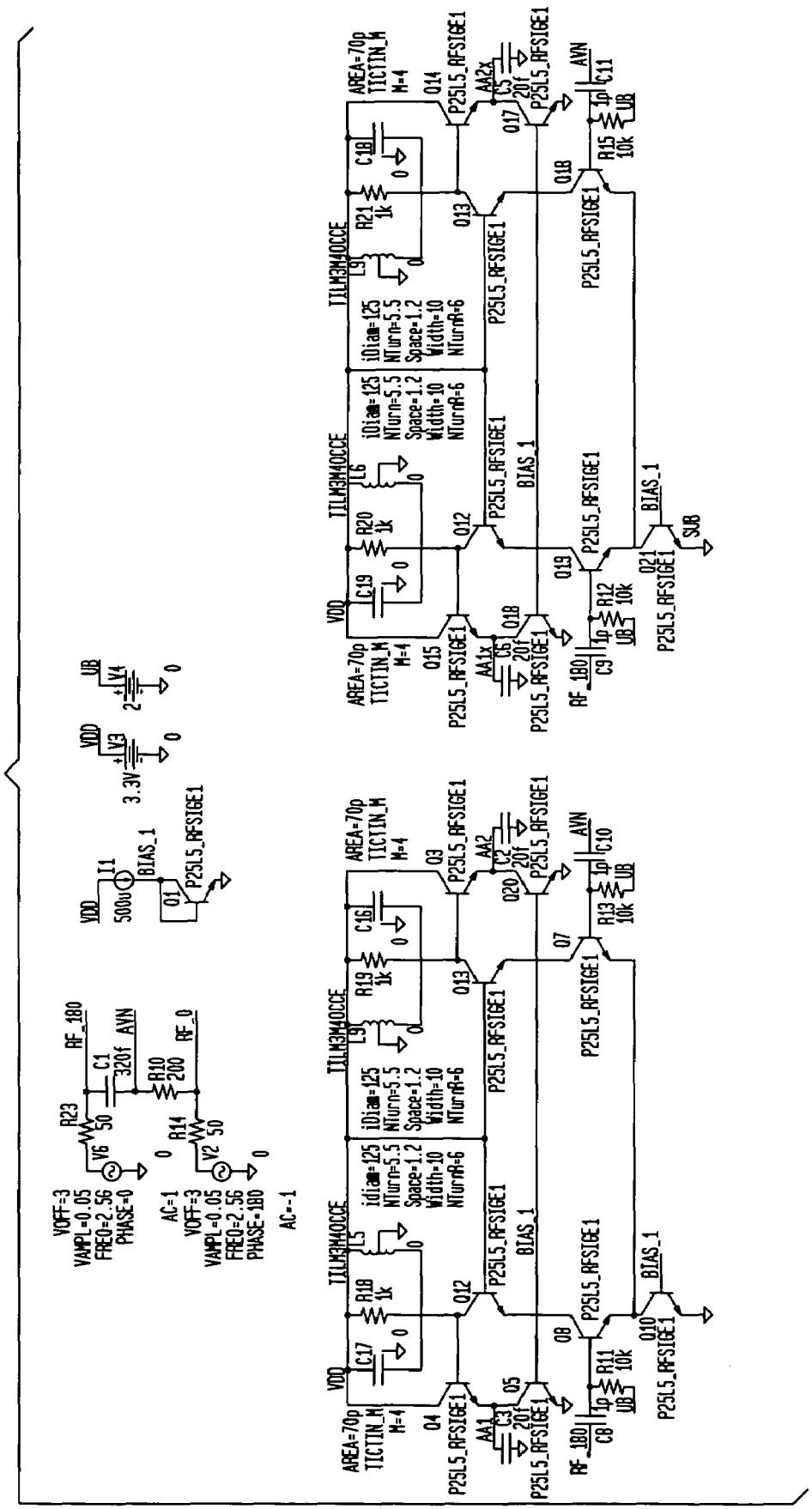

FIG. 28 is a circuit diagram of a vector quad generator difference mode circuit.

Figure 29:
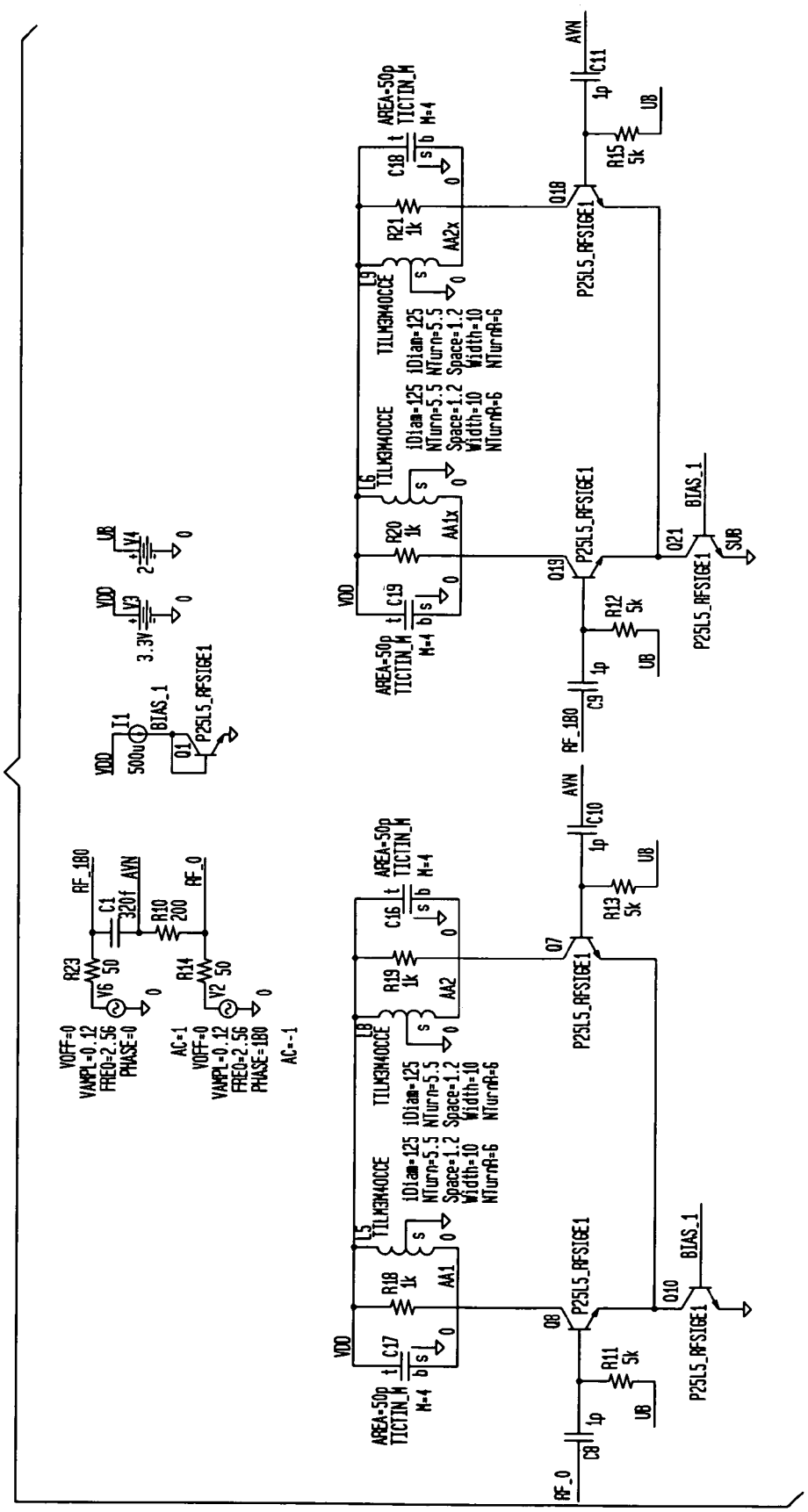

FIG. 29 is a circuit diagram of a vector quad generator difference mode circuit with a difference amplifier.

Figure 30:
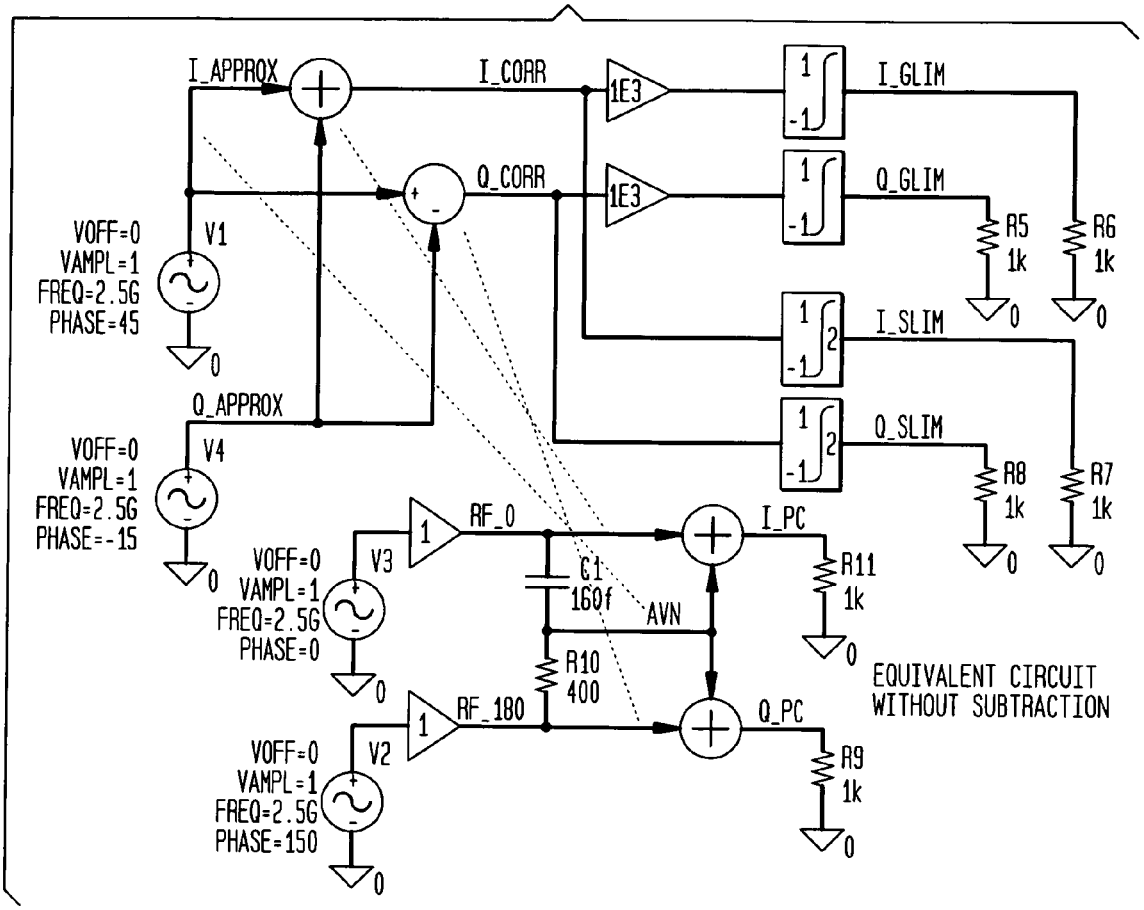

FIG. 30 is a block diagram/circuit diagram of a vector quad generator without subtraction.

Figure 31:
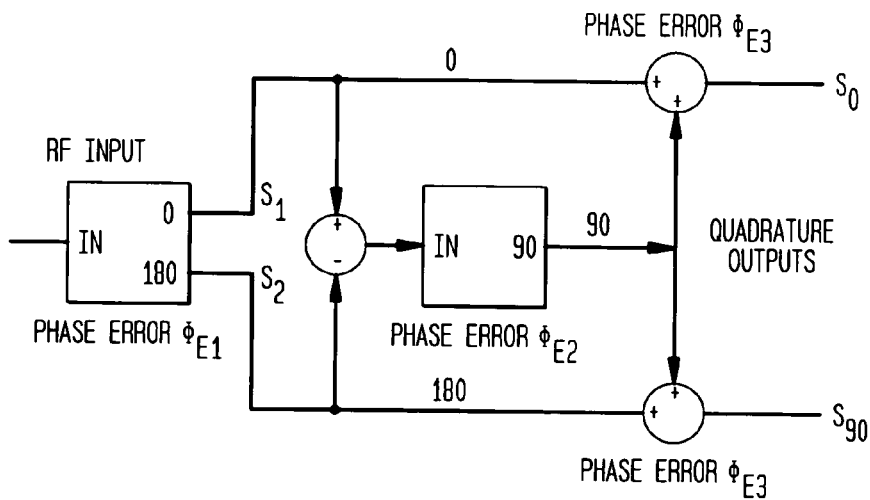

FIG. 31 is a block diagram of a vector quad generator, summer approach.

Figure 32:
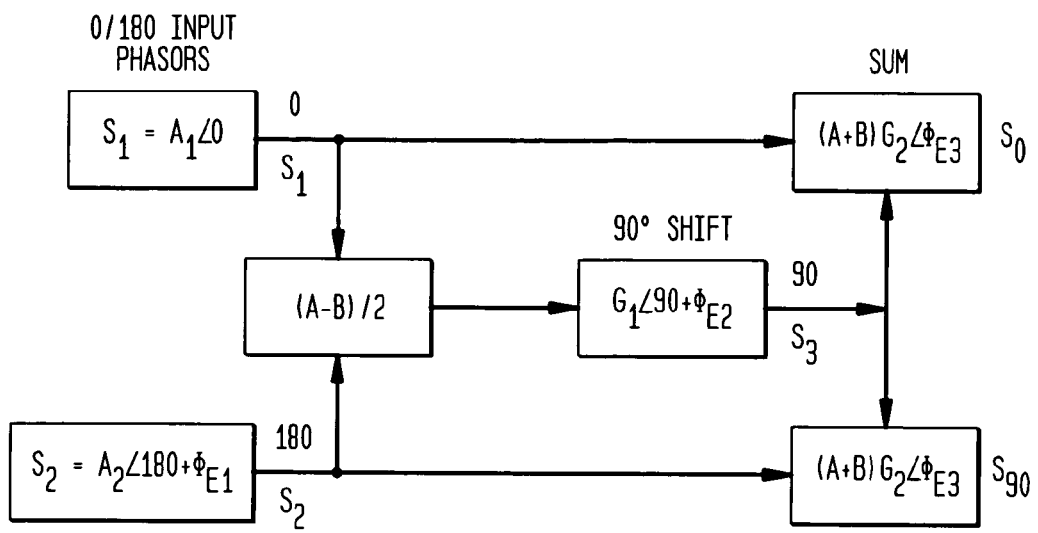

FIG. 32 is another block diagram of a vector quad generator with transfer functions.

Figure 33:
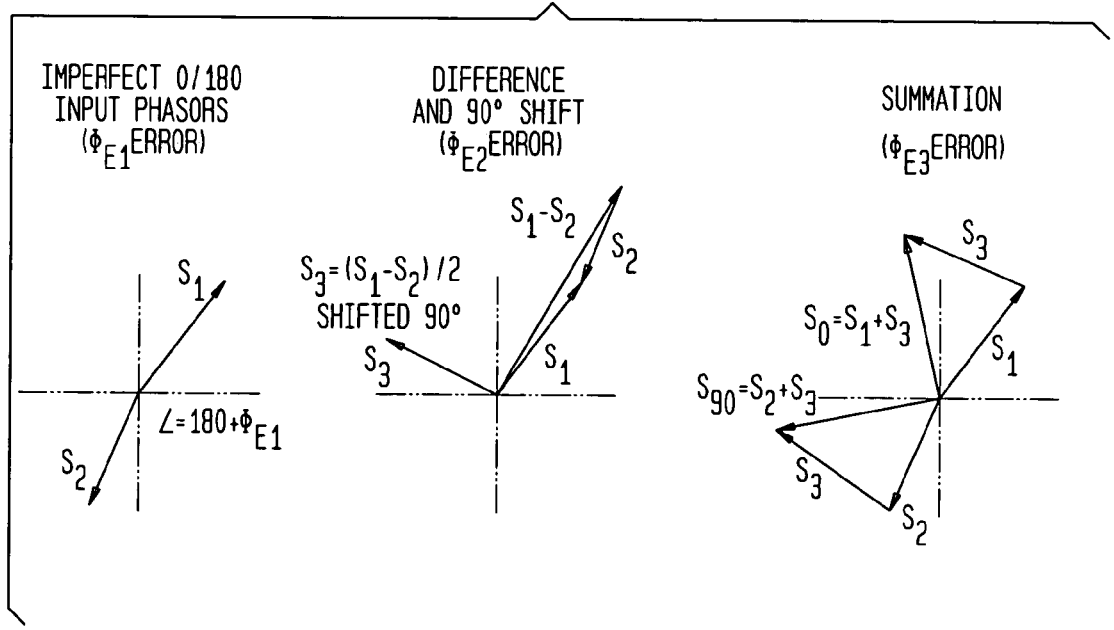

FIG. 33 illustrates additional phasor diagrams for a vector quad generator.

Figure 34:
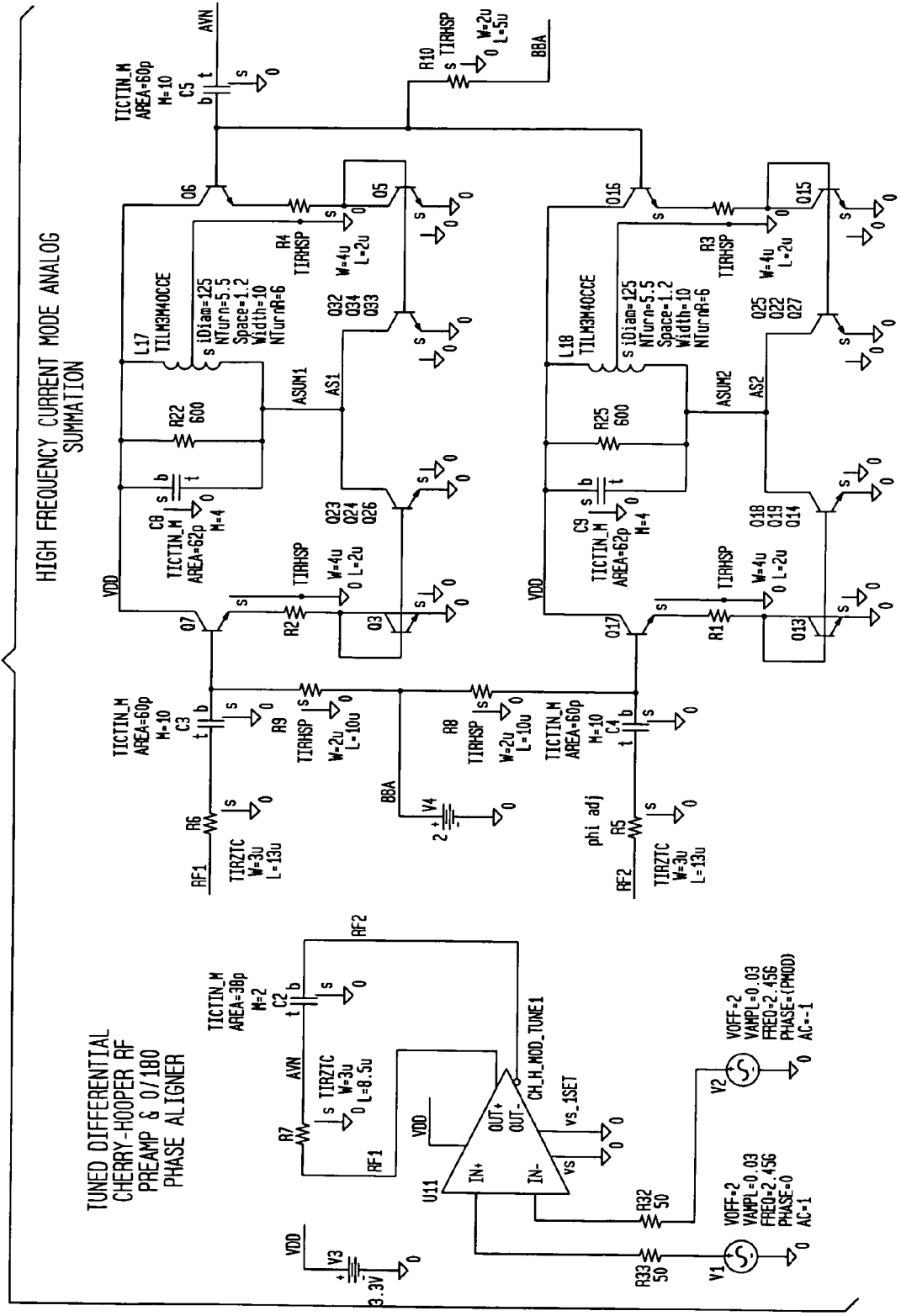

FIG. 34 is another circuit diagram of a vector quad generator.

Figure 35:
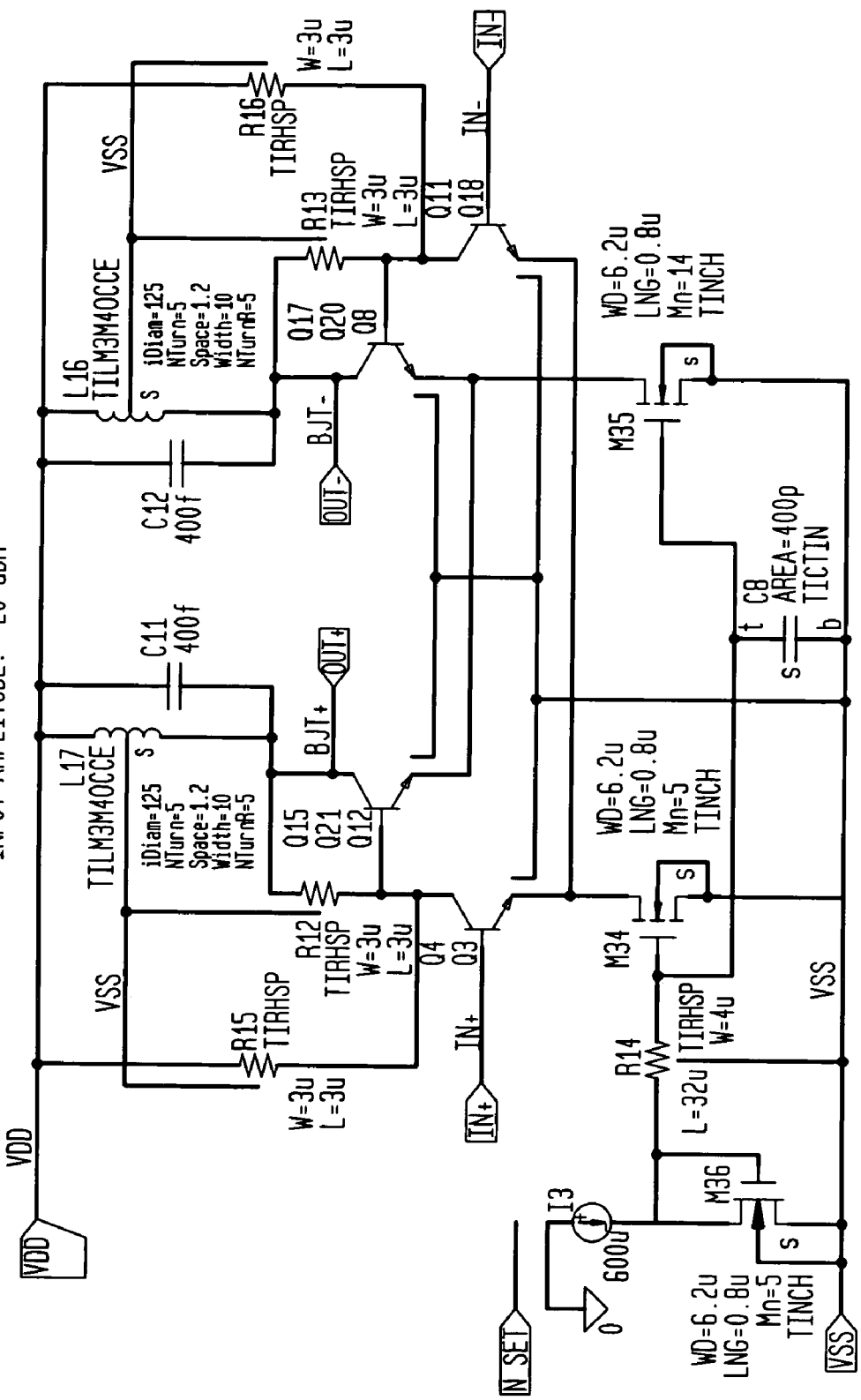

FIG. 35 is another circuit diagram of a vector quad generator.

Figure 36:
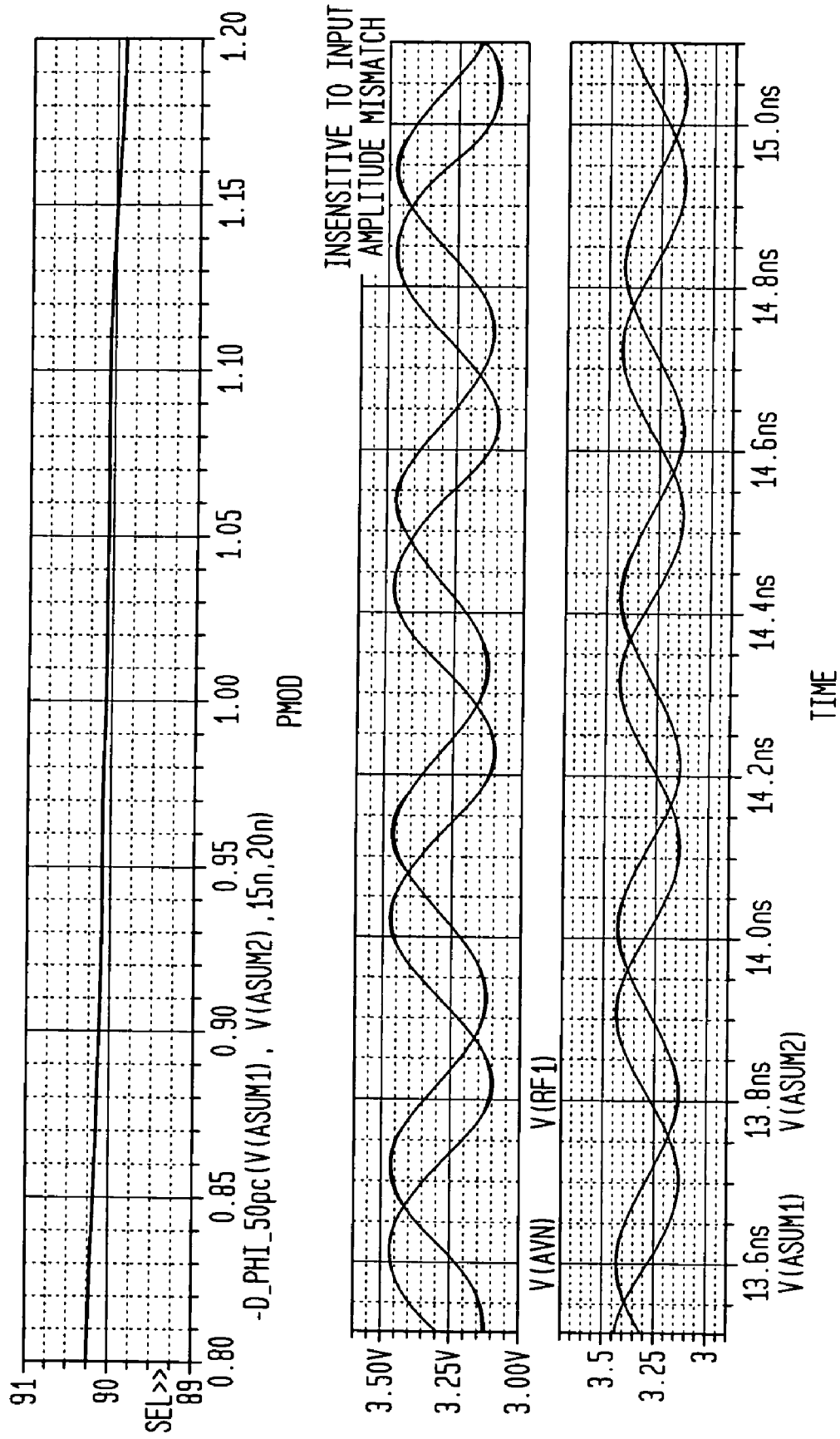

FIG. 36 is a simulated graphical illustration of quadrature phase versus amplitude mismatch.

Figure 37:
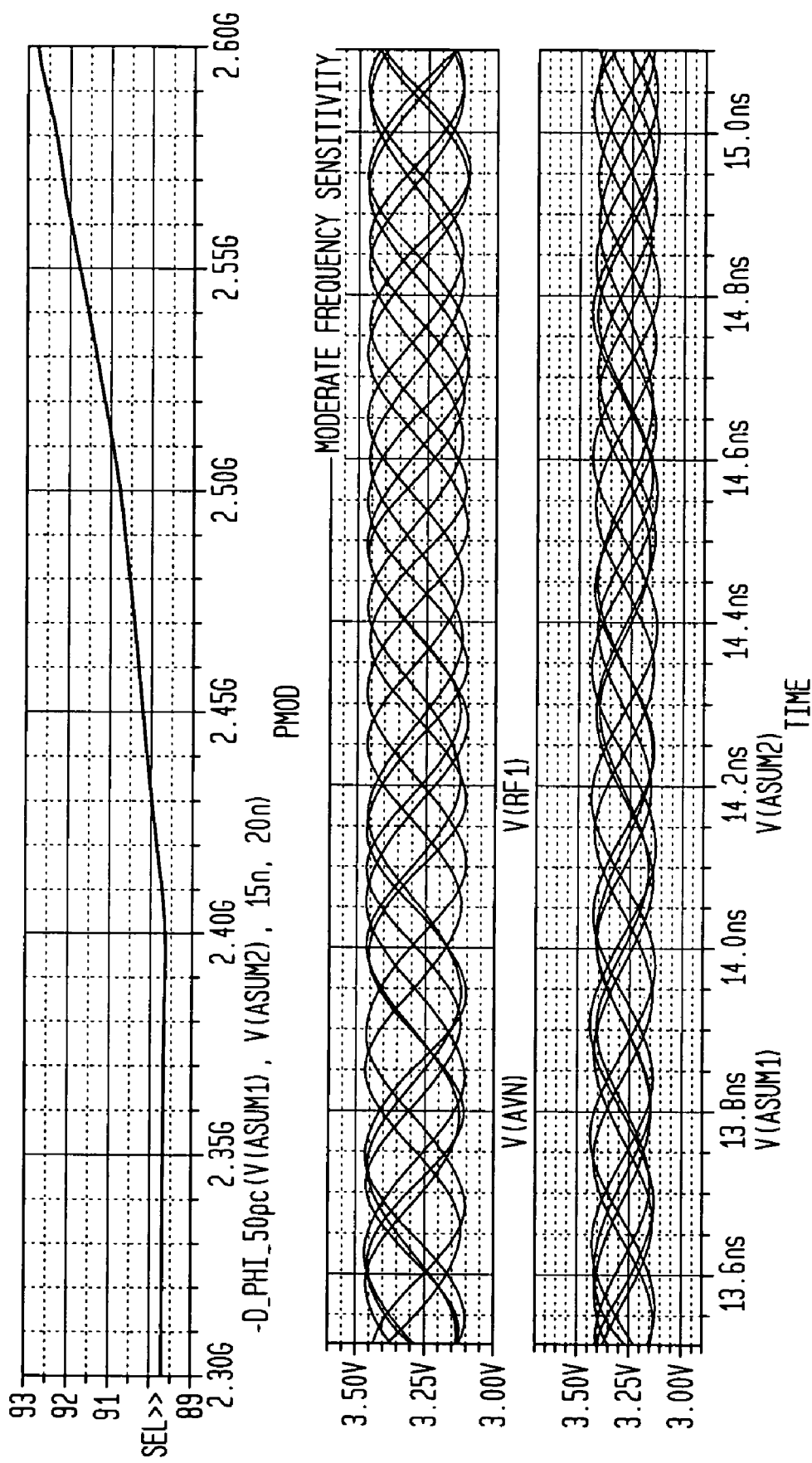

FIG. 37 is a simulated graphical illustration of quadrature phase versus input frequency.

Figure 38:
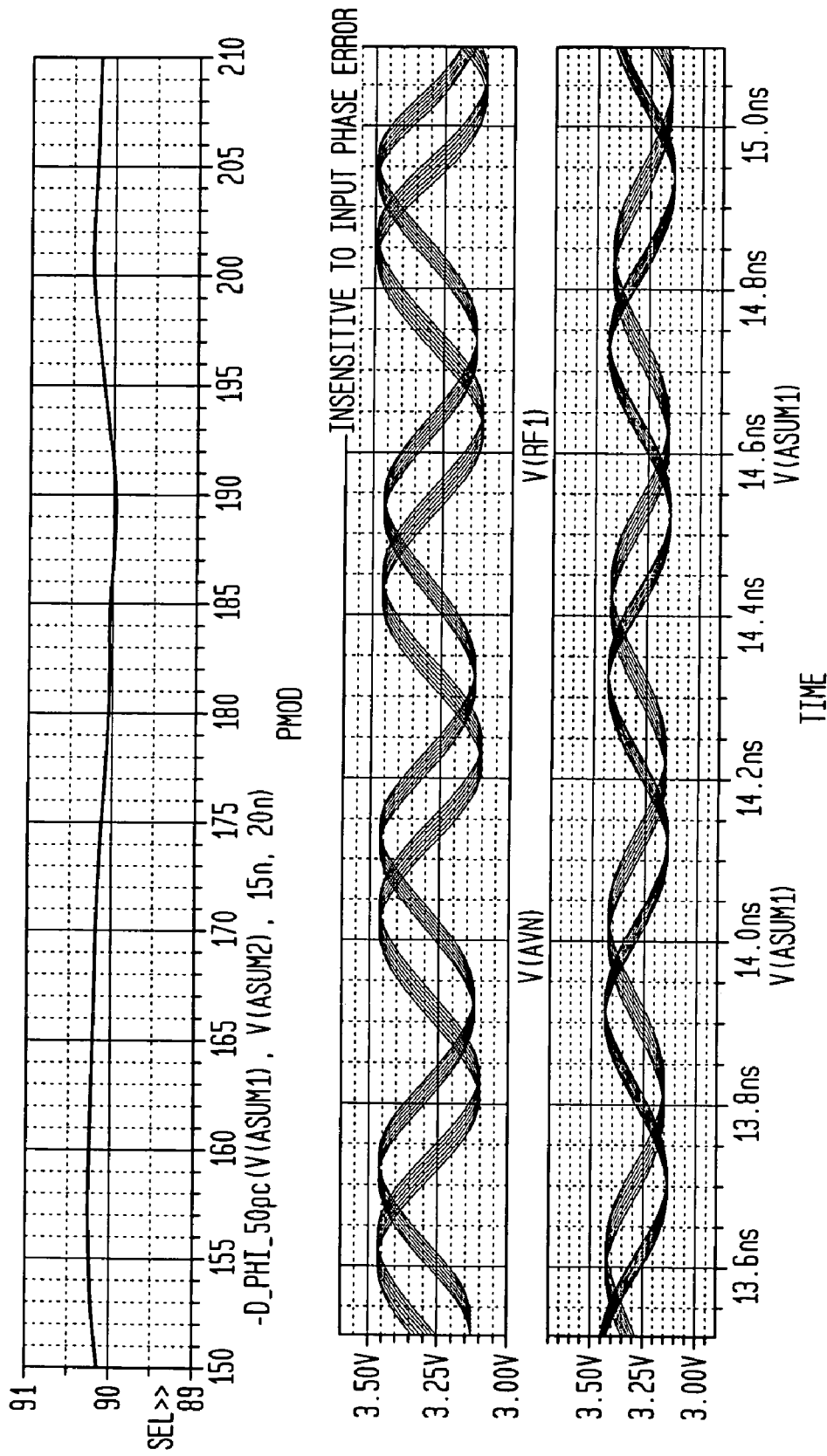

FIG. 38 is a simulated graphical illustration of quadrature phase versus input phase.

Figure 39:
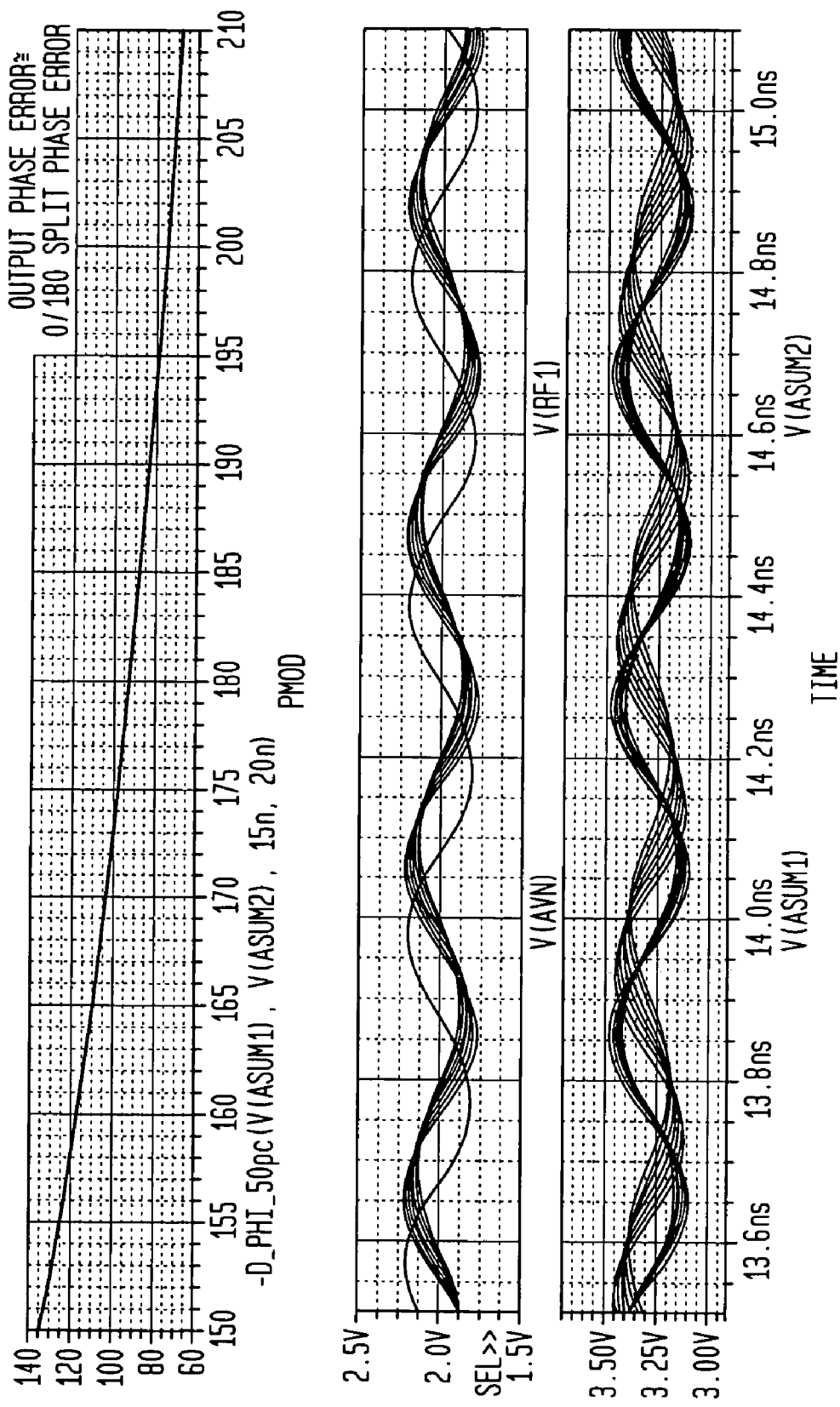

FIG. 39 is a simulated graphical illustration of quadrature phase versus 0/180 input phase error.

Figure 40:
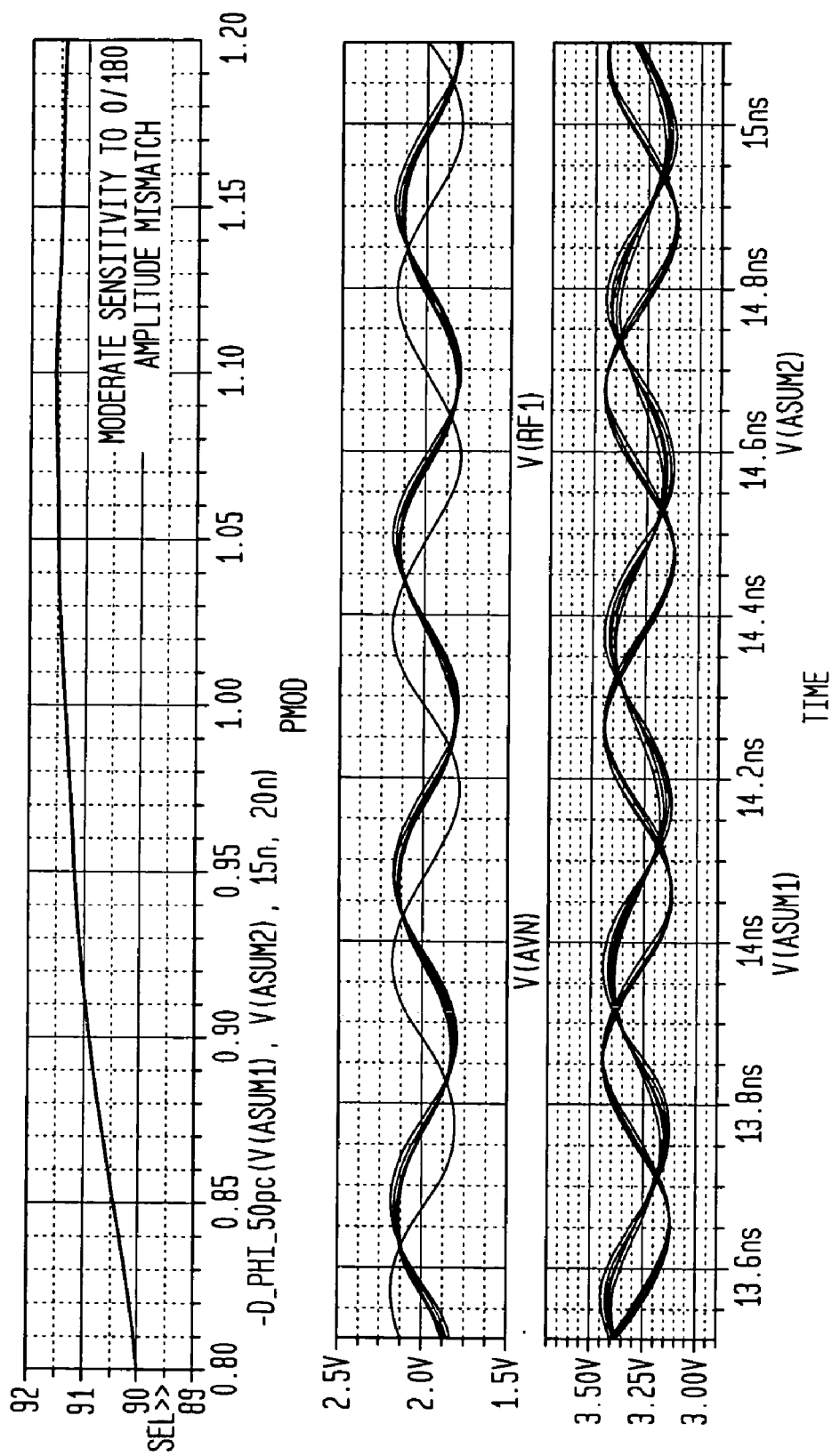

FIG. 40 is a simulated graphical illustration of quadrature phase versus 0/180 input amplitude error.

Figure 41:
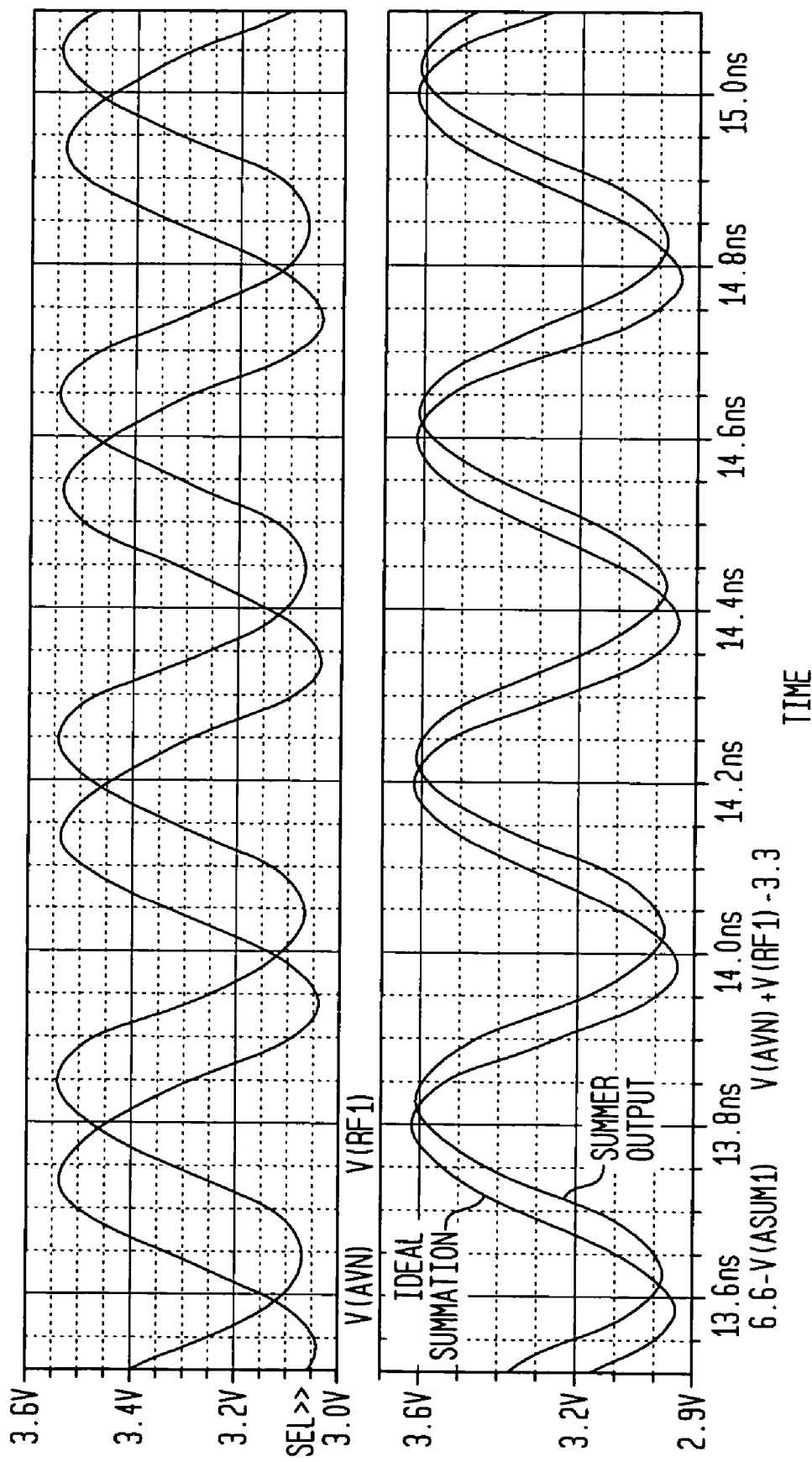

FIG. 41 is a simulated graphical illustration of a current mode summer.

Figure 42:
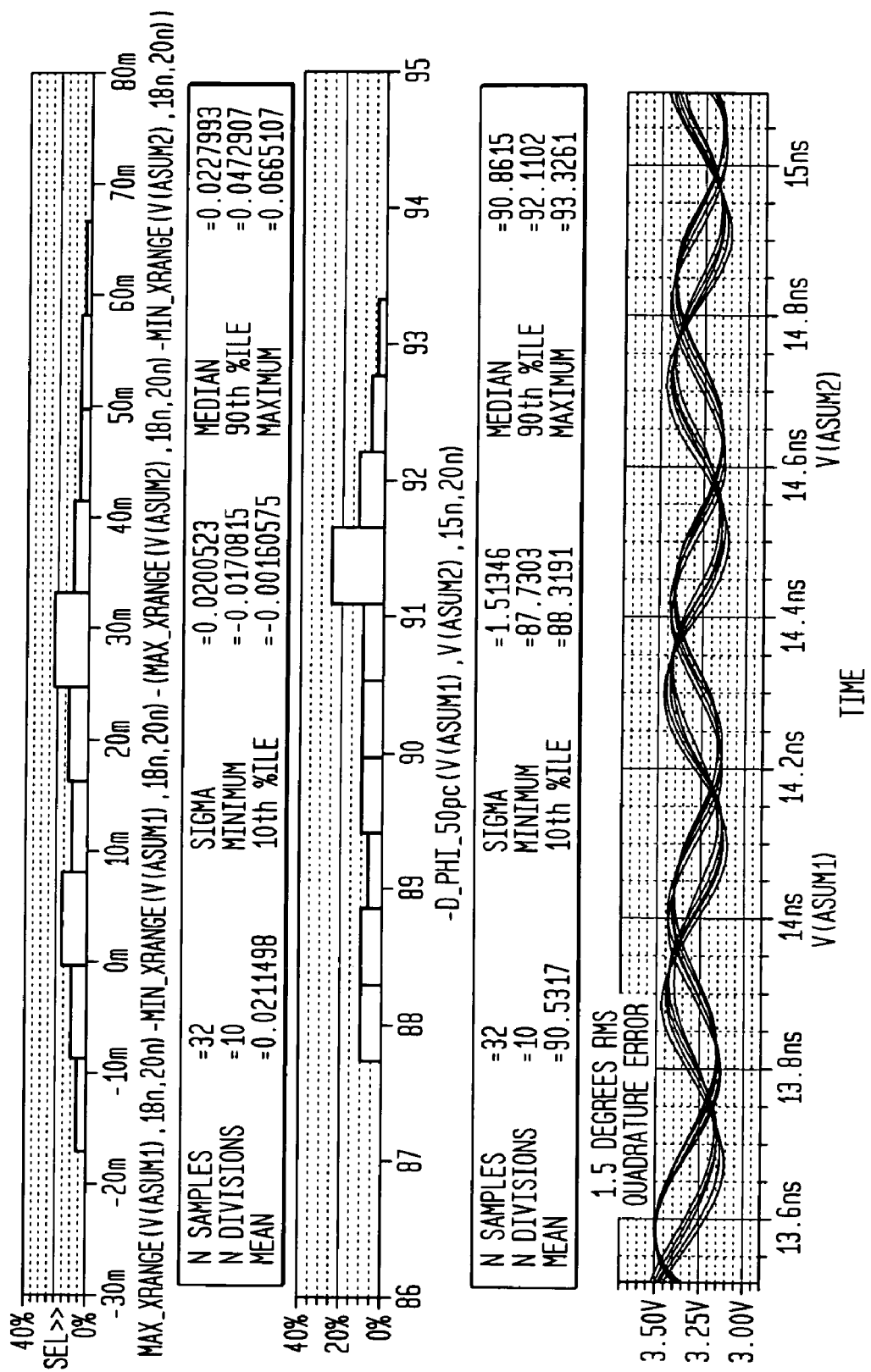

FIG. 42 is a simulated graphical illustration of quadrature phase and amplitude mismatch.

Figure 43:
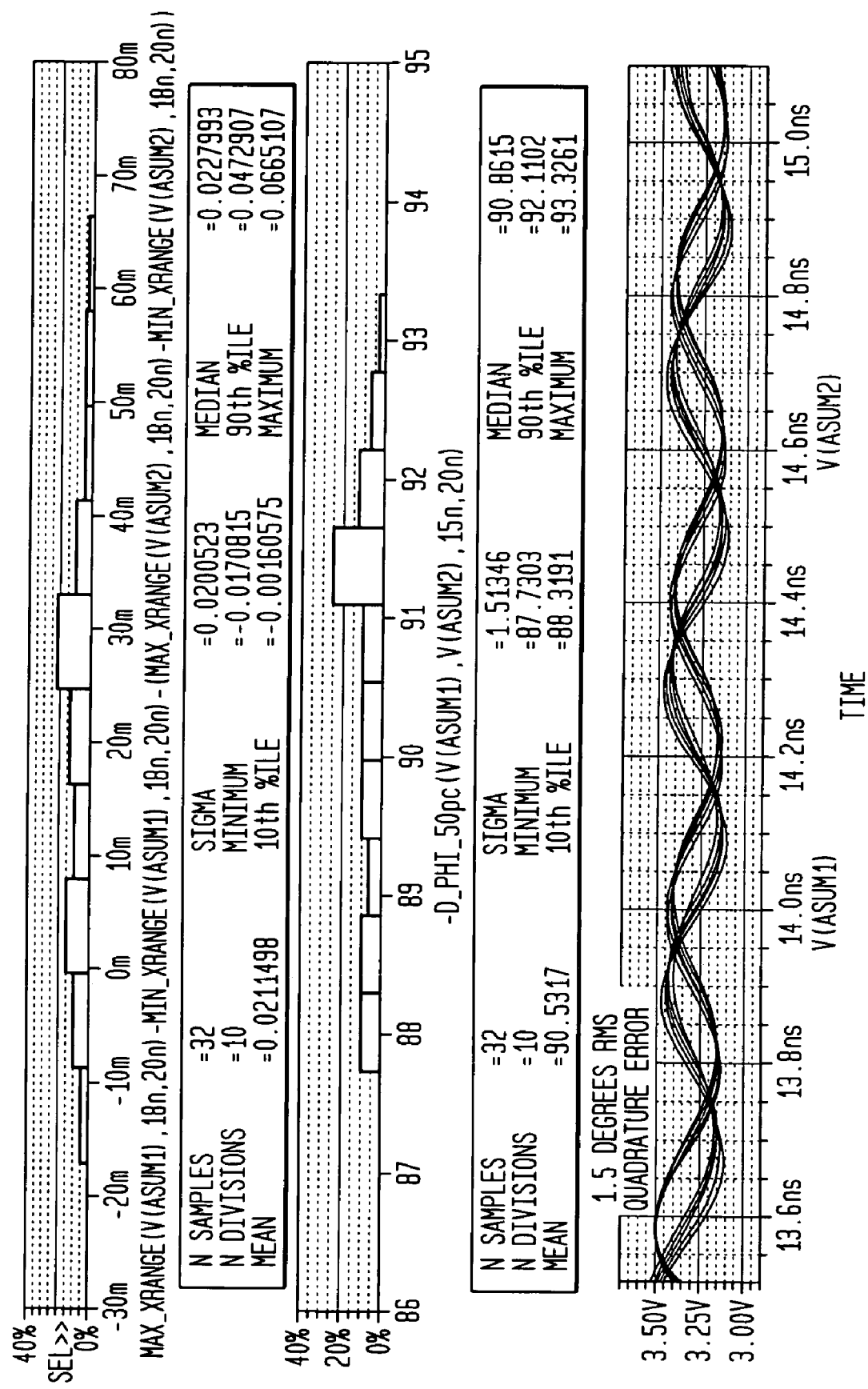

FIG. 43 is a Monte Carlo simulated graphical illustration of quadrature phase and amplitude mismatch.

Figure 44:
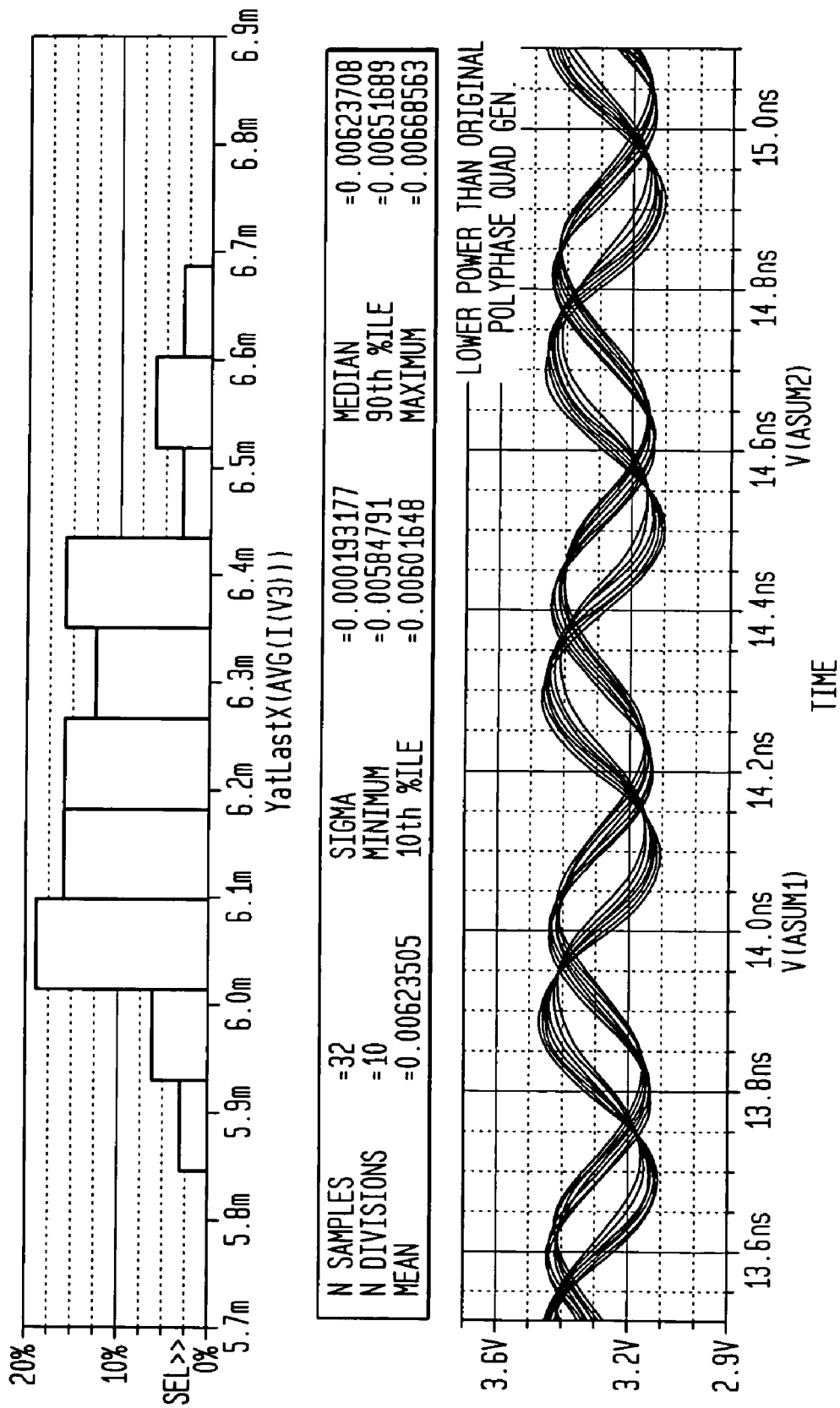

FIG. 44 is an un-optimized Monte Carlo simulated graphical illustration of quadrature phase and amplitude mismatch.

Figure 45:
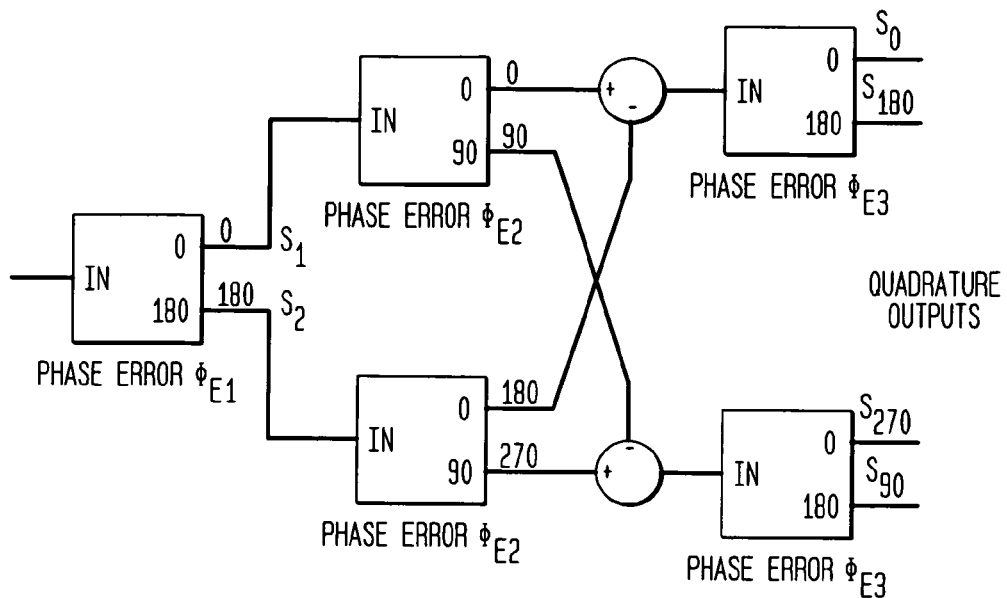

FIG. 45 is a block diagram of a tuned differential R-C quad vector generator.

Figure 46:
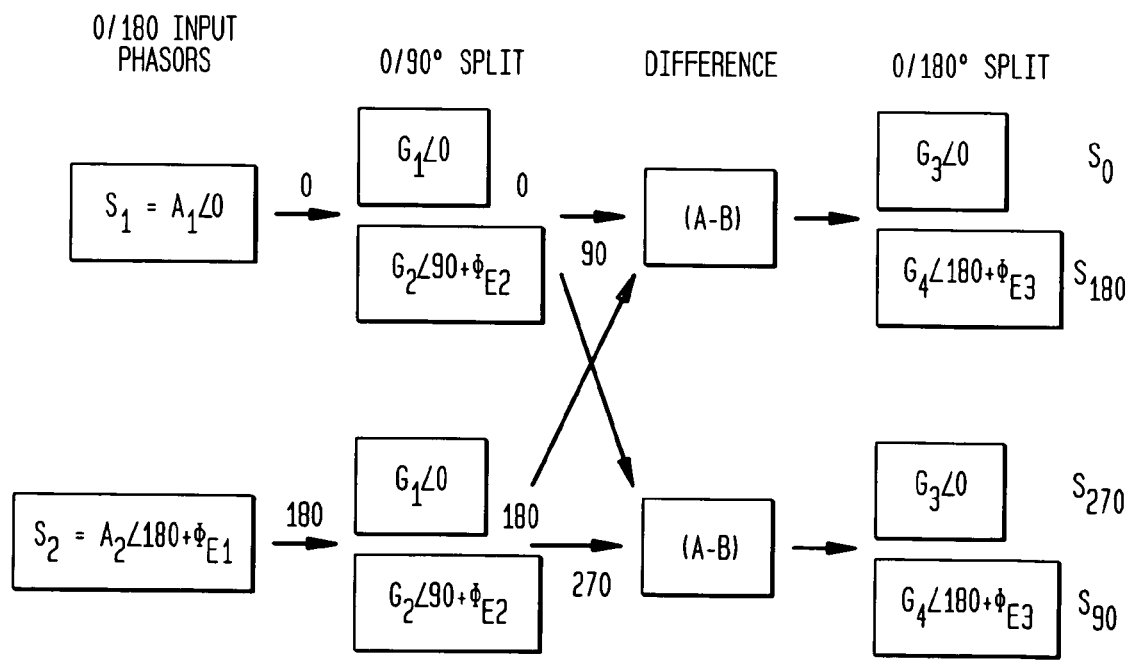

FIG. 46 is a block diagram of a tuned differential R-C quad vector generator with transfer functions.

Figure 47:
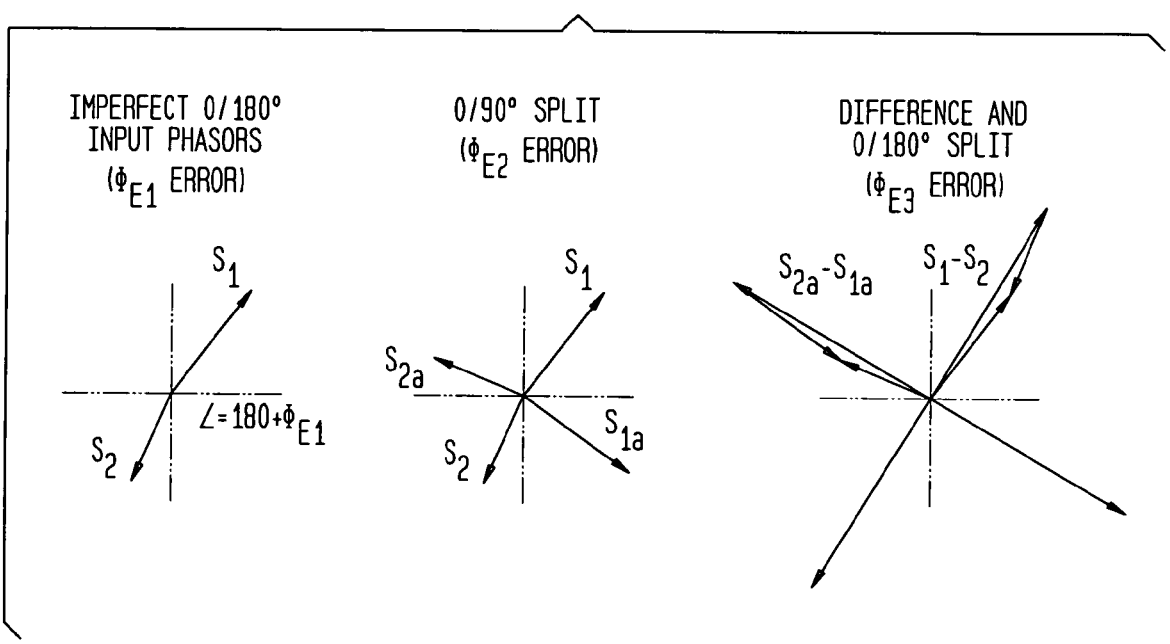

FIG. 47 illustrates phasor diagrams for a tuned differential R-C quad vector generator.

Figure 48:
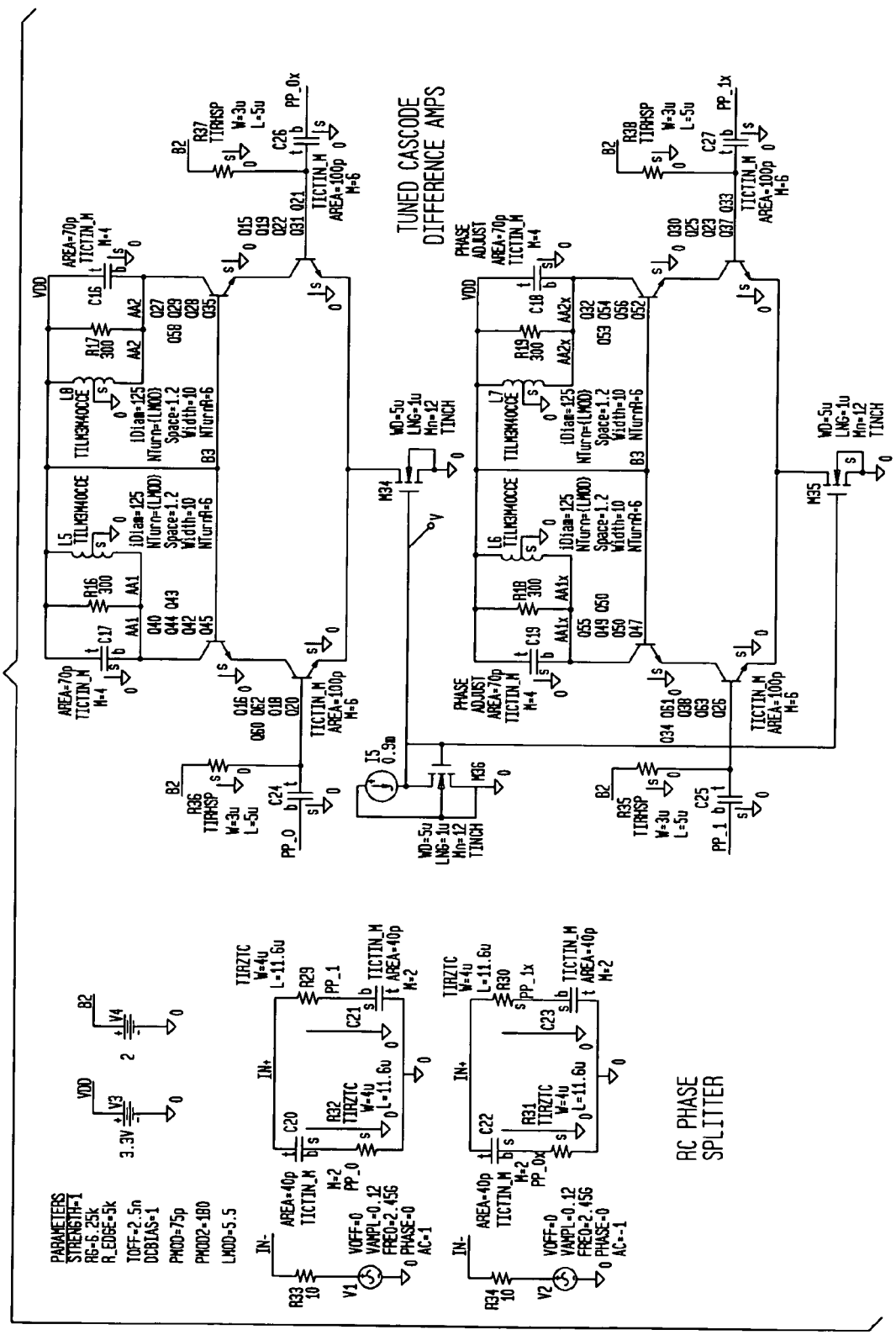

FIG. 48 is a circuit diagram of a tuned differential R-C quad vector generator, differential cascade implementation.

Figure 49:
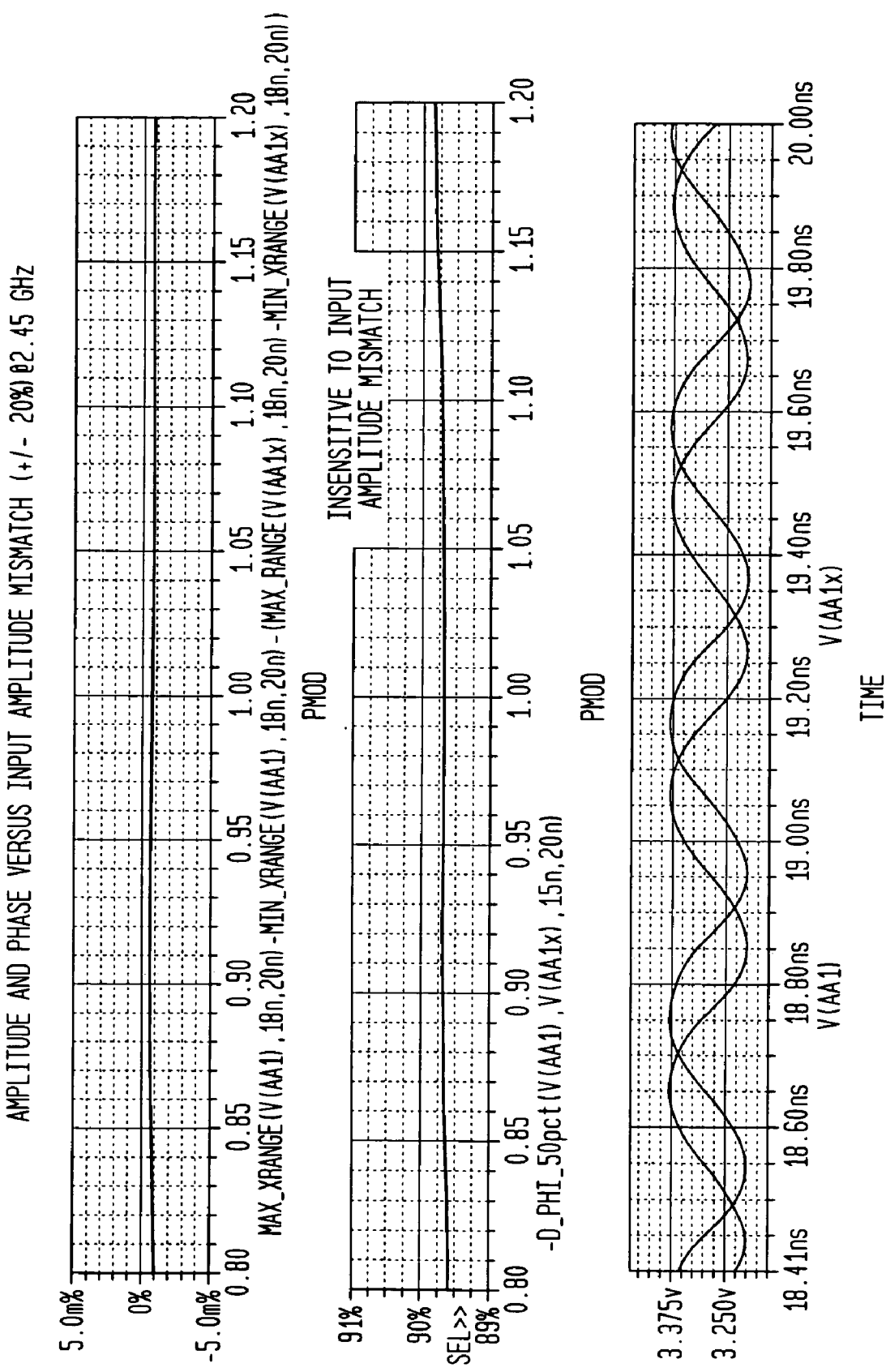

FIG. 49 is a simulated graphical illustration of amplitude and phase versus input amplitude mismatch for a tuned differential R-C quad vector generator.

Figure 50:
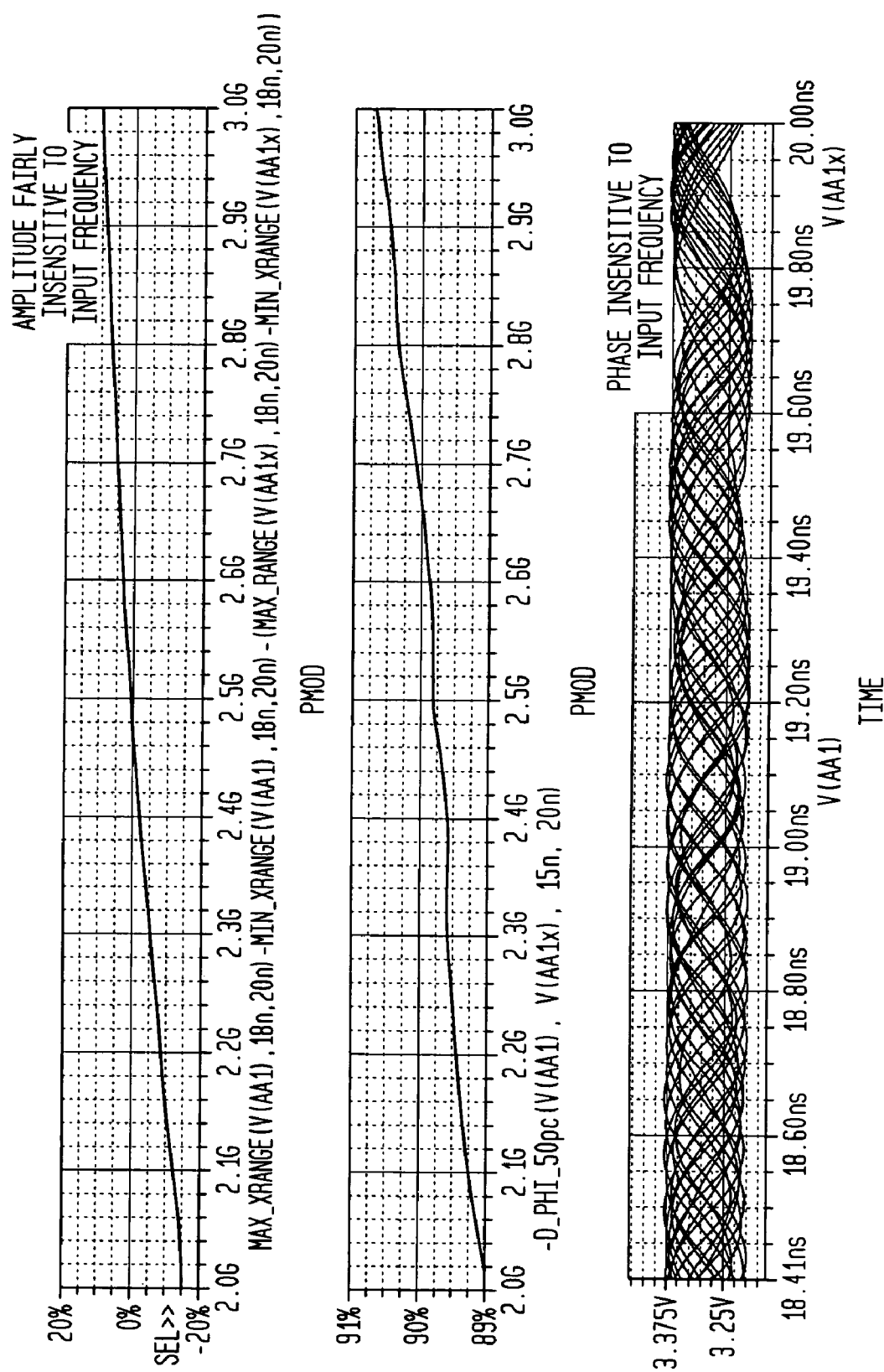

FIG. 50 is a simulated graphical illustration of quadrature phase versus frequency for a tuned differential R-C quad vector generator.

Figure 51:
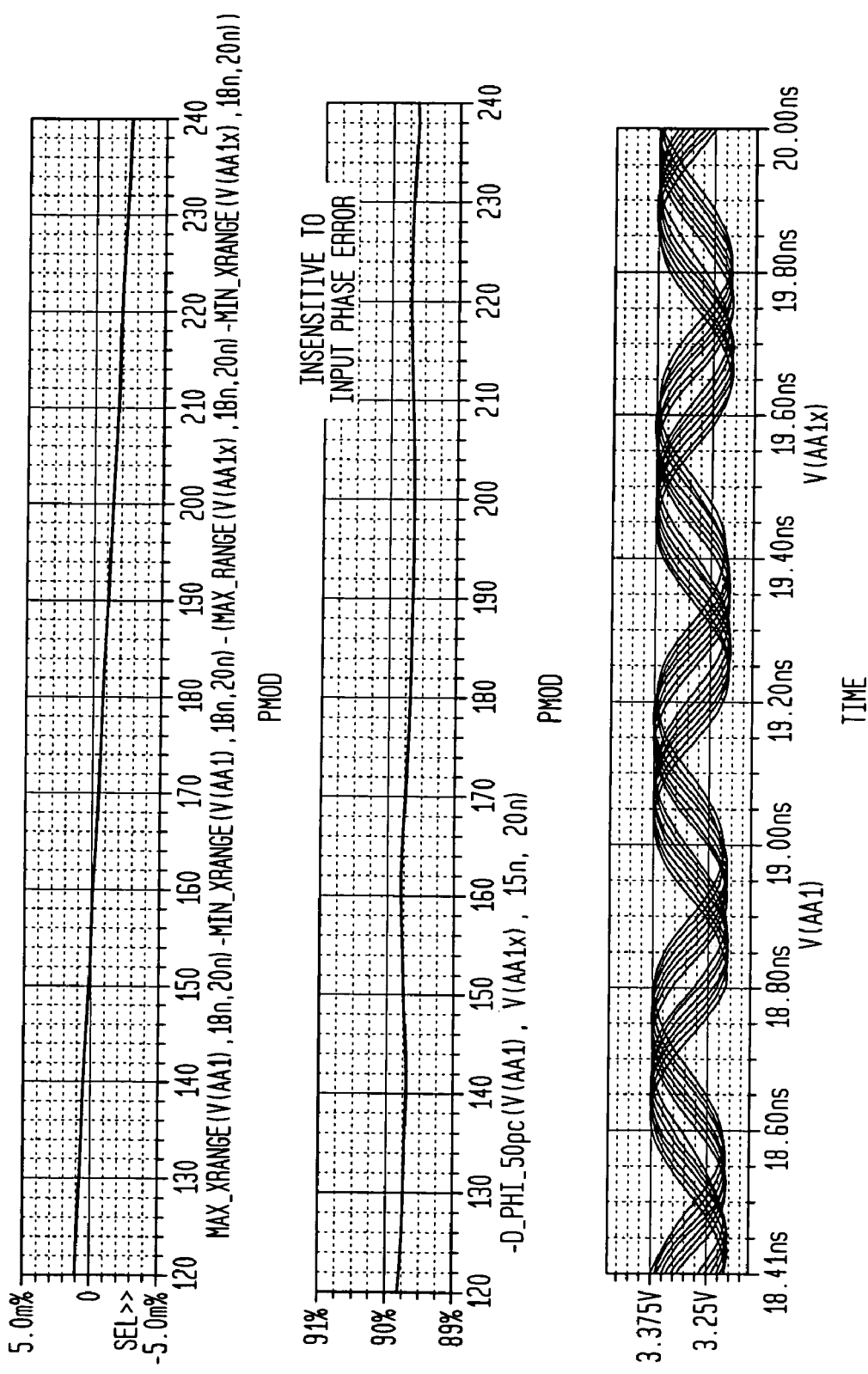

FIG. 51 is a simulated graphical illustration of quadrature phase versus phase mismatch for a tuned differential R-C quad vector generator.

Figure 52:
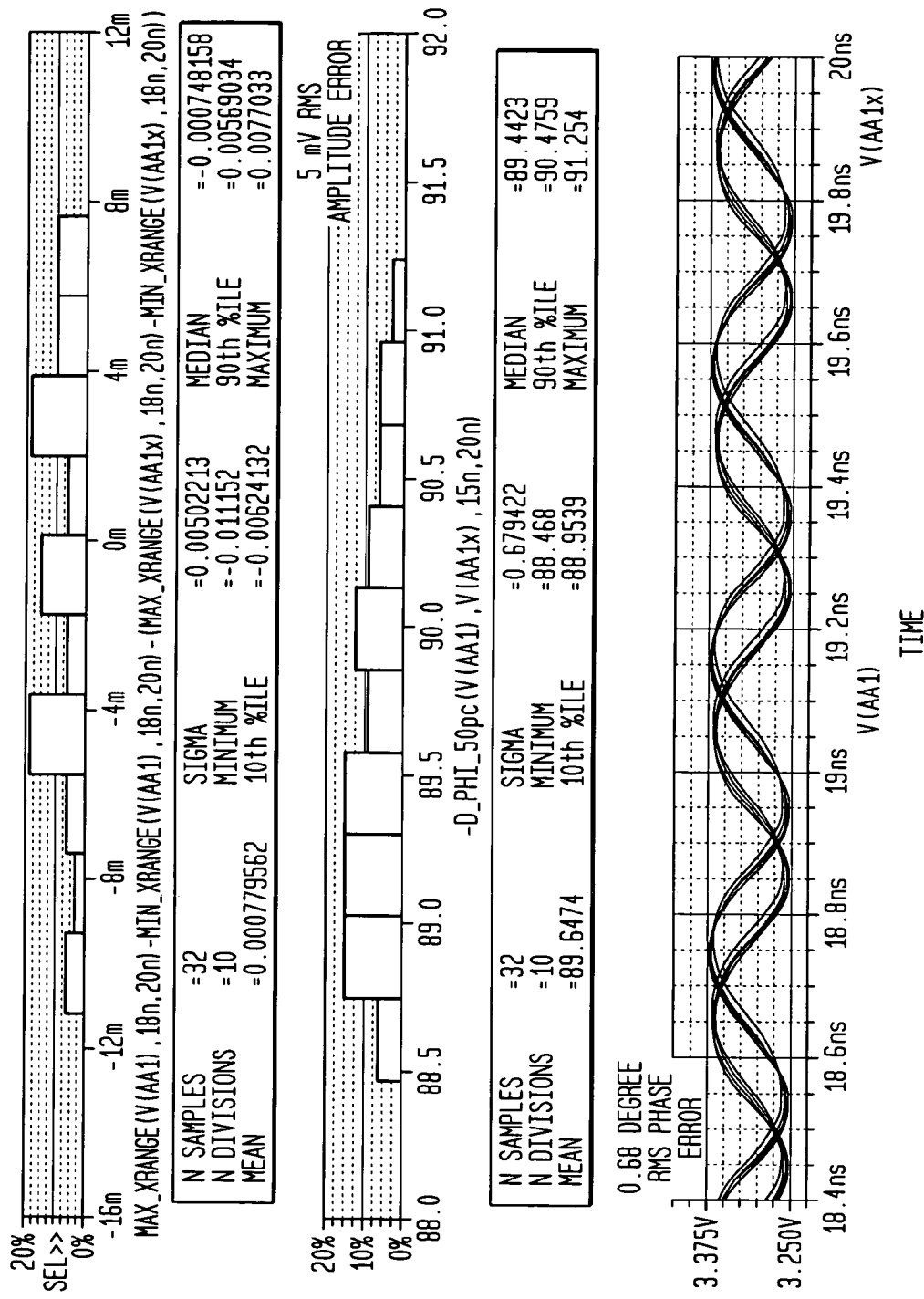

FIG. 52 is a Monte Carlo simulated graphical illustration for a tuned differential R-C quad vector generator.

Figure 53:
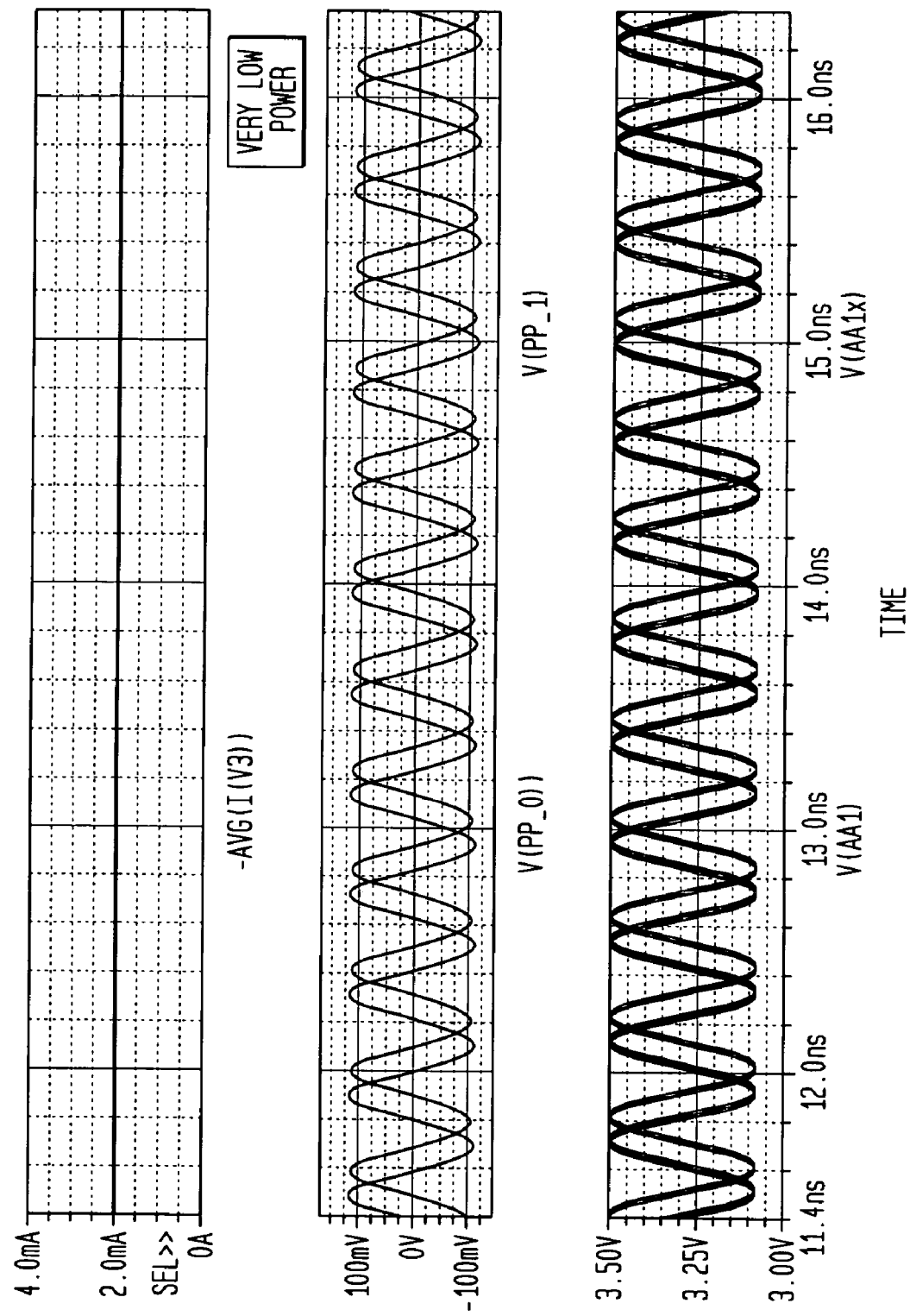

FIG. 53 is an un-optimized Monte Carlo simulated graphical illustration for a tuned differential R-C quad vector generator.

Figure 54:
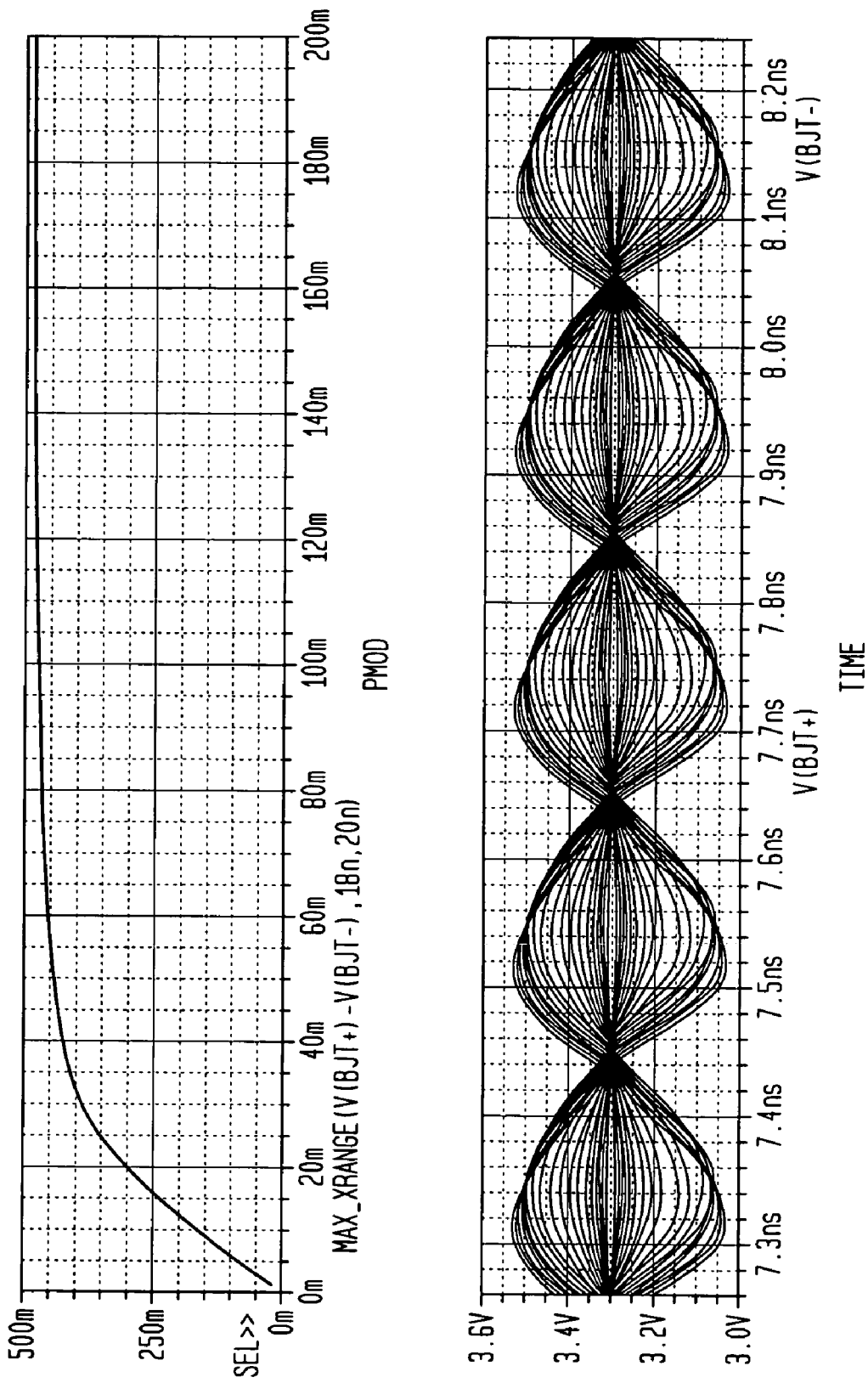

FIG. 54 is a simulated graphical illustration of amplitude limited by tail current and loaded Q, for a tuned differential R-C quad vector generator.

DETAILED DESCRIPTION OF THE INVENTION

1. Introduction

The present invention now will be described more fully hereinafter with reference to the accompanying drawings, in which embodiments of the invention are illustrated. This invention may, however, be embodied in many different forms and should not be construed as limited to the embodiments set forth herein. Rather, these embodiments are provided so that this disclosure will be thorough and complete, and will fully convey the invention to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Moreover, each embodiment described and illustrated herein includes its complementary conductivity type embodiment as well.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The present invention is directed to methods and systems for orthogonal signal generation and quadrature signal generation, which does not require orthogonal reference signals or nearly orthogonal reference signals as an input or given condition. The technique can utilize a reference phase shift less than 90° but greater than 0° along with an inversion to create orthogonal signals. This minimizes the number of critical manipulations required from a hardware perspective.

In a more general context this technique may extend to encompass linear operations involving 2 basis vectors and their inverses. A minimal basis set consists of 3 of these vectors. An infinite number can be used. The basis vectors are not required to be orthogonal but possess significant orthogonal components to develop the desired coordinate transformations while minimizing errors.

The simplest approaches will always involve only 2 parallel calculations given the basis set and at least one inverse (hereafter extended minimal basis set).

In Sections 1 through 4 a particularly simple example is presented with the associated trigonometric identities. In Section 5 a general vector representation is developed. Section 6 provides some implementation strategies, with performance analysis.

Throughout this description, complex arithmetic will be utilized. Since the signals of interest lie in the complex plane the vectors can be represented by complex numbers arranged in the Cartesian coordinate system. Occasionally magnitude and angle of the vectors (signals) will also be represented.

2. I Vector

Suppose two passband signals are summed, possessing the same envelope magnitudes yet different phases. For convenience in representation and visualization, assume that the signals are carriers without modulation. Although, this is not a significant restriction and can be waived for very practical scenarios involving approximately narrowband passband signals employing PM, AM and FM. The approximation used here assumes that $f_c \gg B$ where, $f_c \underline{\Delta}$ Carrier Passband Center Frequency $B \underline{\Delta}$ Effective Bandwidth of the Modulation of Interest Proceeding, we find the sum of the two passband signals as;

$$R(t)\sin(\omega_c t + \beta(t)) = A(t)(\sin \omega_c t + \gamma(t)) + A(t)\sin(\omega_c t + \gamma(t) + \phi)$$

$R(t)\underline{\Delta}$ Resulting Combined Amplitude Function $\beta(t)\underline{\Delta} \theta$ Resulting Phase of Combined Passband Signal $A(t)\underline{\Delta}$ Amplitude Function Describing the Passband Signals $\gamma(t) \underline{\Delta}$ Phase Function Describing the Passband Signals $\phi \underline{\Delta}$ Phase Shift between two Passband Carriers $0° < \phi \leq 90°$ If the summed carriers are not modulated then $A(t)=k_A$ (a constant) and $\gamma(t)=k_\gamma$ another constant. However, it can be shown that provided the amplitude function changes only slightly and/or the phase function changes slightly over the interval associated with the time required to implement $\phi$, $A(t)$, and $\gamma(t)$ can be regarded as virtually constant for the purpose of the following analysis so that;

$$R \sin(\omega_c t + \beta) \cong A \sin \omega_c t + A \sin(\omega_c t + \phi)$$

Reducing this result using analytic geometry and algebra, yields;

$$R = 2A\cos\frac{\phi}{2}$$

$$\phi = \arccos\left(\frac{R^2}{2A} - 1\right)$$

$$\beta = \arctan\left(\frac{R^2}{2\sqrt{1-\phi^2}}\right) = \tan^{-1}\left(\frac{1+\cos\phi}{\sin\phi}\right) \ldots A = 1$$

Figure 1:
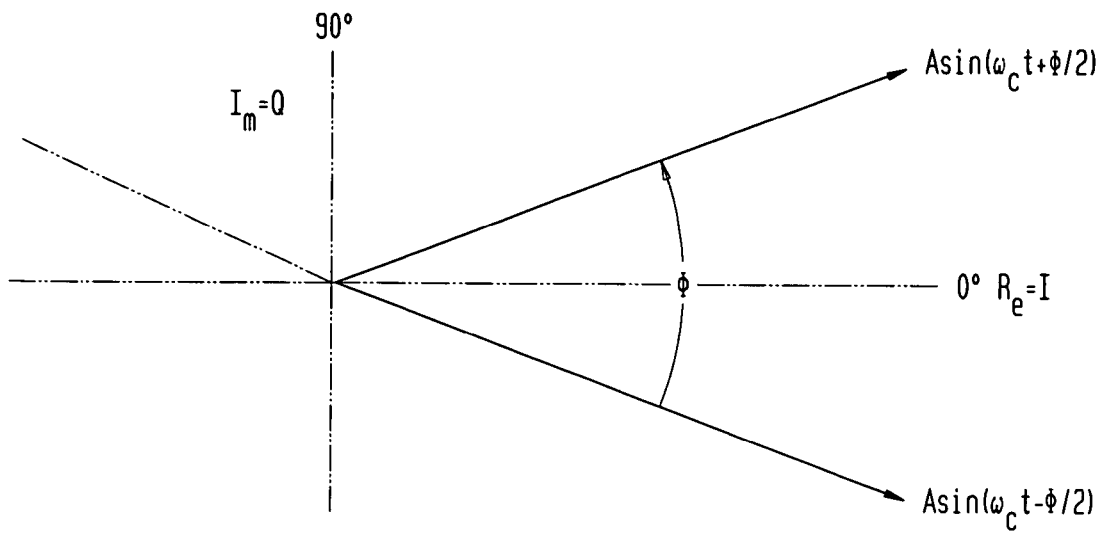
FIG. 1 is a vector diagram of the sum of two signals.

Referring to FIG. 1, consider the following vector diagram of the sum of two such signals.

Notice that the angular distance between the vectors is $\phi$. If the two vectors possess equal amplitudes, A, then they sum to a new vector of amplitude R at an angle of 0°. If the amplitudes of the two vectors are different then they sum to an angle other than 0°. For purposes of this paper analysis it is assumed that 0° is the in phase or I signal while 90° is the Q signal component. Then I is simply formed from this sum.

3. Q Vector Generation

Figure 2:
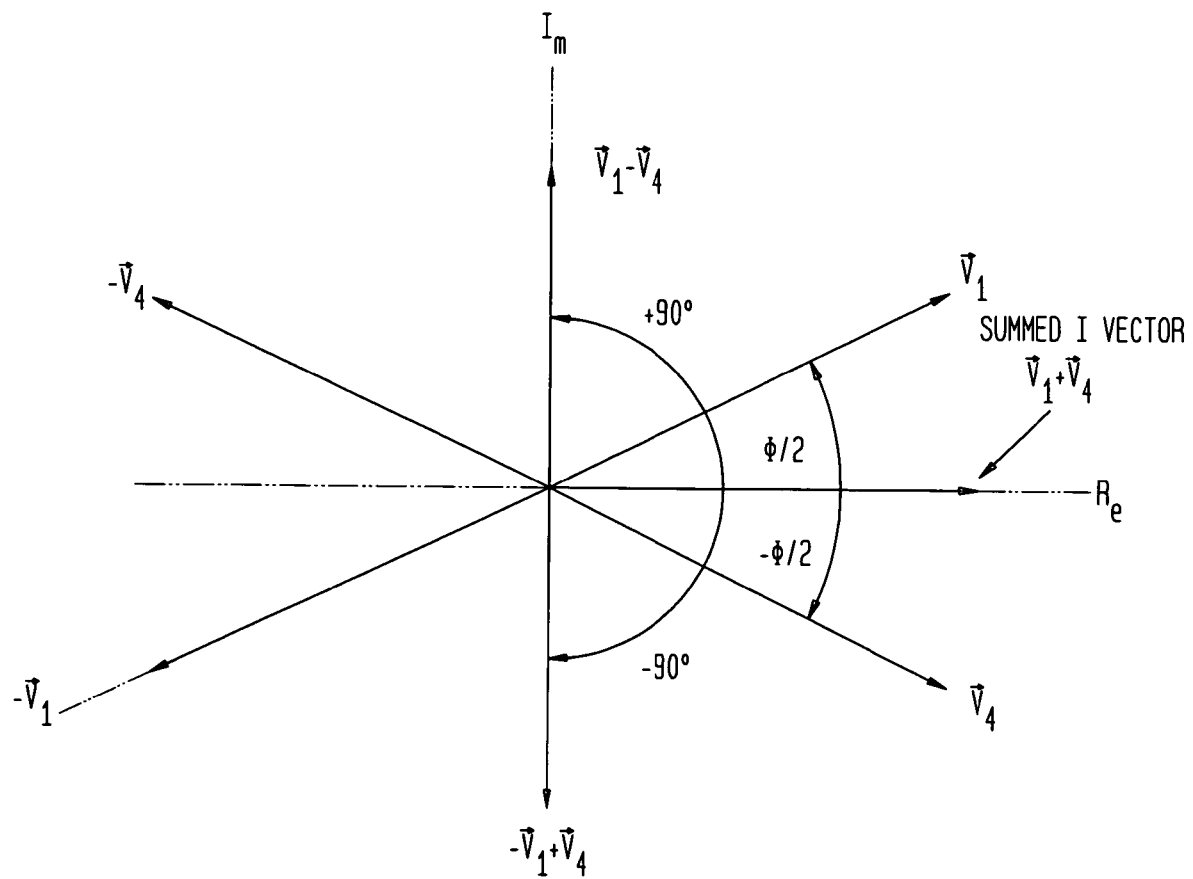
FIG. 2 is a vector diagram illustrating that the quadrature component of a signal can be formed via an inversion of one of the summing vectors.

The quadrature component of the signal can be formed via an inversion of one of the summing vectors illustrated in the previous section and the remaining vector as illustrated in FIG. 2.

Notice that $\vec{V}_1 + \vec{V}_4$ form the I reference as illustrated in the previous section. By combing (through vector summation) $-\vec{V}_1 + \vec{V}_4$ an orthogonal vector can be formed also. This can be represented by the following simple math.

$$-\vec{V}_1 + \vec{V}_4 = R_{90}\sin(\omega_c t + (\beta - \pi/4)) = -A\sin(\omega_c t + \phi/2) + A\sin(\omega_c t - \phi/2) = -A\sin(\omega_c t + (\phi/2 - \pi/2)) + A\sin(\omega_c t - \phi/2)$$

Similarly, $$\vec{V}_1 - \vec{V}_4 = A\sin(\omega_c t + \phi/2) - A\sin(\omega_c t - \phi/2) = 2A\sin(\phi/2)\cos(\omega_c t)$$

The equivalence of these vector operations is apparent. Also it is apparent that the I vector is orthogonal to Q as shown in previous calculations. The results are repeated here side by side for comparison;

$$\vec{I} = \vec{V}_1 + \vec{V}_4 = 2A\cos(\phi/2)\sin(\omega_c t)$$

$$\vec{Q} = \vec{V}_1 - \vec{V}_4 = 2A\sin(\phi/2)\cos(\omega_c t)$$

The first term in each equation is a scalar for the vector, dependent on the angle $\phi/2$. The second term in each equation in fact is the phasor of interest for I and Q components. Notice that the resulting amplitudes for the orthogonal signals are only equivalent if $\phi/2=45°$. This is obviously a preferred angle but is not required since the output ($\vec{I}, \vec{Q}$) vectors are always orthogonal regardless of the scalar component of the vectors.

4. Error Anomalies

One advantage of generating the orthogonal vectors in this manner is investment in hardware, power, complexity, etc., given a desired precision. In other words, other techniques typically require more power or more hardware for a given accuracy. Nevertheless, this approach has some error associated with the parameters of the generating vectors and associated hardware which should be examined.

The most obvious error is associated with amplitude imbalance of the generating vectors, say $\vec{V}_1$ and $\vec{V}_4$.

Consider the following;

$$R \sin(\omega_c t + \beta) = A_1 \sin \omega_c t + A_2 \sin(\omega_c t + \phi) = A \sin \omega_c t + \Delta A \sin(\omega_c t + \phi)$$

where $\Delta$ represents a Multiplicative Error Term and where $\Delta=1$ Corresponds to No Error This can be written as;

$$R \sin(\omega_c t + \beta) = A_1 \sin \omega_c t + A_2(\cos \phi \sin(\omega_c t) + \sin \phi \cos(\omega_c t)) = (A + \Delta A)\sin(\omega_c t) + \Delta A \sin \phi \cos(\omega_c t)$$

When $\Delta > 1$ the resulting vector rotates counter clockwise from 0° and when $\Delta < 1$ it rotates clockwise. Of course, one may argue that this rotation of $\vec{V}_1 + \vec{V}_4$, is after all arbitrary since the reference plane of I can be rotated and that a variation in $\phi/2$ should therefore not affect our interpretation of 0°. This is true. However, the difficulty arises when the orthogonal vector is produced relative to the new I reference if $\Delta$ still exists when creating the inversion.

It is convenient to refer to equations based on $\phi/2$ for further analysis.

$$\vec{V}_1 + \vec{V}_4 = A\left(\sin\left(\omega_c t + \frac{\phi}{2}\right) + \sin\left(\omega_c t - \frac{\phi}{2}\right)\right) + \underbrace{A(\Delta - 1)\sin\left(\omega_c t - \frac{\phi}{2}\right)}_{\text{error term}}$$

In this example all of the error term was allocated to $\vec{V}_4$ but could have been assigned (in part or whole) to $\vec{V}_1$ as well. Notice that the affect is to pull the desired 0° I reference slightly from 0° depending on the value of $\Delta$. Of course this 0° reference is arbitrary and the error angle may be redefined as 0° even if this calculation is not 0° due to a value of $\Delta$ other than 1. However, the formation of the quadrature vector follows as;

$$\vec{V}_1 - \vec{V}_4 = A(\sin(\omega_c t + \phi/2) - \sin(\omega_c t - \phi/2)) - A(\Delta - 1)\sin(\omega_c t - \phi/2)$$

From the above equations it is easy to deduce the absolute phase errors involved as;

$$I \text{ vector error } \Delta I_{\phi_\varepsilon} = \tan^{-1}\left(\frac{A(\Delta - 1)\sin\left(\frac{-\phi}{2}\right)}{A(\Delta - 1)\cos\left(\frac{-\phi}{2}\right) + \sqrt{2} \cdot A}\right)$$

$$Q \text{ vector error } \Delta Q_{\phi_\varepsilon} = \tan^{-1}\left(\frac{A(\Delta - 1)\cos\left(\frac{-\phi}{2}\right)}{-A(\Delta - 1)\sin\left(\frac{-\phi}{2}\right) + \sqrt{2} \cdot A}\right) - 90°$$

The $-90°$ in the second term of the $Q_{\phi_\varepsilon}$ is included to register the error relative to the imaginary axis.

These errors ($I_{\phi_\varepsilon}, Q_{\phi_\varepsilon}$) are cumulative. That is, they always add to increase phase error in one direction or the other, relative to 90° for this example. Minimizing one error also minimizes the other error from the perspective of this specific mechanism of error generation. Since the input parameter A is varied to produce the phase error this anomaly is labeled AM-PM conversion.

4.1. Output Amplitude Imbalance

Previous analysis has illustrated that phase errors at the output of the proposed I, Q generator are produced by (relative) amplitude errors of the input vectors. This may be considered as AM to PM conversion. However, the reverse situation exists also.

Whenever the generating vectors are not $\pm\phi/2=\pm45°$, the output vectors are amplitude imbalanced. This is PM to AM conversion.

The equations;

$$\vec{I} = 2A\cos(\phi/2)\sin(\omega_c t)$$

$$\vec{Q} = 2A\sin(\phi/2)\cos(\omega_c t)$$

illustrate that $\vec{I}$ and $\vec{Q}$ are only equivalent in amplitude if $\pm\phi/2=\pm45°$. This is therefore a preferred angle, although not strictly required for practical implementation. Whenever $\phi/2$ is such that I decreases then Q increases proportionally since the scalar error follows sin and cos functions.

This error is usually modest for any reasonable implementation and can be reduced further by non-linear operations. It is essential however, that the non-linear operation minimize AM to PM conversion since phase accuracy is the goal.

4.2. Error Sensitivities

Figure 3:
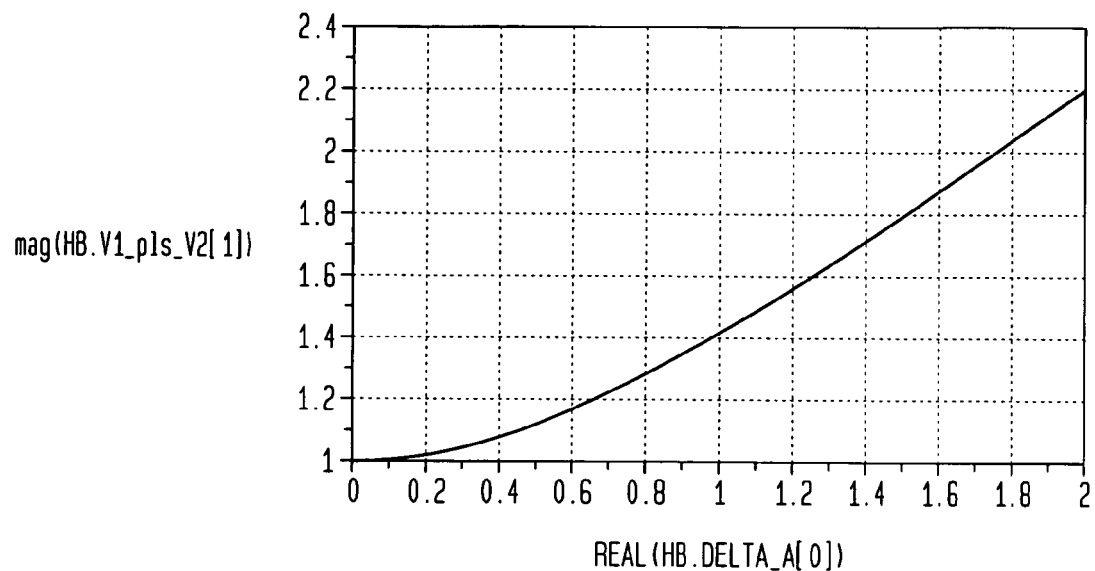
FIG. 3 is a graphical representation of output vector amplitude variation versus input amplitude error.

The first graph illustrates that the vector amplitude resulting from $\vec{V}_1+\vec{V}_2$ will vary if $|\vec{V}_2|$ varies. The input error is swept from 0 to 2 for the error multiplier $\Delta A$. FIG. 3 is a graph of I Output Vector Amplitude Variation vs. Input Amplitude Error for V2 ($\Delta A$).

Notice that for $\Delta A=1$ the output vector amplitude is $\sqrt{2}$.

Figure 4:
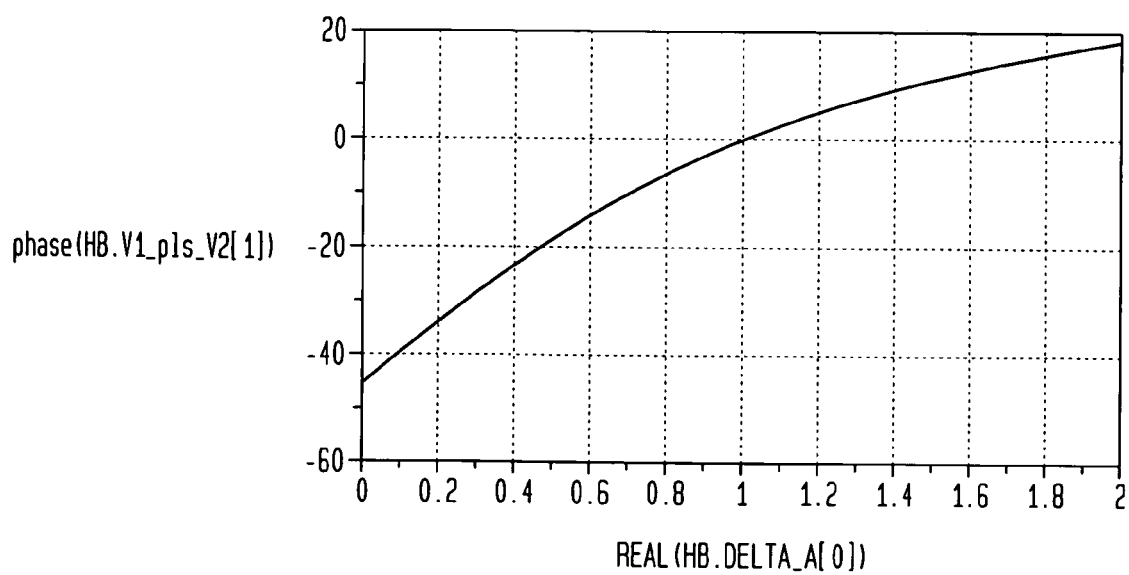
FIG. 4 is a graphical representation of output vector phase variation versus input amplitude error.

More importantly, the phase of this vector sum also is modified according to the graph FIG. 4, which illustrates I Output Vector Phase Variation vs. Input Amplitude Error for V2 ($\Delta A$) AM to PM Conversion. Fortunately the sensitivity about 0° is fairly low, on the order of, 4° for a 10% variance of $\Delta A$.

Figure 5:
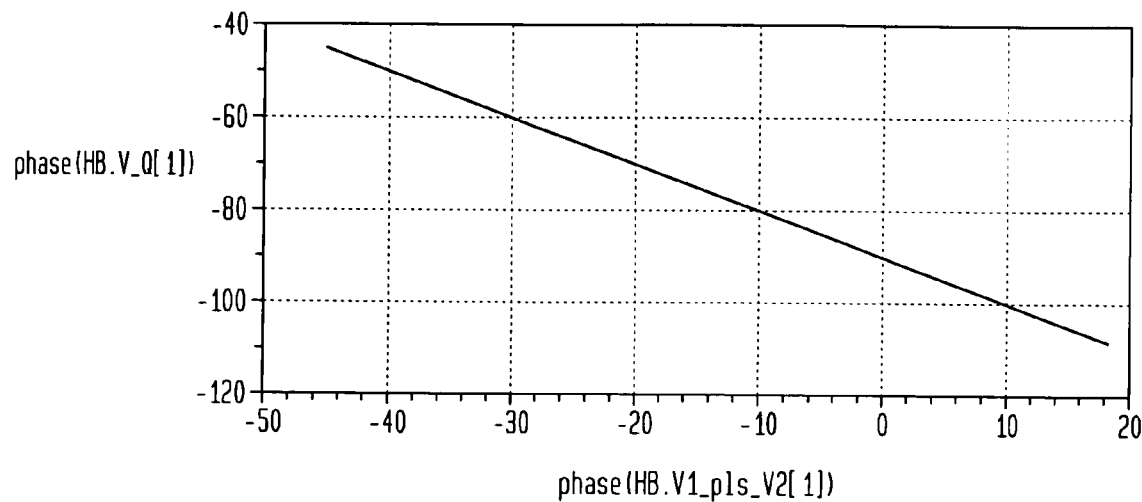
FIG. 5 is a graphical representation of phase versus Q.

FIG. 5 is a graph of I Phase vs. Q for a Linear Sweep of $\Delta A$ between 0 and 2. FIG. 5 shows that when I varies so does Q in such a manner as to double the variance from orthogonal.

Note that when I=0°, Q=−90°. Also, it is important to note the linear relationship between the two.

4.3. Error Due To Imperfect Inverse

Figure 6:
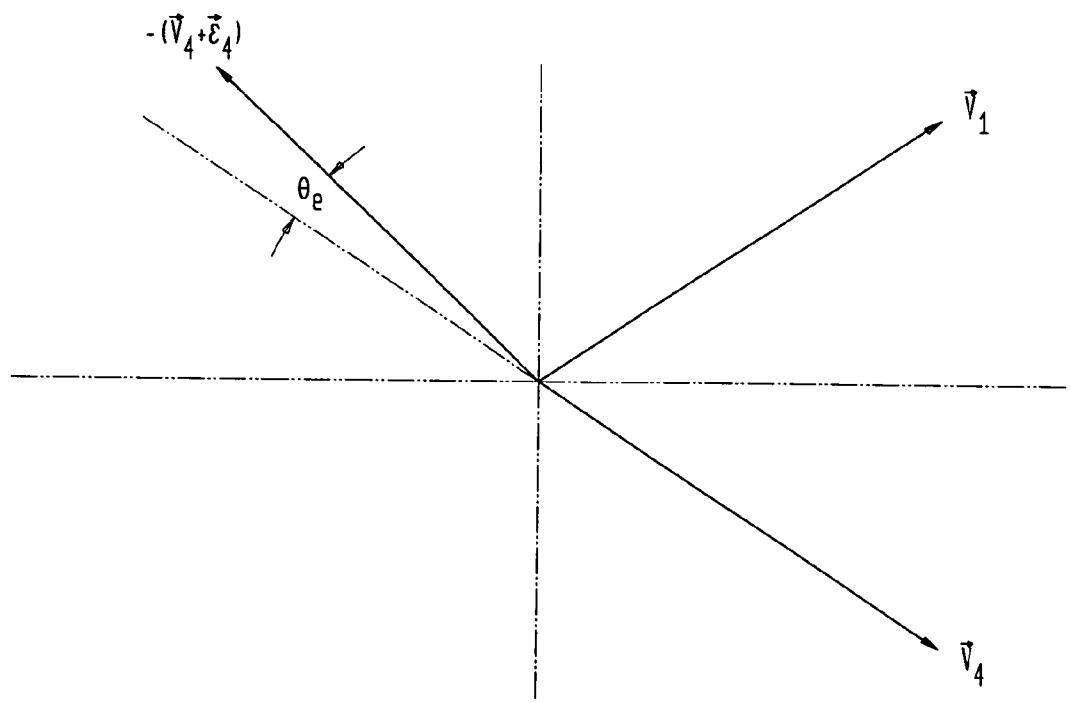
FIG. 6 is a vector diagram of an imperfect inverse.

In the example presented thus far the extended minimal basis set consists of $\vec{V}_1$, $\vec{V}_4$ and $-\vec{V}_4$. If $-\vec{V}_4$ is imperfect then further error will result unless it is cancelled. In the simple case presented, if $|\vec{V}_4|=|\vec{V}_1|$ then an error in phase $\Theta_e$ from 180° for $-\vec{V}_4$ (compared to $\vec{V}_4$) will translate to an error in orthogonality of $\Theta_e/2$ for $\vec{V}_1-\vec{V}_4$. Consider FIG. 6.

4.4. Obtaining the Perfect Inverse

Figure 7:
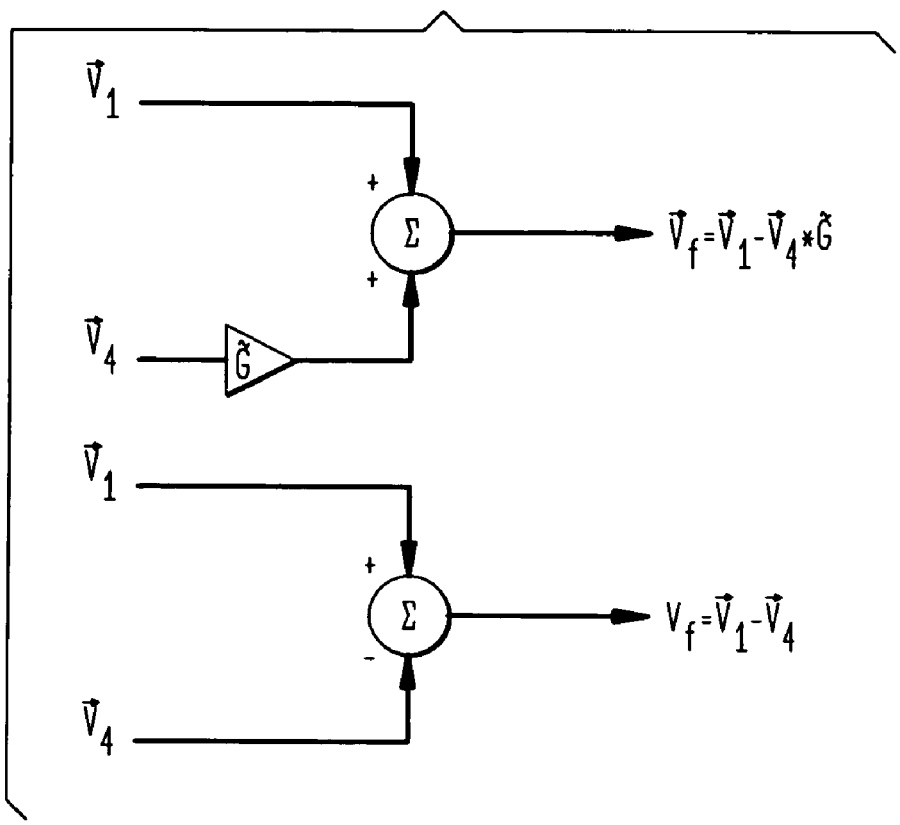
FIG. 7 is block diagram of vector signal operations.

In Section 4.3 the error due to an imperfect inverse is found to be $\Theta_e/2$. Therefore it is desirable to minimize this error. This can be accomplished by reversing the roles of $\vec{V}_1$ and $\vec{V}_4$ after the fact and completing the linear operations. Another way to view this is to introduce $-\vec{V}_1$ by a virtual or differential operation. For purposes of this paper such a virtual operation is considered as a subtraction at a summing node rather than an inversion. Although the operations are mathematically equivalent they possess different physical significance when related to hardware implementation. Consider two diagrams in FIG. 7.

If G is real and G=1 then both diagrams are equivalent. However, if $G\neq 1$ or if G is complex then the diagrams are not equivalent. For this reason differential subtraction nodes are preferred to avoid the error introduced by $\tilde{G}$. The errors presented in Section 4.3 are errors related to $\tilde{G}$.

Figure 8:
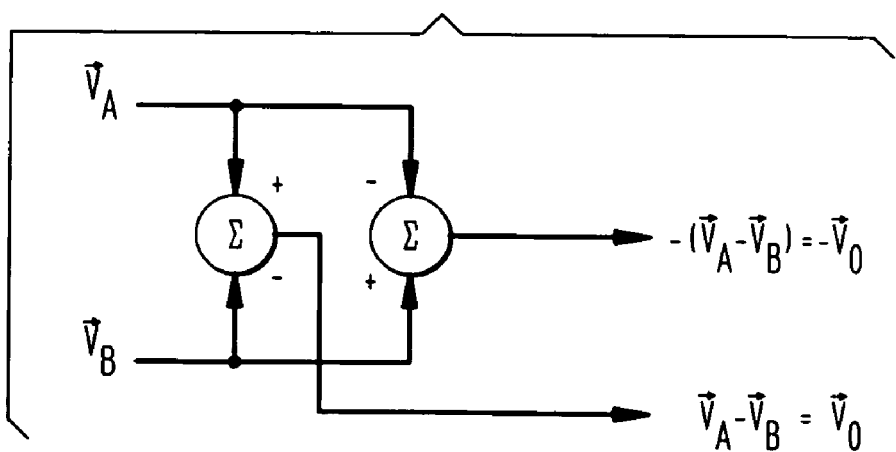
FIG. 8 is another block diagram of vector signal operations.

Consider FIG. 8, which creates a more robust inversion under certain circumstances.

Therefore, if difference operations are preferred and considered ideal or nearly ideal, as compared to inversion plus summing, then the block diagram in FIG. 8 generates the inverted signals with minimum error, provided the two difference nodes are matched in every way.

Figure 9:
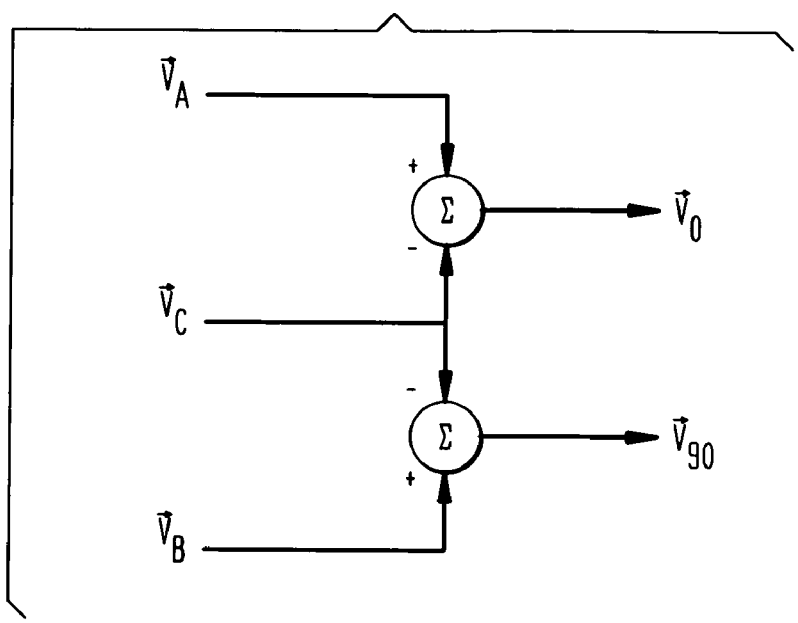
FIG. 9 is another block diagram of vector signal operations.

Now consider the vector signal operations of FIG. 9, where:

$$\vec{V}_0 = \vec{V}_A - \vec{V}_C \text{ 0° degree vector output}$$

$$\vec{V}_{90} = \vec{V}_B - \vec{V}_C \text{ 90° degree vector output}$$

$$\therefore jV_A - j\vec{V}_C = \vec{V}_B - \vec{V}_C \text{ (required for orthogonal outputs)}$$

Then, $$\vec{V}_C = \frac{\vec{V}_A + \vec{V}_B}{2} - j\frac{(\vec{V}_A - \vec{V}_B)}{2}$$

The rotation by j as well as the scaling, summation, subtraction, etc., are considered to be linear operators. Hence there are many linear circuit options which can produce these vectors. An alternate form is valuable as well.

$$V_C = \frac{\vec{V}_A}{2}(1-j) + \frac{\vec{V}_B}{2}(1+j)$$

Whenever $\vec{V}_B = -\vec{V}_A$ then $$\vec{V}_C = \frac{jV_A}{2}$$

Figure 10:
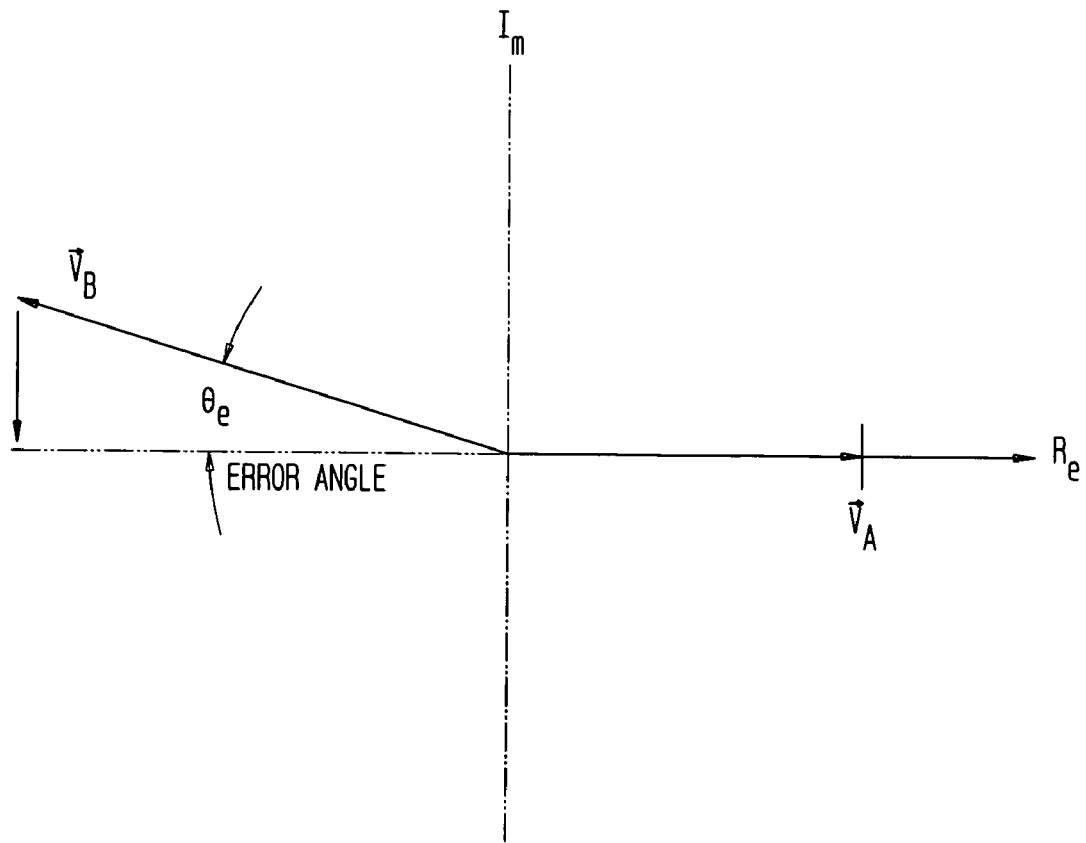
FIG. 10 is vector diagram illustrating error.
Figure 11:
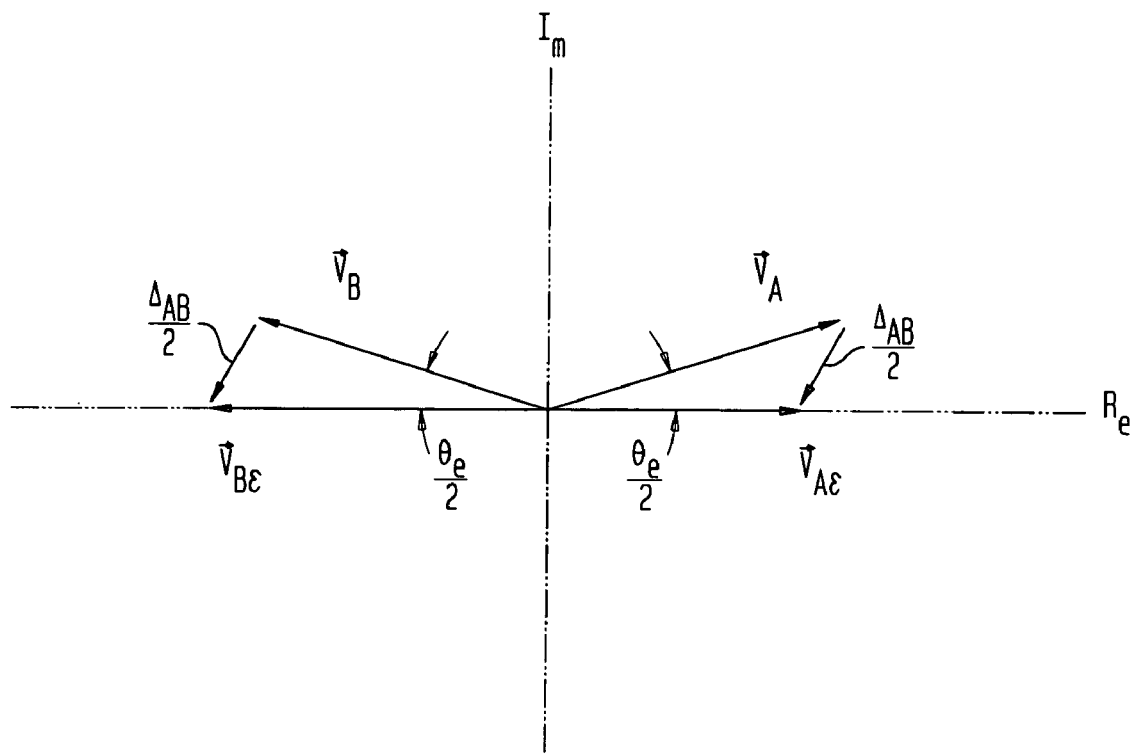
FIG. 11 is vector diagram illustrating distributed error.

Now suppose that $\vec{V}_A \neq \vec{V}_B$ due to some error. Then $$\vec{V}_A = \vec{V}_B + \vec{\Delta}_{AB}$$

Where $\vec{\Delta}_{AB}$ is required to correct $\vec{V}_B$ so that $V_A$ and $V_B$ are antipodal and $|\vec{V}_A|=|\vec{V}_B + \vec{\Delta}_{AB}|$. FIG. 10 illustrates this with a simplified vector diagram Furthermore, suppose that the error angle and amplitude error can be distributed equally between $V_A$ and $V_B$ such that the equivalent diagram is drawn in FIG. 11.

Notice that the total error angle $\Theta_e$ is preserved and the angle between $\vec{V}_A$ and $\vec{V}_B$ is unchanged. Furthermore, the magnitudes of $\vec{V}_A$ and $\vec{V}_B$ are unchanged.

The new vectors $\vec{V}_{A\epsilon}$ and $\vec{V}_{B\epsilon}$ are defined as $$\vec{V}_{A\varepsilon} = \vec{V}_A + \frac{\vec{\Delta}_{AB}}{2}$$

$$\vec{V}_{B\varepsilon} = \vec{V}_B + \frac{\vec{\Delta}_{AB}}{2}$$

Then $\vec{V}_0$ is found from;

$$\vec{V}_0 = \vec{V}_{A\varepsilon} - \vec{V}_C = \frac{\vec{V}_{A\varepsilon} - \vec{V}_{B\varepsilon}}{2}(1+j) = \frac{\vec{V}_A - \vec{V}_B}{2}(1+j) \therefore V_{A\varepsilon} - V_{B\varepsilon} = V_A - V_B$$

Also, $V_{90}$ is found in similar fashion;

$$\vec{V}_{90} = \vec{V}_{B\varepsilon} - \vec{V}_C = \frac{\vec{V}_A - \vec{V}_B}{2}(-1+j)$$

It should be obvious by inspection that $V_0$ and $V_{90}$ are orthogonal.

Notice that the errors $$\frac{\Delta_{AB}}{2}$$

cancel entirely. This occurs due to the use of differential architecture and differential summing nodes. This permits the errors $\Delta_{AB}/2$ to exist simultaneously at the inputs $V_{A\epsilon}$ and $V_{B\epsilon}$ in exactly the same amplitude and phase. Therefore, the errors appear as common mode and completely cancel at the output provided that $\vec{V}_C$ is given as specified.

5. General Presentation

Sections 2 through 3 presented a relatively simple example which utilized the basic principle of manipulating 2 vector basis functions and at least one of their inverses to obtain orthogonal vectors. Beginning with the extended basis function set a single parallel stage of linear math operations can be applied to obtain an orthogonal result. A minimum of two linear operations are required.

Figure 12:
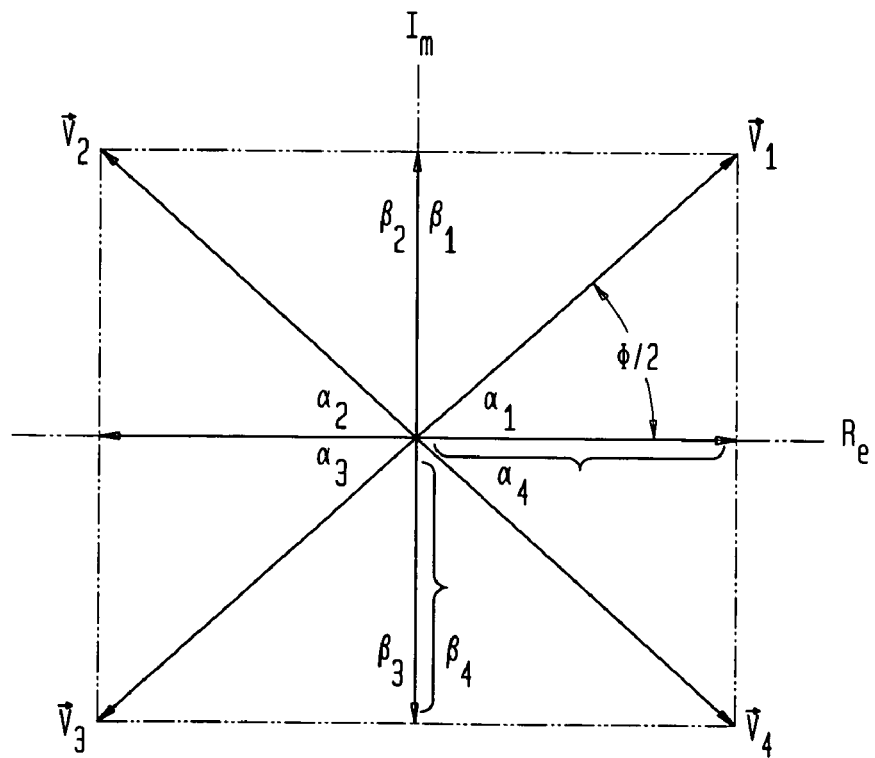
FIG. 12 is a generalized vector diagram.

In order to generalize the presentation the following vector representation is adopted, with reference to FIG. 12.

Four vectors are constructed to encompass possible extended basis sets from all 4 quadrants for this presentation. A minimal extended basis set (excluding degenerate cases) consists of 3 vectors. It should be evident that the basis set could be composed of an infinite numbers of vectors. They are not required to be orthogonal and their respective magnitudes are not required to be equal. Hence, the following basic equations are recorded using complex math notation.

$$\tilde{v}_1 = \alpha_1 + j\beta_1$$

$$\tilde{v}_2 = \alpha_2 + j\beta_2$$

$$\tilde{v}_3 = \alpha_3 + j\beta_3$$

$$\tilde{v}_4 = \alpha_4 + j\beta_4$$

$\alpha, \beta$ may be positive or negative numbers.

In this representation ~ denotes a complex number and the subscripts denote coordinate quadrant. Without loss of generality $\hat{V}_1$ is established as a reference vector with $\phi/2 = 45°$ or $\pi/4$ radians. With $\hat{V}_1$ as a reference the vector cross errors are defined as the incremental change required to orthogonalize the pair wise vectors, while maintaining the desired normalized vector magnitude (i.e., all phase and amplitude errors removed). Hence, $$|\alpha_1 + j\beta_1| = |\alpha_2 + j\beta_2 + \tilde{\Delta}_{12}|$$

$$\frac{\alpha_1}{\beta_1} = \frac{-(\alpha_2 + R_e\tilde{\Delta}_{12})}{(\beta_2 + I_m\tilde{\Delta}_{12})}$$

$$\therefore \alpha_1 = -(\alpha_2 + R_e\tilde{\Delta}_{12})$$

$$\beta_1 = (\beta_2 + I_m\tilde{\Delta}_{12})$$

$$\alpha_1 = -\alpha_2, R_e\tilde{\Delta}_{12} = 0$$

$$\beta_1 = \beta_2, I_m\tilde{\Delta}_{12} = 0$$

$$|\alpha_1| = |\alpha_2| = |\beta_1| = |\beta_2|$$

Forming all possible cross errors yields the following cross error matrix.

$$(\tilde{\Delta}) \underline{\Delta} \begin{pmatrix} 0 & \tilde{\Delta}_{12} & \tilde{\Delta}_{13} & \tilde{\Delta}_{14} \\ -\tilde{\Delta}_{12} & 0 & \tilde{\Delta}_{23} & \tilde{\Delta}_{24} \\ -\tilde{\Delta}_{13} & -\tilde{\Delta}_{23} & 0 & \tilde{\Delta}_{34} \\ -\tilde{\Delta}_{14} & -\tilde{\Delta}_{24} & -\tilde{\Delta}_{34} & 0 \end{pmatrix}$$

Where;

$$\tilde{\Delta}_{12} = -\tilde{\Delta}_{21}$$

$$\tilde{\Delta}_{13} = -\tilde{\Delta}_{31}$$

$$\tilde{\Delta}_{14} = -\tilde{\Delta}_{41}$$

$$\tilde{\Delta}_{23} = -\tilde{\Delta}_{32}$$

$$\tilde{\Delta}_{24} = -\tilde{\Delta}_{42}$$

$$\tilde{\Delta}_{34} = -\tilde{\Delta}_{43}$$

Also the dot and cross products will be needed. For instance;

$$\frac{\tilde{v}_1}{(\alpha_1 + j\beta_1)} \cdot \left( \frac{\tilde{v}_2}{(\alpha_2 + j\beta_2)} + \tilde{\Delta}_{12} \right) = 0$$

$$= |\alpha_1 + j\beta_1||\alpha_2 + j\beta_2 + \tilde{\Delta}_{12}|\cos\Theta_{12}$$

$$(\alpha_1 + j\beta_1) \times (\alpha_2 + j\beta_2 + \tilde{\Delta}_{12}) = |\alpha_1 + j\beta_1||\alpha_2 + j\beta_2 + \tilde{\Delta}_{12}|\sin\Theta_{12} \cdot \vec{n}$$

Whenever the dot product is zero then the vectors are orthogonal. Whenever the vectors are orthogonal then the magnitude of the cross product is the product of the individual magnitudes and the product is maximized.

These identities and vector relationships will be utilized heavily in the following treatment.

5.1. Particular Case 1

Suppose the example analyzed in Sections 2 through 3 is presented with the alternate representation using vector notation and complex numbers. Then the following operations are readily identified.

$$\left.\begin{array}{l}\tilde{V}_1 = \alpha_1 + j\beta_1 \\ \tilde{V}_4 = \alpha_4 + j\beta_4 \\ -\tilde{V}_1 = -\alpha_1 - j\beta_1 = \alpha_3 + j\beta_3\end{array}\right\} \text{extended minimal basis set}$$

The formation of orthogonal vectors proceeds $$\tilde{V}_0 = \tilde{V}_1 + \tilde{V}_4 + \tilde{\Delta}_{14}$$

$$\tilde{V}_{-90} = -\tilde{V}_1 + \tilde{V}_4 + \tilde{\Delta}_{14}$$

The dot product of these two vectors is identically zero only when $\Delta_{14} = 0$. The dot product and cross product errors of the original vector sums is found from;

Dot Product Error $$\therefore \tilde{V}_0 \cdot \tilde{V}_{-90} = |\tilde{V}_4|^2 - |\tilde{V}_1|^2 + |\tilde{\Delta}_{14}|^2 + 2|\tilde{V}_4||\tilde{V}_1|\cos\Theta_{14} + 2|\tilde{V}_1||\tilde{\Delta}_{14}|\cos(\Theta_{1\Delta 14}) + 2|\tilde{V}_4||\tilde{\Delta}_{14}|\cos(\Theta_{4\Delta 14})$$

It is useful to examine some properties of this particular equation under various circumstances.

If $\tilde{V}_4 = \tilde{V}_1^*$ then $V_0 \cdot V_{-90} = 0$     Observation 1

If $\tilde{\Delta}_{14} = 0$ then $V_0 \cdot V_{-90} = 0$     Observation 2

When $\cos\Theta_{1\Delta 14} = 0$ then $V_0 \cdot V_{-90} = 0$ and vice versa     Observation 3

If $\tilde{\Delta}_{14} = \tilde{V}_1 = \tilde{V}_4^*$     Observation 4
$|\tilde{\Delta}_{14}|^2 = (|\alpha_1 - \alpha_{14}|)^2 + (|\beta_1 + \beta_4|)^2$ $\Theta_{\Delta 14} = \arctan\left(\frac{\beta_1 + \beta_4}{\alpha_1 - \alpha_4}\right); \alpha_1 - \alpha_4 > 0;$     Observation 5

$1^{st}$, $4^{th}$ quadrants $\Theta_{\Delta 14} = \arctan\left(\frac{\beta_1 + \beta_4}{\alpha_1 - \alpha_4}\right) + 180°; \alpha_1 - \alpha_4 > 0;$ $2^{nd}$, $3^{rd}$ quadrants $\Theta_{1\Delta 14} = \Theta_{14} + \Theta_{4\Delta 14}$    Angle between $\tilde{V}_1$ and the error vector $\tilde{\Delta}_{14}$ $\Theta_{\Delta 14} = \Theta_4 + \Theta_{4\Delta 14}$    Absolute error vector angle for $\tilde{\Delta}_{14}$ $\Theta_{14} = -45° + \Theta_4$    Difference angle between $\tilde{V}_1$ and $\tilde{V}_4$ Cross Product $$\tilde{V}_0 \times \tilde{V}_{-90} = (\tilde{V}_1 + \tilde{V}_4 + \tilde{\Delta}_{14}) \times (-V_1 + V_4 - \Delta_{14}) = 2(|\tilde{V}_1||\tilde{V}_4|\sin(\Theta_{14}) + |\Delta_{14}||V_4|\sin(\Theta_{4\Delta 14}) + |\Delta_{14}||V_1|\sin(\Theta_{1\Delta 14}))\vec{n}$$

If the error $|\Delta_{14}|$ tends to zero then $\tilde{V}_0 \times \tilde{V}_{-90} = |\tilde{V}_1||\tilde{V}_4| \cdot \vec{n}$ Both the dot and cross products are excellent metrics for measuring orthogonality and provide a means for estimating sensitivity for the various algorithms.

5.2. Case 2

Using the previous notation two vectors are formed as follows;

$$V_0 = \tilde{V}_1 - (\tilde{V}_3 + \tilde{\Delta}_{14})$$

$$V_{+90} = \tilde{V}_2 - (\tilde{V}_4 + \tilde{\Delta}_{24})$$

Figure 13:
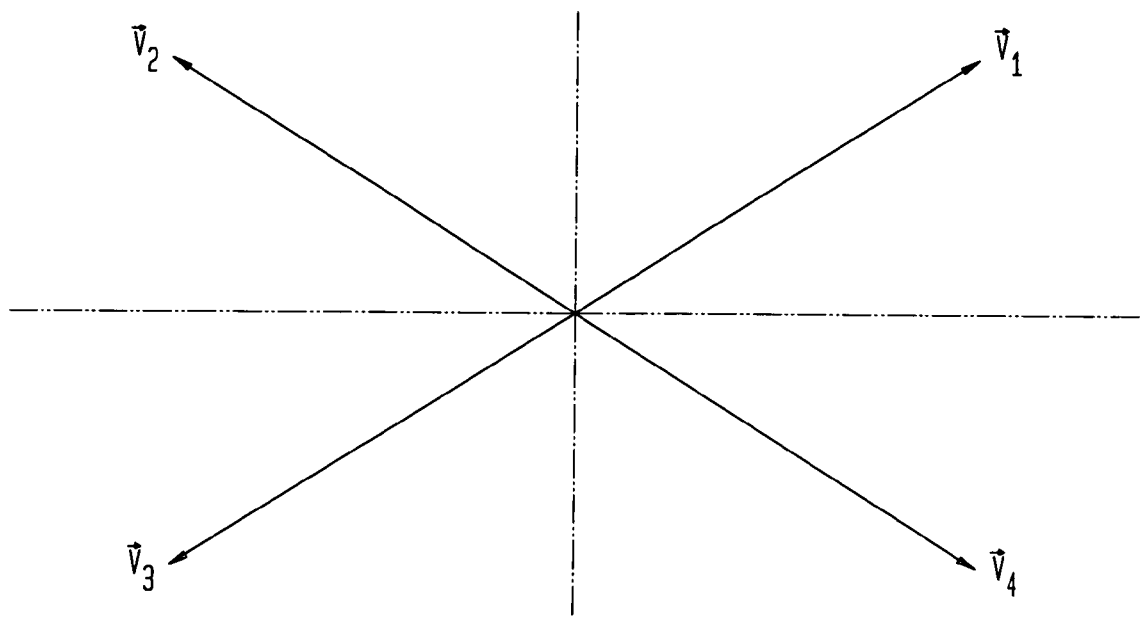
FIG. 13 is a vector diagram of basis vectors.
Figure 14:
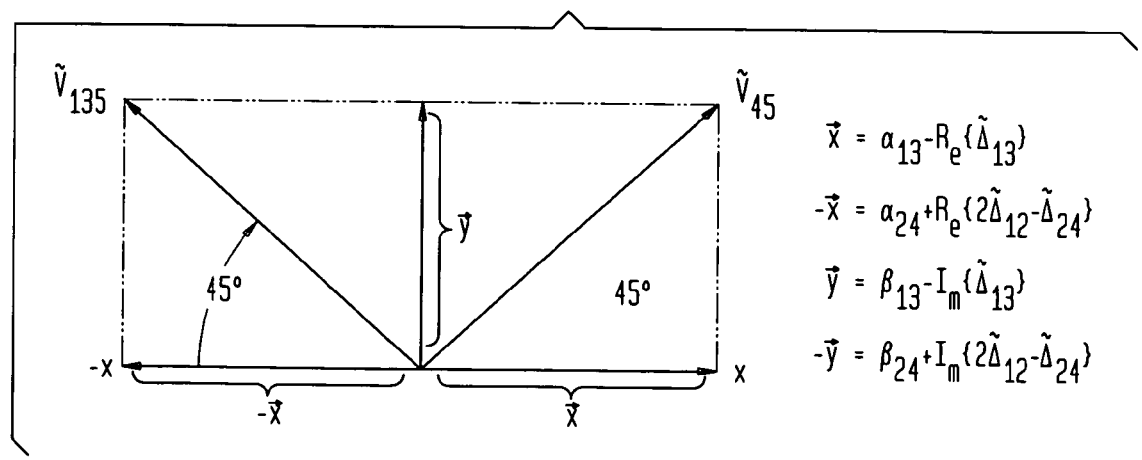
FIG. 14 is another vector diagram of basis vectors.

The basis vectors are redrawn in FIGS. 13 and 14 for reference.

$$\tilde{V}_{45} = \tilde{V}_1 - (\tilde{V}_3 + \tilde{\Delta}_{13}) = (\alpha_1 - \alpha_3) + (\beta_1 - \beta_3)j - \tilde{\Delta}_{13}$$

$$\tilde{V}_{135} = (\tilde{V}_2 + 2\tilde{\Delta}_{12}) - (\tilde{V}_4 + \tilde{\Delta}_{24}) = (\alpha_2 - \alpha_4) + (\beta_2 - \beta_4)j - \tilde{\Delta}_{24} + 2\tilde{\Delta}_{12}$$

$\alpha_{13} = \alpha_1 - \alpha_3$ $\beta_{13} = \beta_1 - \beta_3$ $\alpha_{24} = \alpha_2 - \alpha_4$ $\beta_{24} = \beta_2 - \beta_4$ All of the correction (error) vectors are included such that $V_{45}$ and $V_{135}$ are orthogonal. Notice the vectors on the real axis and imaginary axis. $V_{135}$ and $V_{45}$ are composed from those vectors, $\vec{x}, -\vec{x}, \vec{y}$. This is exactly the same form as that given in Section 5.1 for Case 1, i.e., $$\vec{V}_{135} = -\vec{x} + \vec{y}$$

$$\vec{V}_{45} = \vec{x} + \vec{y}$$

This is the same form as;

$$\vec{V}_1 + \vec{V}_4 = \vec{V}_0$$

$$\vec{V}_1 - \vec{V}_4 = \vec{V}_{90}$$

All cases regardless of how many original basis vectors will reduce to the trivial minimal basis set of 3 vectors.

6. Implementation Strategies

Figure 15:
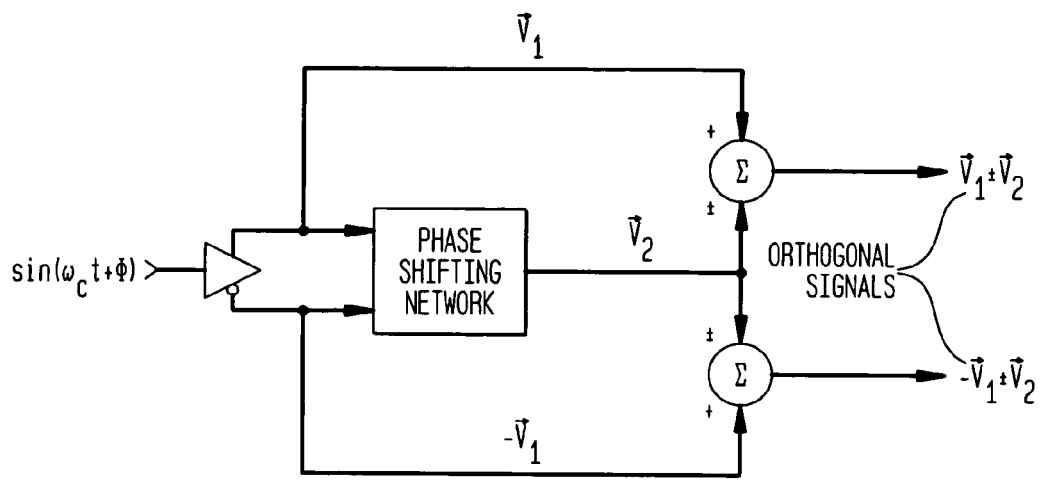
FIG. 15 is a block diagram vector quad generator.

A block diagram for the specific example presented in Sections 2 through 3 is illustrated FIG. 15.

Notice that the outputs are formed from the original extended basis vectors $\vec{V}_1, -\vec{V}_1, \vec{V}_2$ where $\vec{V}_2$ is quasi orthogonal to $\vec{V}_1, -\vec{V}_1$. That is, $\vec{V}_2$ possesses a significant orthogonal component even though some error is present as well. All versions may be shown to reduce to this basic form, under linear operation and coordinate transformation.

6.1. First Implementation

Given the block diagram above a circuit may be constructed according to the schematics described below. First some ideal block diagrams are provided with some equations which explain the vector operations in polar form. Finally a circuit is given which details an implementation with actual components.

Figure 16:
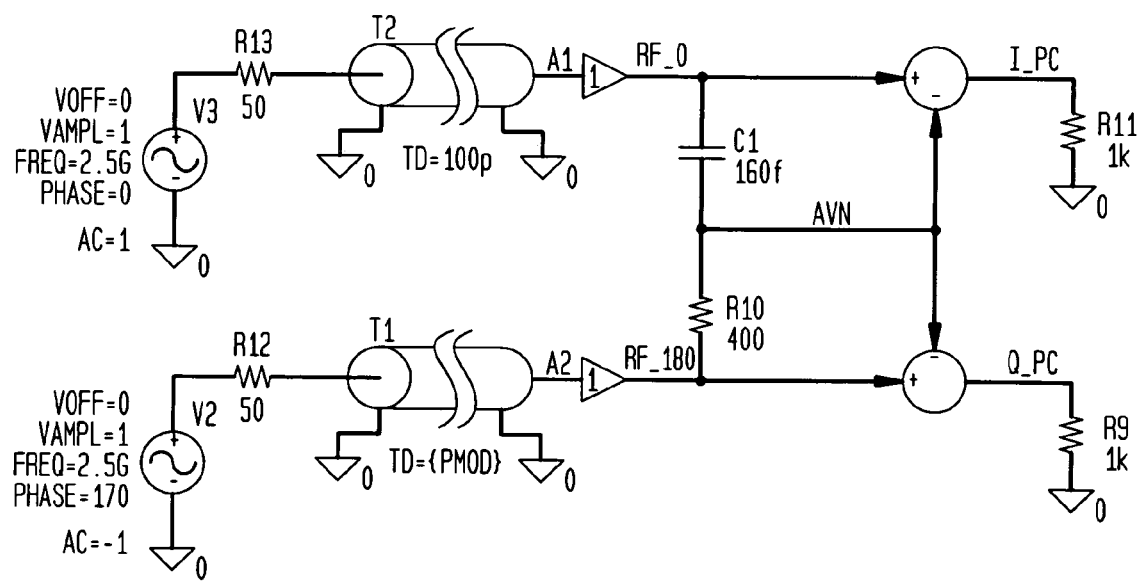
FIG. 16 is a circuit diagram of a vector quad generator.

FIG. 16 illustrates a Vector Quad Gen Block Diagram/ABM Simulation Circuit.

Figure 17:
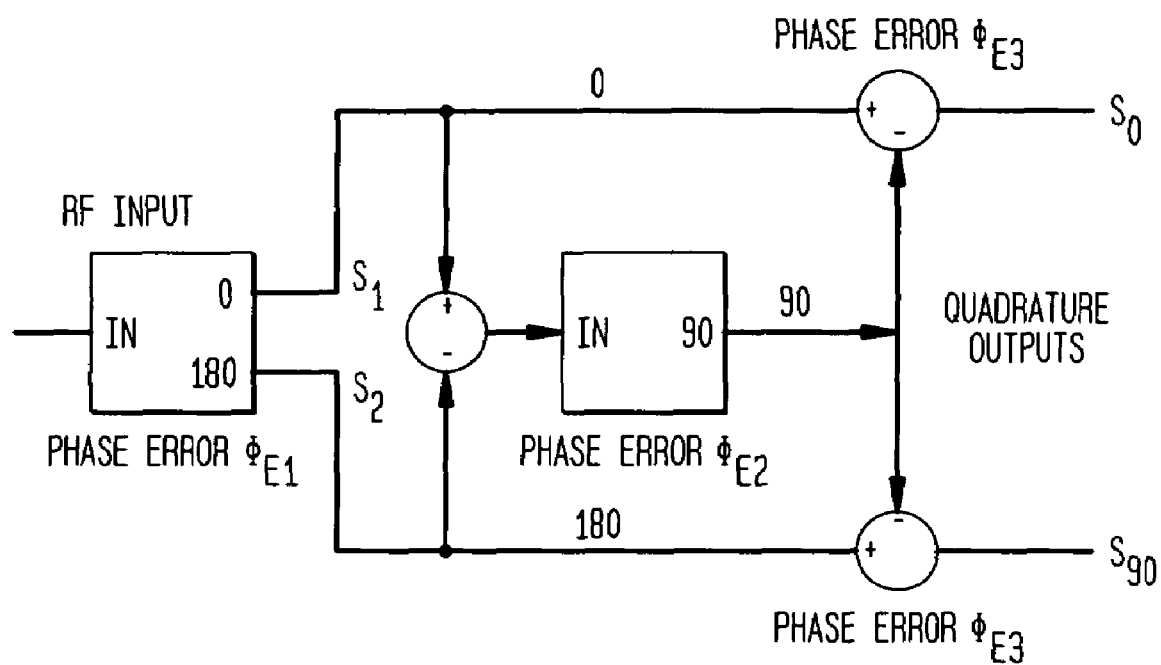
FIG. 17 is a block diagram of a vector quad generator—difference mode.

FIG. 17 illustrates a Vector Quad Gen Simplified Block Diagram—Difference Approach.

Figure 18:
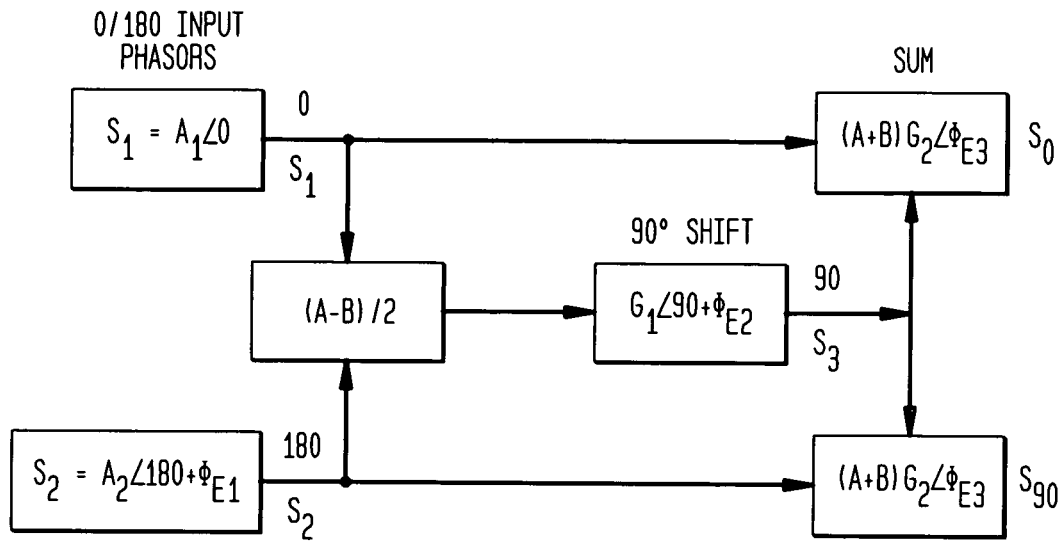
FIG. 18 is a block diagram of a vector quad generator with transfer functions.

FIG. 18 illustrates Vector Quad Gen Block Diagram/Transfer Functions.

Figure 19:
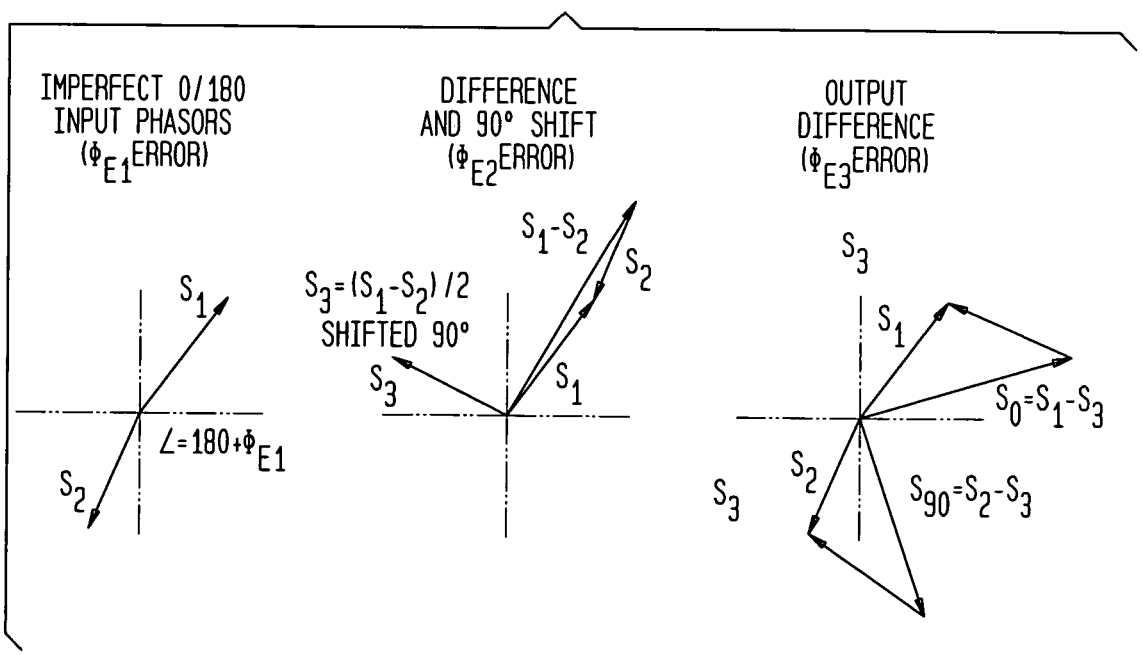
FIG. 19 illustrates phasor diagrams for vector quad generators difference modes.

FIG. 19 illustrates Vector Quad Gen Difference Mode Phasor Diagrams. With an R-C implementation of the 90° phase shift network, gain G1 and phase error $\phi_{E1}$ become a function of the input phase mismatch, $\phi_{E2}$. This dependency results in a cancellation of output quadrature phase error in response to input phase error ($\phi_{E1}$).

Figure 20:
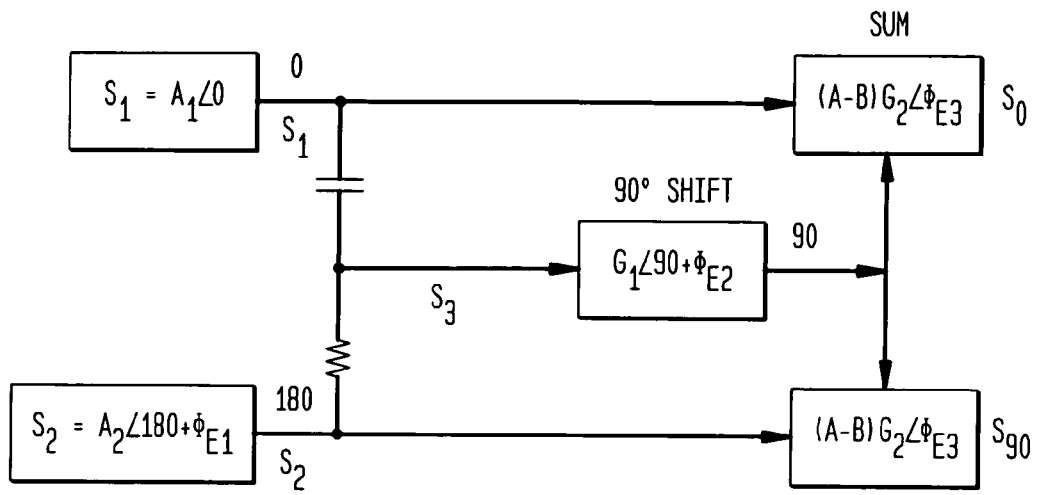
FIG. 20 illustrates vector quad generator circuit operation.

FIG. 20 illustrates Vector Quad Gen Circuit Operation. The performance of the architecture is evaluated through simulations with ideal components. The transmission line characteristics are altered to simulate input phase mismatch.

FIG. 21 further illustrates Vector Quad Gen Circuit Operation. This architecture demonstrates excellent output amplitude matching and zero quadrature phase error in response to varying input phase.

FIG. 22 graphically illustrates Vector Quad Gen Ideal Circuit Simulation.

FIG. 23 further graphically illustrates Vector Quad Gen Ideal Circuit Simulation. The circuit provides excellent output amplitude matching and zero quadrature phase error in response to varying input amplitude mismatch.

FIG. 24 further illustrates Vector Quad Gen Ideal Circuit Simulation. Frequency variations produce output amplitude mismatch and zero phase error.

FIG. 25 further illustrates Vector Quad Gen Ideal Circuit Simulation. R-C phase splitter variations (±10% shown) produce output amplitude mismatch and zero phase error.

FIG. 26 further illustrates Vector Quad Gen Ideal Circuit Simulation. FIG. 26 illustrates high sensitivity to differencer common node amplitude: 5% amplitude variation results in approximately 4° of quadrature phase error.

FIG. 27 further illustrates Vector Quad Gen Ideal Circuit Simulation. 5% amplitude variation at differencer plus input node results in approximately 2° of quadrature phase error.

FIG. 28 illustrates Vector quad Gen Difference Mode Circuit Implementation Circuit 1.

FIG. 29 illustrates Vector Quad Gen Difference Mode Circuit Implementation Simple Difference Amp.

6.2. Second Implementation

FIG. 30 illustrates Vector Quad Gen Block Diagrams/ABM Simulation Circuits.

FIG. 31 illustrates Vector Quad Gen Simplified Block Diagram—Simmer Approach.

FIG. 32 illustrates Vector Quad Gen Block Diagram/Transfer Functions. $\phi_{E1}$, $\phi_{E2}$, and $\phi_{E\#}$ are phase errors associated with the 0/180, difference/90, and summer blocks, respectively. $G_x$ are the gains of each block.

FIG. 33 illustrates Vector Quad Gen Phasor Diagrams.

According to an embodiment of the present invention, quadrature component computation (referring to FIG. 32) is achieved according to the following equations:

$$S_0 = [A_1 \angle 0 + (0.5)(A_1 \angle 0 - A_2 \angle 180 + \phi_{E1})(G_1 \angle 90 + \phi_{E2})] \\ G_2 \angle \phi_{E3}$$

$$S_{90} = [A_2 \angle 180 + \phi_{E1} + (0.5)(A_1 \angle 0 - A_2 \angle 180 + \phi_{E1}) \\ (G_1 \angle 90 + \phi_{E2})] G_2 \angle \phi_{E3}$$

It is apparent in this representation that the gain term $G_2 \angle \phi_{E3}$ affects each phasor equally and does not influence the relative magnitude or phase difference. Simplifying the above equations:

$$S_{0a} = A_1 \angle 0 + (0.5)(A_1 G_1 \angle 90 + \phi_{E2}) + (0.5)(A_2 G_1 \angle 90 + \phi_{E1} + \phi_{E2})$$

$$S_{90a} = -A_2 \angle \phi_{E1} + (0.5)(A_1 G_1 \angle 90 + \phi_{E2}) + (0.5) \\ (A_2 G_1 \angle 90 + \phi_{E1} + \phi_{E2})$$

Accordingly, computing vector errors as a function of the individual block phase errors and gains, with $S_0$ as reference, we can write:

$$S_{90a(IDEAL)} = (S_{0a})(1 \angle 90) \\ = A_1 \angle 90 - (0.5)(A_1 G_1 \angle \phi_{E2}) - (0.5)(A_2 G_1 \angle \phi_{E1} + \phi_{E2})$$

$$S_{90a(ERROR)} = S_{90a(IDEAL)} - S_{90a}$$

$$S_{90a(ERROR)} = +jA_1 - (0.5)[A_1 G_1 \cos(\phi_{E2})] - \\ j(0.5)[A_1 G_1 \sin(\phi_{E2})] - (0.5)[A_2 G_1 \cos(\phi_{E1} + \phi_{E2})] - \\ j(0.5)[A_2 G_1 \sin(\phi_{E1} + \phi_{E2})] + A_2 \cos(\phi_{E1}) + jA_2 \sin(\phi_{E1}) + \\ (0.5)[A_1 G_1 \sin(\phi_{E2})] - j(0.5)[A_1 G_1 \cos(\phi_{E2})] + \\ (0.5)[A_2 G_1 \sin(\phi_{E1} + \phi_{E2})] - j(0.5)[A_2 G_1 \cos(\phi_{E1} + \phi_{E2})]$$

If the 90° phase shift error $\phi_{E2}$ is small, the above equations simplify to:

$$S_{90a(ERROR)} = +jA_1 - (0.5)(A_1 G_1) - (0.5)A_2 G_1 \cos(\phi_{E1}) - \\ j(0.5)A_2 G_1 \sin(\phi_{E1}) + A_2 \cos(\phi_{E1}) + jA_2 \sin(\phi_{E1}) - \\ j(0.5)A_1 G_1 + (0.5)A_2 G_1 \sin(\phi_{E1}) - j(0.5)A_2 G_1 \cos(\phi_{E1})$$

$$S_{90a(ERROR)} = -(0.5)(A_1 G_1) + A_2 \cos(\phi_{E1}) + \\ (0.5)A_2 G_1 [\sin(\phi_{E1}) - \cos(\phi_{E1})] + jA_1 (1 - 0.5 G_1) + \\ jA_2 \sin(\phi_{E1}) - j(0.5)A_2 G_1 [\sin(\phi_{E1}) + \cos(\phi_{E1})]$$

Further, if $G_1$ is approximately unity, we then have:

$$S_{90a(ERROR)} = -(0.5)(A_1) + (0.5)A_2 [\sin(\phi_{E1}) + \cos(\phi_{E1})] + \\ j(0.5)(A_1) + j(0.5)A_2 [\sin(\phi_{E1}) - \cos(\phi_{E1})]$$

VECTOR ERROR = $S_{90a(ERROR)} = S_{90a(IDEAL)} - S_{90a}$

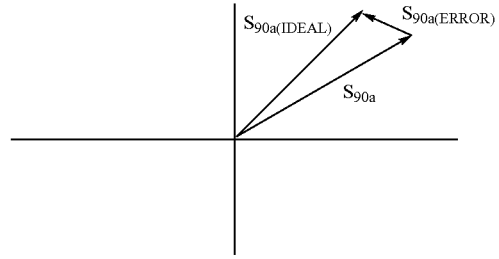

In contrast to the vector error, the quadrature error or phase error can be defined in terms of the relative phase of each of the quadrature components compared to the ideal 90°:

$$\phi_{90(ERROR)} = \phi_{90} - \phi_0 - 90°$$

$$S_{0a} = A_1 (0.5)[A_1 G_1 \sin(\phi_{E2})] + j(0.5)[A_1 G_1 \cos(\phi_{E2})] - \\ (0.5)[A_2 G_1 \sin(\phi_{E1} + \phi_{E2})] + j(0.5)[A_2 G_1 \cos(\phi_{E1} + \phi_{E2})]$$

$$\tan(\phi_{0a}) = \frac{0.5 G_1 [A_1 \cos(\phi_{E2}) + A_2 \cos(\phi_{E1} + \phi_{E2})]}{A_1 - 0.5 G_1 [A_1 \sin(\phi_{E2}) + A_2 \sin(\phi_{E1} + \phi_{E2})]}$$

If $\phi_{E2}$ is small:

$$\tan(\phi_{0a}) \cong \frac{0.5 G_1 [A_1 + A_2 \cos(\phi_{E1})]}{A_1 - 0.5 G_1 [A_2 \sin(\phi_{E1})]}$$

$$\tan(\phi_{90a}) \cong \frac{-A_2 \sin(\phi_{E1}) + 0.5 G_1 [A_1 + A_2 \cos(\phi_{E1})]}{-A_2 \cos(\phi_{E1}) - 0.5 G_1 [A_2 \sin(\phi_{E1})]}$$

It should be noted that the gain term $G_1$ is dependent on input phase mismatch ($\phi_{E1}$) with this particular R-C implementation. A 10° $\phi_{E1}$ will result in approximately 10% change in $G_1$. This dependence approximately doubles the sensitivity of quadrature phase error to 0/180 phase mismatch.

Defining phase error as:

$$\phi_{90a(ERROR)} = \phi_{90a} - \phi_{0a} - 90°$$

it can be empirically shown that $$|\phi_{90a(ERROR)}| \cong |\phi_{E1}|$$

0/180° input phase mismatch ($\phi_{E1}$) produces a quadrature phase error of similar magnitude.

FIG. 34 illustrates Vector Quad Gen Simulations Schematics.

FIG. 35 further illustrates Vector Quad Gen Simulation Schematics (cont).

FIG. 36 illustrates Vector Quad Gen Simulation Results.

FIG. 37 further illustrates Vector Quad Gen Simulation Results.

FIG. 38 further illustrates Vector Quad Gen Simulation Results.

FIG. 39 further illustrates Vector Quad Gen Simulation Results.

FIG. 40 further illustrates Vector Quad Gen Simulation Results.

FIG. 41 further illustrates Vector Quad Gen Simulation Results.

FIG. 42 further illustrates Vector Quad Gen Simulation Results.

FIG. 43 further illustrates Vector Quad Gen Simulation Results.

FIG. 44 further illustrates Vector Quad Gen Simulation Results.

6.3. Third Implementation

FIG. 45 illustrates a Tuned Differential R-C Quad Gen Block Diagram.

FIG. 46 illustrates Tuned Differential R-C Quad Gen Block Transfer Functions. $\phi_{E1}, \phi_{E2}$, and $\phi_{E3}$ are phase errors associated with the $1^{st}$ 1/180, 0/90, and $2^{nd}$ 0/180 pause split blocks respectively. $G_x$ are the gains of each block.

FIG. 47 illustrates Tuned Differential R-C Quad Gen Phasor Diagrams.

According to an embodiment of the present invention, Tuned Different R-C Quad Gen Block Transfer Functions can be written as:

$$S_0 = [(A_1 \angle 0)(G_1 \angle 0) - (A_2 \angle 180 + \phi_{E1})(G_1 \angle 0)] G_3 \angle 0$$

$$S_{180} = [(A_1 \angle 0)(G_1 \angle 0) - (A_2 \angle 180 + \phi_{E1})(G_1 \angle 0)] G_4 \angle 180 + \phi_{E3}$$

$$S_{270} = [(A_2 \angle 180 + \phi_{E1})(G_2 \angle 90 + \phi_{E2}) - (A_1 \angle 0)(G_2 \angle 90 + \phi_{E2})] G_3 \angle 0$$

$$S_{90} = [(A_2 \angle 180 + \phi_{E1})(G_2 \angle 90 + \phi_{E2}) - (A_1 \angle 0)(G_2 \angle 90 + \phi_{E2})] G_4 \angle 180 + \phi_{E3}$$

The above equations can be written in simplified form, as follows:

$$S_0 = A_1 G_1 G_3 \angle 0 + A_2 G_1 G_3 \angle \phi_{E1}$$

$$S_{180} = -A_1 G_1 G_4 \angle \phi_{E3} - A_2 G_1 G_4 \angle \phi_{E1} + \phi_{E3}$$

$$S_{270} = -A_2 G_2 G_3 \angle 90 + \phi_{E1} + \phi_{E2} - A_1 G_2 G_3 \angle 90 + \phi_{E2}$$

$$S_{90} = A_2 G_2 G_4 \angle 90 + \phi_{E1} + \phi_{E2} + \phi_{E3} + A_1 G_2 G_4 \angle 90 + \phi_{E2} + \phi_{E3}$$

Accordingly, vector error can be computed as a function of the various individual block phase errors and gains with $S_0$ as reference, as follows:

$$S_{180(IDEAL)} = -S_0 = -A_1 G_1 G_3 \angle 0 - A_2 G_1 G_3 \angle \phi_{E1}$$

$$S_{180(ERROR)} = S_{180(IDEAL)} - S_{180}$$

$$S_{180(ERROR)} = -A_1 G_1 G_3 - A_2 G_1 G_3 \cos(\phi_{E1}) - jA_2 G_1 G_3 \sin(\phi_{E1}) + A_1 G_1 G_4 \cos(\phi_{E3}) + jA_1 G_1 G_4 \sin(\phi_{E3}) + A_2 G_1 G_4 \cos(\phi_{E1} + \phi_{E3}) + jA_2 G_1 G_4 \sin(\phi_{E1} + \phi_{E3})$$

Similarly:

$$S_{90(ERROR)} = +jA_1 G_1 G_3 - A_2 G_1 G_3 \sin(\phi_{E1}) + jA_2 G_1 G_3 \cos(\phi_{E1}) + A_2 G_2 G_4 \sin(\phi_{E1} + \phi_{E2} + \phi_{E3}) - jA_2 G_2 G_4 \cos(\phi_{E1} + \phi_{E2} + \phi_{E3}) + A_1 G_2 G_4 \sin(\phi_{E2} + \phi_{E3}) - jA_1 G_2 G_4 \cos(\phi_{E2} + \phi_{E3})$$

$$S_{270(ERROR)} = -jA_1 G_1 G_3 + A_2 G_1 G_3 \sin(\phi_{E1}) - jA_2 G_1 G_3 \cos(\phi_{E1}) - A_2 G_2 G_3 \sin(\phi_{E1} + \phi_{E2}) + jA_2 G_2 G_3 \cos(\phi_{E1} + \phi_{E2}) - A_1 G_2 G_3 \sin(\phi_{E2}) + jA_1 G_2 G_3 \cos(\phi_{E2})$$

As an example, further examining $S_{180(ERROR)}$:

$$S_{180(ERROR)} = -A_1 G_1 G_3 - A_2 G_1 G_3 \cos(\phi_{E1}) - jA_2 G_1 G_3 \sin(\phi_{E1}) + A_1 G_1 G_4 \cos(\phi_{E3}) + jA_1 G_1 G_4 \sin(\phi_{E3}) + A_2 G_1 G_4 [\cos(\phi_{E1}) \cos(\phi_{E3}) - \sin(\phi_{E1}) \sin(\phi_{E3})] + jA_2 G_1 G_4 [\sin(\phi_{E1}) \cos(\phi_{E3}) - \cos(\phi_{E1}) \sin(\phi_{E3})]$$

The input phase error, $\phi_{E1}$, may be significant. $\phi_{E2}$ and $\phi_{E3}$ will be determined by the matching of on chip components. Assuming $\phi_{E2}$ and $\phi_{E3}$ are small:

$$S_{180(ERROR)} \cong -A_1 G_1 G_3 - A_2 G_1 G_3 \cos(\phi_{E1}) - jA_2 G_1 G_3 \sin(\phi_{E1}) + A_1 G_1 G_4 + jA_1 G_1 G_4 (\phi_{E3}) + A_2 G_1 G_4 [\cos(\phi_{E1}) - \sin(\phi_{E1})(\phi_{E3})] + jA_2 G_1 G_4 [\sin(\phi_{E1}) - \cos(\phi_{E1})(\phi_{E3})]$$

$$S_{180(ERROR)} \cong A_1 G_1 (G_4 - G_3) + A_2 G_1 [G_4 \cos(\phi_{E1}) - G_3 \cos(\phi_{E1})] + jA_2 G_1 [G_4 \sin(\phi_{E1}) - G_3 \sin(\phi_{E1})]$$

The gain associated with the two 0/180 splitter outputs, $G_3$ and $G_4$, are the differential outputs of a soft limiting tuned amplifier fed by a shared tail current. Amplitude matching will be very good. Accordingly:

$$S_{180(ERROR)} \cong A_1 G_1 (G_4 - G_3) + A_2 G_1 \cos(\phi_{E1})(G_4 - G_3) + jA_2 G_1 \sin(\phi_{E1})(G_4 - G_3)$$

$$\cong 0$$

Regardless of the input amplitude matching ($A_1$, $A_2$) or input phase error ($\phi_{E1}$), and assuming good 0/180 gain matching ($G_3=G_4$), the error vector, $S_{180(ERROR)}$, will be small.

In contrast to the vector error, the quadrature error or phase error can be defined in terms of the relative phase or each of the quadrature components compared to ideal. For example:

$$\phi_{180(ERROR)} = \phi_{180} - \phi_0 - 180$$

$$S_0 = A_1 G_1 G_3 + A_2 G_1 G_3 \cos(\phi_{E1}) - jA_2 G_1 G_3 \sin(\phi_{E1})$$

$$\tan(\phi_0) = \frac{A_2 G_1 G_3 \sin(\phi_{E1})}{A_1 G_1 G_3 + A_2 G_1 G_3 \cos(\phi_{E1})} = \frac{A_2 \sin(\phi_{E1})}{A_1 + A_2 \cos(\phi_{E1})}$$

Similarly:

$$S_{180} = -A_1 G_1 G_4 \cos(\phi_{E3}) - jA_1 G_1 G_4 \sin(\phi_{E3}) - A_2 G_1 G_4 \cos(\phi_{E1} + \phi_{E3}) - jA_2 G_1 G_4 \sin(\phi_{E1} + \phi_{E3})$$

$$\tan(\phi_{180}) = \frac{-G_1 G_4 (A_1 \sin(\phi_{E3}) + A_2 \sin(\phi_{E1} + \phi_{E3}))}{-G_1 G_4 (A_1 \cos(\phi_{E3}) + A_2 \cos(\phi_{E1} + \phi_{E3}))}$$

If $\phi_{E1}$ is small, the above equations can be re-written as:

$$\tan(\phi_{180}) = \frac{-A_2 \sin(\phi_{E1})}{-[A_1 + A_2 \cos(\phi_{E1})]}$$

$$\tan(\phi_0) = \frac{A_2 \sin(\phi_{E1})}{A_1 + A_2 \cos(\phi_{E1})}$$

It is now observed that $\phi_{180}=\phi_0+180$ and that $\phi_{180(ERROR)}=0$, regardless of input amplitude ($A_1$, $A_2$) or phase mismatch ($\phi_{E1}$).

Similarly, we can examine the 270° quadrature component:

$$S_{270} = -A_2 G_2 G_3 \angle 90 + \phi_{E1} + \phi_{E2} - A_1 G_2 G_3 \angle 90 + \phi_{E2}$$

$$\phi_{270(ERROR)} = \phi_{270} - \phi_0 - 270$$

$$S_{270} = -A_2 G_2 G_3 \cos(90 + \phi_{E1} + \phi_{E2}) - jA_2 G_2 G_3 \sin(90 + \phi_{E1} + \phi_{E2}) - A_1 G_2 G_3 \cos(90 + \phi_{E2}) - jA_1 G_2 G_3 \sin(90 + \phi_{E2})$$

$$\tan(\phi_{270}) = \frac{-G_2 G_3 [A_2 \sin(90 + \phi_{E1} + \phi_{E2}) + A_1 \sin(90 + \phi_{E2})]}{-G_2 G_3 [A_2 \cos(90 + \phi_{E1} + \phi_{E2}) + A_1 \cos(90 + \phi_{E2})]}$$

If $\phi_{E2}$ is small, the above equations can be re-written as:

$$\tan(\phi_{270}) = \frac{-[A_2 \sin(90 + \phi_{E1}) + A_1]}{-A_2 \cos(90 + \phi_{E1})} = \frac{-[A_2 \cos(\phi_{E1}) + A_1]}{A_2 \sin(\phi_{E1})}$$

$$\tan(\phi_0) = \frac{A_2 \sin(\phi_{E1})}{A_1 + A_2 \cos(\phi_{E1})}$$

$$\phi_{270(ERROR)} = \phi_{270} - \phi_0 - 270 = \tan^1(-X/Y) - \tan^{-1}(Y/X) - 270$$

$$\phi_{270(ERROR)} = 0$$

regardless of input amplitude ($A_1$, $A_2$) or phase mismatch ($\phi_{E1}$).

On the other hand, if $\phi_{E1}$ is ignored and $\phi_{E2}$ contributions to phase error are evaluated:

$$\tan(\phi_{270}) = \frac{-[A_2 \cos(\phi_{E2}) + A_1 \cos(\phi_{E2})]}{A_2 \sin(\phi_{E2}) + A_1 \sin(\phi_{E2})} = -\tan(\phi_{E2})$$

$$\phi_{270} = -\phi_{E2}$$

Since $\phi_0$ is not a function of $\phi_{E2}$, $|\phi_{270(ERROR)}|=|\phi_{E2}|$, as determined by the pass RC phase splitter.

FIG. 48 illustrates Tuned Differential R-C Quad Gen Differential Cascode Circuit Implementation.

FIG. 49 illustrates Tuned Differential R-C Quad Gen Simulation Results—Amplitude and Phase.

FIG. 50 illustrates Tuned Differential R-C Quad Gen Simulation Results.

FIG. 51 illustrates Tuned Differential R-C Quad Gen Simulation Results.

FIG. 52 illustrates Tuned Differential R-C Quad Gen Simulation Results (M3M4 OCT Inductor).

FIG. 53 illustrates Tuned Differential R-C Quad Gen Simulation Results.

FIG. 54 illustrates Differential Tuned Amp Transfer Gain Performs Soft Limiter Function.

IV. Conclusion

The present invention has been described above with the aid of functional building blocks illustrating the performance of functions and relationships thereof. At least some of the boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like and combinations thereof.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method of generating orthogonal vectors, comprising:
   (a) generating, using circuitry, first and second approximately orthogonal vector signals, $\vec{V}_1$ and $\vec{V}_4$, from a clock signal;
   (b) combining, using circuitry, the first and second vector signals $\vec{V}_1$ and $\vec{V}_4$, thereby generating a vector signal $\vec{I}$; and (c) combining, using circuitry, an inverted version, $-\vec{V}_1$, of the first vector signal $\vec{V}_1$ with the second vector signal $\vec{V}_4$, thereby generating a vector signal $\vec{Q}$ that is substantially orthogonal to vector signal $\vec{I}$.

2. The method of claim 1, wherein step (c) comprises:
receiving, using circuitry, the inverted version $-\vec{V}_1$; and
summing, using circuitry, the inverted version $-\vec{V}_1$ with the second vector signal $\vec{V}_4$, thereby generating the vector signal $\vec{Q}$ substantially orthogonal to the vector signal $\vec{I}$.

3. The method of claim 1, wherein step (c) comprises:
generating the inverted version $-\vec{V}_1$; and
summing, using circuitry, the inverted version $-\vec{V}_1$ with the second vector signal $\vec{V}_4$, thereby generating the vector signal $\vec{Q}$ substantially orthogonal to the vector signal $\vec{I}$.

4. The method of claim 1, wherein step (c) comprises subtracting, using circuitry, the first signal vector $\vec{V}_1$ from the second signal vector $\vec{V}_4$, thereby generating the vector signal $\vec{Q}$ that substantially cancels phase errors between vector signals $\vec{I}$ and $\vec{Q}$.

5. The method of claim 3, wherein the generating an inverted version $-\vec{V}_1$ comprises inverting, using circuitry, the vector signal $\vec{V}_1$ such that $-\vec{V}_1$ is equal in amplitude and opposite in phase to the vector signal $\vec{V}_1$.

6. The method of claim 1, wherein step (c) comprises one or more linear operations.

7. The method of claim 1, wherein step (a) comprises:
receiving, using circuitry, a clock signal;
generating, using circuitry, the vector signal $\vec{V}_1$ and an inverted version, $-\vec{V}_1$, of the vector signal $\vec{V}_1$ from the clock signal; and
generating, using circuitry, vector signal $\vec{V}_4$ that is approximately orthogonal to vector signal $\vec{V}_1$ from vector signals $\vec{V}_1$ and $-\vec{V}_1$.

8. The method of claim 7, wherein the generating vector signal $\vec{V}_4$ from vector signals $\vec{V}_1$ and $-\vec{V}_1$ comprises phase shifting, using circuitry, $\vec{V}_1$ and/or $-\vec{V}_1$.

9. The method of claim 7, wherein the generating vector signal $\vec{V}_4$ from vector signals $\vec{V}_1$ and $-\vec{V}_1$ comprises:
subtracting, using circuitry, $-\vec{V}_1$ from $\vec{V}_1$, thereby generating the vector signal $\vec{V}_4$; and
phase shifting, using circuitry, vector signal $\vec{V}_4$.

10. The method of claim 7, wherein the generating an inverted version $-\vec{V}_1$ comprises phase shifting, using circuitry, the clock signal 180°, thereby generating $-\vec{V}_1$.

11. A method of generating orthogonal vectors, comprising:
(a) generating, using circuitry, a first vector signal $\vec{V}_1$ and an inverted version, $-\vec{V}_1$, of the first vector signal $\vec{V}_1$, from a clock signal;
(b) combining, using circuitry, the first vector signal $\vec{V}_1$ and an approximately orthogonal third vector signal $\vec{V}_4$, thereby generating a vector signal $\vec{I}$; and
(c) combining, using circuitry, the inverted version $-\vec{V}_1$ with the vector signal $\vec{V}_4$, thereby generating a vector signal $\vec{Q}$ that is substantially orthogonal to vector signal $\vec{I}$.

12. The method of claim 11, wherein step (b) comprises receiving, using circuitry, the vector signal $\vec{V}_4$.

13. The method of claim 11, wherein step (b) comprises generating, using circuitry, the vector signal $\vec{V}_4$.

14. The method of claim 13, wherein the generating vector signal $\vec{V}_4$ comprises phase shifting, using circuitry, $\vec{V}_1$ and/or $-\vec{V}_1$.

15. The method of claim 13, wherein the generating vector signal $\vec{V}_4$ comprises:
subtracting, using circuitry, $-\vec{V}_1$ from $\vec{V}_1$, thereby generating the vector signal $\vec{V}_4$; and
phase shifting, using circuitry, vector signal $\vec{V}_4$.

16. The method of claim 11, wherein step (c) comprises summing, using circuitry, the inverted version $-\vec{V}_1$ with the third vector signal $\vec{V}_4$, thereby generating the vector signal $\vec{Q}$ substantially orthogonal to the vector signal $\vec{I}$.

17. The method of claim 11, wherein step (c) comprises subtracting, using circuitry, the signal vector $\vec{V}_1$ from the signal vector $\vec{V}_4$, thereby generating the vector signal $\vec{Q}$ that substantially cancels phase errors between vector signals $\vec{I}$ and $\vec{Q}$.

18. The method of claim 11, wherein step (c) comprises one or more linear operations.

19. The method of claim 11, wherein step (a) comprises:
subtracting, using circuitry, a second clock signal VB from a first clock signal VA, thereby generating a first vector signal $\vec{V}_1$; and
subtracting, using circuitry, the first clock signal VA from the second clock signal VB, thereby generating an inverted version, $-\vec{V}_1$, of the first vector signal $\vec{V}_1$ such that $-\vec{V}_1$ is equal in amplitude and opposite in phase to $\vec{V}_1$.

20. A method of generating orthogonal vectors, comprising:
(a) receiving, using circuitry, first and second approximately orthogonal vector signals, $\vec{V}_1$ and $\vec{V}_4$;
(b) combining, using circuitry, the first and second vector signals $\vec{V}_1$ and $\vec{V}_4$, thereby generating a vector signal $\vec{I}$; and (c) combining, using circuitry, an inverted version, $-\vec{V}_1$, of the first vector signal $\vec{V}_1$ with the second vector signal $\vec{V}_4$, thereby generating a vector signal $\vec{Q}$ that is substantially orthogonal to vector signal $\vec{I}$.

21. The method of claim 20, wherein step (c) comprises:
receiving, using circuitry, the inverted version $-\vec{V}_1$; and
summing, using circuitry, the inverted version $-\vec{V}_1$ with the second vector signal $\vec{V}_4$, thereby generating the vector signal $\vec{Q}$ substantially orthogonal to the vector signal $\vec{I}$.

22. The method of claim 20, wherein step (c) comprises:
generating, using circuitry, the inverted version $-\vec{V}_1$; and
summing, using circuitry, the inverted version $-\vec{V}_1$ with the second vector signal $\vec{V}_4$, thereby generating the vector signal $\vec{Q}$ substantially orthogonal to the vector signal $\vec{I}$.

23. The method of claim 22, wherein the generating an inverted version $-\vec{V}_1$ comprises inverting, using circuitry, the vector signal $\vec{V}_1$ such that $-\vec{V}_1$ is equal in amplitude and opposite in phase to vector signal $\vec{V}_1$.

24. The method of claim 20, wherein step (c) comprises subtracting, using circuitry, the first signal vector $\vec{V}_1$ from the second signal vector $\vec{V}_4$, thereby generating the vector signal $\vec{Q}$ that substantially cancels phase errors between vector signals $\vec{I}$ and $\vec{Q}$.

25. The method of claim 20, wherein step (c) comprises one or more linear operations.

26. A system for generating substantially orthogonal signals $\vec{I}$ and $\vec{Q}$ from approximately orthogonal signals $\vec{V}_1$, $\vec{V}_4$, and an inverted version of $\vec{V}_1$, $-\vec{V}_1$ comprising:
a first combiner configured to receive $\vec{V}_1$ and $\vec{V}_4$ and to generate the signal $\vec{I}$;
a second combiner configured to receive $-\vec{V}_1$ and $\vec{V}_4$ and to generate the signal $\vec{Q}$ that is substantially orthogonal to signal $\vec{I}$.

27. The system of claim 26, wherein the system comprises:
an approximate orthogonal signal generator, configured to receive a clock signal and output the approximately orthogonal signals $\vec{V}_1$ and $\vec{V}_4$, coupled to the first and second combiners;
an inverter configured to receive $\vec{V}_1$ and output $-\vec{V}_1$ coupled to the signal generator and the second combiner.

28. The system of claim 27, the approximate orthogonal signal generator comprising:
a first phase shifter configured to receive a clock signal, the first phase shifter coupled to a first, second, and third linear operator, the second and third linear operators each configured to output vector signals $\vec{V}_1$ and $\vec{V}_4$ that are approximately orthogonal to one another;
a second phase shifter coupled to the first, second, and third linear operators;
the first linear operator coupled to the second and third linear operators; and
the second and third linear operators coupled to each other.

29. The system of claim 28, the first, second and third linear operators being closely matched differential operators.

30. The system of claim 28, the first, second and third linear operators being closely matched summing operators.

31. The system of claim 27, wherein the second combiner further comprises a differencer.

32. The system of claim 26, wherein the system comprises:
a signal generator, configured to receive a clock signal and output vector signal $\vec{V}_1$ and an inverted version of $\vec{V}_1$, $-\vec{V}_1$;
a phase shifter coupled to the signal generator configured to receive $\vec{V}_1$ and output $\vec{V}_4$ approximately orthogonal to $\vec{V}_1$;
the signal generator coupled to the first combiner and second combiners;
the phase shifter coupled to the first and second combiners.

33. The system of claim 32, wherein the second combiner further comprises a differencer.

34. The system of claim 32, wherein the signal generator comprises:
a first differential node coupled to first and second terminals of a clock signal generator;
the first differential node configured to receive the clock signal and output vector signal $\vec{V}_1$;
a second differential node cross-coupled to the first and second terminals of the clock signal generator;
the second differential node configured to receive the clock signal and output inverted version $-\vec{V}_1$.

35. The system of claim 26, wherein the second combiner further comprises a differencer.

36. A method of generating orthogonal vectors, comprising:
(a) receiving, using circuitry, a clock signal $\vec{S}_1$;
(b) phase shifting, using circuitry, the signal $\vec{S}_1$ 180°, thereby generating a signal $\vec{S}_2$;
(c) phase shifting, using circuitry, the signal $\vec{S}_1$ 90°, thereby generating a signal $\vec{S}_3$;
(d) phase shifting, using circuitry, the signal $\vec{S}_2$ 90°, thereby generating a signal $\vec{S}_4$;
(e) subtracting, using circuitry, the signal $\vec{S}_2$ from the signal $\vec{S}_1$, thereby generating a signal $\vec{V}_1$;
(f) phase shifting, using circuitry, the signal $\vec{V}_1$ 180°, thereby generating a signal $\vec{V}_3$ that is approximately opposite in phase to $\vec{V}_1$;
(g) subtracting, using circuitry, $\vec{S}_3$ from $\vec{S}_4$, thereby generating a signal $\vec{V}_4$ that is approximately orthogonal to $\vec{V}_1$; and (h) phase shifting, using circuitry, the signal $\vec{V}_4$ 180°, thereby generating a signal $\vec{V}_2$ that is approximately orthogonal to $\vec{V}_1$.

37. A system for generating orthogonal vector signals, comprising:
- a first phase shifter configured to receive a clock signal;
- the first phase shifter coupled to second and third phase shifters,
- the second and third phase shifters cross-coupled to a first and second linear operator,
- the first and second phase linear operators coupled to fourth and fifth phase shifters, the fourth and fifth phase shifters configured to output vector signals which are approximately orthogonal to one another.

38. The system of claim 37, the first and second linear operators being closely matched differential operators.

39. The system of claim 37, the first and second linear operators being closely matched summing operators.

* * * * *